(12) United States Patent
Kim et al.

(10) Patent No.: US 12,532,656 B2
(45) Date of Patent: Jan. 20, 2026

(54) DISPLAY APPARATUS

(71) Applicant: Samsung Electronics Co., Ltd., Suwon-si (KR)

(72) Inventors: Joonghyuk Kim, Suwon-si (KR); Taegon Kim, Suwon-si (KR); Shinae Jun, Suwon-si (KR); Hyeonho Choi, Suwon-si (KR); Seungyeon Kwak, Suwon-si (KR); Jiwhan Kim, Suwon-si (KR); Sunghun Lee, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 514 days.

(21) Appl. No.: 18/163,504

(22) Filed: Feb. 2, 2023

(65) Prior Publication Data
US 2024/0074303 A1  Feb. 29, 2024

(30) Foreign Application Priority Data
Aug. 4, 2022 (KR) .................. 10-2022-0097579

(51) Int. Cl.
*H10K 85/30* (2023.01)
*C09K 11/02* (2006.01)
(Continued)

(52) U.S. Cl.
CPC .......... *H10K 85/346* (2023.02); *C09K 11/02* (2013.01); *C09K 11/06* (2013.01);
(Continued)

(58) Field of Classification Search
CPC ............... H10K 85/346; H10K 50/115; H10K 50/121; H10K 59/10; H10K 85/6572; H10K 85/658; H10K 50/13; H10K 85/657; H10K 50/19; H10K 59/38; H10K 2101/27; H10K 2101/30; H10K 50/11; H10K 85/322; H10K 2102/331; C09K 11/02; C09K 11/06; C09K 11/0883; C09K 11/883; C09K 2211/1007;
(Continued)

(56) References Cited

U.S. PATENT DOCUMENTS 6,310,360 B1  10/2001  Forrest et al.
6,515,298 B2  2/2003  Forrest et al.
(Continued)

FOREIGN PATENT DOCUMENTS

CN  111943987 A  11/2020
JP  2002193952 A  7/2002
(Continued)

*Primary Examiner* — Ermias T Woldegeorgis
(74) *Attorney, Agent, or Firm* — CANTOR COLBURN LLP

(57) ABSTRACT

A display apparatus, including a substrate including at least one blue light-emitting unit, and a color control portion provided on the substrate and configured to control a color of a light generated at the substrate, wherein the color control portion includes a first color control element, wherein the first color control element includes a first quantum dot for green light conversion, and the at least one blue light-emitting unit of the substrate includes an emission layer, wherein the emission layer includes a host, a first dopant, and a second dopant, and wherein the display apparatus further satisfies conditions as defined herein.

20 Claims, 8 Drawing Sheets

(51) Int. Cl.
*C09K 11/06* (2006.01)
*C09K 11/08* (2006.01)
*C09K 11/88* (2006.01)
*H10K 50/115* (2023.01)
*H10K 50/12* (2023.01)
*H10K 59/10* (2023.01)
*H10K 85/60* (2023.01)
*B82Y 20/00* (2011.01)

(52) U.S. Cl.
CPC ........ *C09K 11/0883* (2013.01); *C09K 11/883* (2013.01); *H10K 50/115* (2023.02); *H10K 50/121* (2023.02); *H10K 59/10* (2023.02); *H10K 85/6572* (2023.02); *H10K 85/658* (2023.02); *B82Y 20/00* (2013.01); *C09K 2211/1007* (2013.01); *C09K 2211/1014* (2013.01); *C09K 2211/1022* (2013.01); *C09K 2211/1029* (2013.01); *C09K 2211/1044* (2013.01); *C09K 2211/185* (2013.01)

(58) Field of Classification Search
CPC .... C09K 2211/1014; C09K 2211/1022; C09K 2211/1029; C09K 2211/1044; C09K 2211/185; B82Y 20/00
See application file for complete search history.

(56) References Cited

U.S. PATENT DOCUMENTS

| | | |
|---|---|---|
| 6,894,307 B2 | 5/2005 | Forrest et al. |
| 8,476,823 B2 | 7/2013 | Kuma et al. |
| 8,643,268 B2 | 2/2014 | Ogiwara et al. |
| 9,153,790 B2 | 10/2015 | Kuma et al. |
| 9,385,329 B2 | 7/2016 | Li et al. |
| 9,493,698 B2 | 11/2016 | Beers et al. |
| 9,905,779 B2 | 2/2018 | Ogiwara et al. |
| 10,069,077 B2 | 9/2018 | Park et al. |
| 10,090,483 B2 | 10/2018 | Kim et al. |
| 11,217,763 B2 | 1/2022 | Tsukamoto et al. |
| 2013/0063023 A1 | 3/2013 | Pan et al. |
| 2017/0062718 A1 | 3/2017 | Numata et al. |
| 2017/0077418 A1 | 3/2017 | Stoessel et al. |
| 2017/0077421 A1 | 3/2017 | Ihn et al. |
| 2017/0163010 A1 | 6/2017 | Nakanotani et al. |
| 2018/0053901 A1 | 2/2018 | Yoshida et al. |
| 2018/0130959 A1 | 5/2018 | Ogiwara et al. |
| 2018/0248127 A1 | 8/2018 | Lee et al. |
| 2018/0374409 A1 | 12/2018 | Lee et al. |
| 2019/0225636 A1 | 7/2019 | Bae et al. |
| 2020/0083458 A1 | 3/2020 | Jeon et al. |
| 2020/0251040 A1* | 8/2020 | Lee ........................ H10K 59/12 |
| 2020/0321537 A1 | 10/2020 | Jeon et al. |
| 2020/0392173 A1 | 12/2020 | Bae et al. |
| 2021/0098721 A1* | 4/2021 | Jung .................. H10K 85/6576 |
| 2021/0159438 A1 | 5/2021 | Pickett et al. |
| 2021/0167299 A1 | 6/2021 | Chung et al. |
| 2021/0167311 A1 | 6/2021 | Jeon et al. |
| 2021/0171548 A1 | 6/2021 | Min et al. |
| 2021/0249610 A1 | 8/2021 | Kim et al. |
| 2022/0052278 A1 | 2/2022 | Lee et al. |
| 2022/0093689 A1 | 3/2022 | Kwak et al. |
| 2022/0106345 A1 | 4/2022 | Bae et al. |
| 2023/0006137 A1 | 1/2023 | Kim et al. |
| 2023/0084208 A1 | 3/2023 | Kim et al. |
| 2023/0090659 A1 | 3/2023 | Kwon et al. |
| 2023/0174560 A1 | 6/2023 | Kwon et al. |
| 2024/0057434 A1 | 2/2024 | Kim et al. |

FOREIGN PATENT DOCUMENTS

| | | |
|---|---|---|
| JP | 6203875 B2 | 9/2017 |
| KR | 20170025990 A | 3/2017 |
| KR | 20170032148 A | 3/2017 |
| KR | 20170096583 A | 8/2017 |
| KR | 101878172 B1 | 8/2018 |
| KR | 20180098809 A | 9/2018 |
| KR | 20180128253 A | 12/2018 |
| KR | 20190000759 A | 1/2019 |
| KR | 20190089626 A | 7/2019 |
| KR | 20200142554 A | 12/2020 |
| KR | 20210067752 A | 6/2021 |
| KR | 20220011581 A | 1/2022 |
| KR | 20220037716 A | 3/2022 |
| WO | 2016158540 A1 | 10/2016 |

* cited by examiner

DISPLAY APPARATUS

CROSS-REFERENCE TO RELATED APPLICATION

This application claims priority to and the benefit of Korean Patent Application No. 10-2022-0097579, filed on Aug. 4, 2022, in the Korean Intellectual Property Office, and all the benefits accruing therefrom under 35 U.S.C. § 119, the content of which is incorporated by reference herein in its entirety.

BACKGROUND

1. Field

The present subject matter relates to a display apparatus and to an electronic apparatus including the same.

2. Description of the Related Art

Organic light-emitting devices (OLEDs) are self-emission devices that have wide viewing angles, high contrast ratios, short response time, and excellent characteristics in terms of driving voltage, luminance, and the like. In addition, OLEDs can produce full-color images.

A typical OLED may include an anode, a cathode, and an emission layer (an organic material-containing emission layer) arranged between the anode and the cathode. A hole transport region may be arranged between the anode and the emission layer, and an electron transport region may be arranged between the emission layer and the cathode. Holes provided from the anode may move toward the emission layer through the hole transport region, and electrons provided from the cathode may move toward the emission layer through the electron transport region. Carriers such as holes and electrons may recombine in the emission layer to produce excitons, and the excitons may transition from an excited state to a ground state, thus generating light.

In an OLED-based display including a plurality of quantum dot (QD) color conversion elements, a blue-OLED substrate, or a white-OLED substrate are mainly used as a light source.

SUMMARY

Provided is a display apparatus having excellent performance.

Also provided is a display apparatus having excellent color characteristics and long lifespan.

Additional aspects will be set forth in part in the detailed description that follows and, in part, will be apparent from the detailed description, or may be learned by practice of the presented exemplary embodiments herein.

According to an aspect, a display apparatus includes:

A substrate including at least one blue light-emitting unit, and
 a color control portion provided on the substrate and configured to control a color of a light generated at the substrate,
 wherein the color control portion includes a first color control element, wherein the first color control element includes a first quantum dot for green light conversion,
 the at least one blue light-emitting unit includes an emission layer, wherein the emission layer includes a host, a first dopant, and a second dopant,
 the emission layer exhibits an emission spectrum including a first emission peak and a second emission peak,
 the first color control element exhibits an absorption spectrum including a first absorption peak and a first absorption valley,
 the first dopant has a lowest triplet excitation energy and a lowest singlet excitation energy,
 the second dopant has a lowest triplet excitation energy and a lowest singlet excitation energy,
 the first emission peak, the second emission peak, the first absorption peak, and the first absorption valley satisfy Conditions 1-1 to 1-4, and
 the first dopant and the second dopant satisfy Conditions 2-1 and 2-2:

Condition 1-1 about 430 nanometers $\leq \lambda_{BEM1} \leq$ about 500 nanometers

Condition 1-2 about 430 nanometers $\leq \lambda_{GAB1} \leq$ about 550 nanometers

Condition 1-3

$100\% < (T_{BEM}/T_{D1}) < 200\%$

Condition 1-4

$|\lambda_{BEM2} - \lambda_{ABVL1}| \leq (\lambda_{BEM1} - \lambda_{BEM2})$

Condition 2-1

$T_1(D_1) \geq T_1(D_2)$

Condition 2-2

$T_1(D_1) \geq S_1(D_2)$, wherein,
 $\lambda_{BEM1}$ is the first emission peak,
 $\lambda_{BEM2}$ is the second emission peak,
 $\lambda_{ABP1}$ is the first absorption peak,
 $\lambda_{ABVL1}$ is the first absorption valley,
 $T_1(D_1)$ is the lowest triplet excitation energy level of the first dopant,
 $S_1(D_1)$ is the lowest singlet excitation energy level of the first dopant,
 $T_1(D_2)$ is the lowest triplet excitation energy level of the second dopant,
 $S_1(D_2)$ is the lowest singlet excitation energy level of the second dopant,
 $T_{BEM}$ represents photoluminescence transient decay lifetime of the emission layer, and
 $T_{D1}$ represents photoluminescence transient decay lifetime of the first dopant alone.

The first quantum dot may include a Group II-VI compound, a Group III-V compound, a Group II-III-V compound, a Group II-VI compound, a Group I-III-VI compound, a Group IV-VI compound, or a combination thereof.

The Group II-VI compound may be ZnS, ZnSe, ZnTe, ZnO, MgSe, MgS, ZnSeS, ZnSeTe, ZnSTe, MgZnSe, MgZnS, or a combination thereof.

The Group III-V compound may be GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group II-III-V compound may be InZnP, InGaZnP, InAlZnP, or a combination thereof.

The Group III-VI compound may be GaS, GaSe, $Ga_2Se_3$, GaTe, InS, InSe, $In_2S_3$, $In_2Se_3$, InTe, $InGaS_3$, $InGaSe_3$, or a combination thereof.

The Group I-III-VI compound may be AgInS, $AgInS_2$, CuInS, $CuInS_2$, $CuGaO_2$, $AgGaO_2$, $AgAlO_2$, or a combination thereof.

The Group IV-VI compound may be SnS, SnSe, SnTe, SnSeS, SnSeTe, SnSTe, or a combination thereof.

The first quantum dot may have a core-shell structure.

The core may be the Group III-V compound, the Group II-III-V compound, the Group III-VI compound, the Group I-III-VI compound, or a combination thereof, and the shell may be the Group II-VI compound, the Group IV-VI compound, or a mixture thereof.

The first quantum dot may include a core that is InP, InZnP, InGaP, or a combination thereof, and a shell that is ZnSe, ZnS, ZnSe, ZnSeS, or a combination thereof.

The first absorption peak of the first quantum dot may be about 450 nanometers (nm) to about 510 nm, and the first emission peak of the first quantum dot may be about 500 nm to about 550 nm.

Energy may be transmitted from the first dopant to the second dopant.

The first dopant and the second dopant may emit light simultaneously.

The first dopant is present in the emission layer in an amount of about 5 weight percent (wt %) to about 30 wt %, and the second dopant is present in the emission layer in an amount of about 0.05 wt % to about 0.5 wt %, based on a total weight of the emission layer.

The first dopant may be a Pt complex having a tetradentate ligand including a benzimidazole moiety, an imidazole moiety, a pyrrole moiety, or a combination thereof.

The first dopant may be a Pt complex represented by Formula 1:

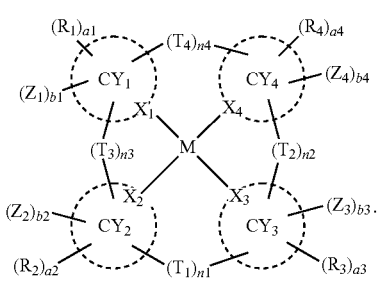

Formula 1

In Formula 1,

M may be a transition metal.

In Formula 1, $X_1$ to $X_4$ may each independently be C or N.

In Formula 1, two bonds of a bond between $X_1$ and M, a bond between $X_2$ and M, a bond between $X_3$ and M, and a bond between $X_4$ and M may be coordinate bonds, and the other two bonds may be covalent bonds.

In Formula 1, $Z_1$ to $Z_4$ may each independently be a group represented by Formula 2:

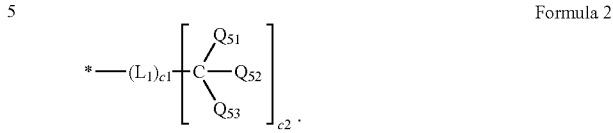

Formula 2

In Formula 1, b1 to b4 may each independently be an integer from 0 to 20, and a sum of b1 to b4 may be 1 or greater.

In Formula 1, ring $CY_1$ to ring $CY_4$ may each independently be a $C_5$-$C_{30}$ carbocyclic group or a $C_1$-$C_{30}$ heterocyclic group.

In Formula 1, $T_1$ may be a single bond, a double bond, *—$N(R_{5a})$—*', *—$B(R_{5a})$—*', *—$P(R_{5a})$—*', *—$C(R_{5a})(R_{5b})$—*', *—$Si(R_{5a})(R_{5b})$—*', *—$Ge(R_{5a})(R_{5b})$—*', *—S*', *—Se—*', *—O*', *—C(=O)—*', *—S(=O)—*', *—S(=O)_2$—*', *—$C(R_{5a})$=*', *=$C(R_{5a})$*', *—$C(R_{5a})$=$C(R_{5b})$—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, $T_2$ may be a single bond, a double bond, *—$N(R_{6a})$—*', *—$B(R_{6a})$—*', *—$P(R_{6a})$—*', *—$C(R_{6a})(R_{6b})$—*', *—$Si(R_{6a})(R_{6b})$—*', *—$Ge(R_{6a})(R_{6b})$—*', *—S—*', *—Se—*', *—O—*', *—C(=O)*', *—S(=O)—*', *—S(=O)_2$—*', *—$C(R_{6a})$=*', *=$C(R_{6a})$—*', *—$C(R_{6a})$=$C(R_{6b})$—*', *—C(=S)—*', *—C≡C*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, $T_3$ may be a single bond, a double bond, *—$N(R_{7a})$—*', *—$B(R_{7a})$—*', *—$P(R_{7a})$—*', *—$C(R_{7a})(R_{7b})$—*', *—$Si(R_{7a})(R_{7b})$—*', *—$Ge(R_{7a})(R_{7b})$—*', *—S—*', *—Se—*', *—O—*', *—C(=O)—*', *—S(=O)*', *—S(=O)_2$—*', *—$C(R_{7a})$=*', *=$C(R_{7a})$—*', *—$C(R_{7a})$=$C(R_{7b})$—*', *—C(=S)—*', *—C=C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, $T_4$ may be a single bond, a double bond, *—$N(R_{8a})$—*', *—$B(R_{8a})$—*', *—$P(R_{8a})$—*', *—$C(R_{8a})(R_{8b})$—*', *—$Si(R_{8a})(R_{8b})$—*', *—$Ge(R_{8a})(R_{8b})$—*', *—S—*', *—Se—*', *—O—*', *—C(=O)—*', *—S(=O)—*', *—S(=O)_2$—*', *—$C(R_{8a})$=*', *=$C(R_{8a})$—*', *—$C(R_{8a})$=$C(R_{8b})$—*', *—C(=S)—*', *—C=C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, n1 to n4 may each independently be an integer from 0 to 5, and three or more of n1 to n4 may each independently be an integer from 1 to 5.

In Formula 1, when n1 is 0, then $T_1$ is absent, when n2 is 0, then $T_2$ is absent, when n3 is 0, then $T_3$ is absent, and when n4 is 0, then $T_4$ is absent.

In Formula 1, when n1 is 2 or greater, two or more of $T_1$ may be identical to or different from each other, when n2 is 2 or greater, two or more of $T_2$ may be identical to or different from each other, when n3 is 2 or greater, two or more of $T_3$ may be identical to or different from each other, and when n4 is 2 or greater, two or more of $T_4$ may be identical to or different from each other.

In Formulae 1 and 2, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$).

In Formula 2, at least one of $Q_{51}$ to $Q_{55}$ may each independently be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

In Formula 1, a1 to a4 may each independently be an integer from 0 to 20.

In Formula 2, $L_1$ may be a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 2, c1 may be an integer from 1 to 10.

In Formula 2, c2 may be an integer from 1 to 20.

In Formula 1, two or more of $R_1$ may optionally be bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, two or more of $R_2$ may optionally be bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, two or more of $R_3$ may optionally be bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

In Formula 1, two or more of $R_4$ may optionally be bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_1aa$, Two or more of $R_1$ to $R_4$, $R_{8a}$, $R_{8b}$, $R_{6a}$, $R_{6b}$, $R_{7a}$, $R_{7b}$, $R_{8a}$, and $R_{8b}$ may optionally be bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_{10a}$ may be as defined for $R_1$ herein, \* and \*' may each indicate a binding site to a neighboring atom, at least one substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group may be:

deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with at least one of deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_1S$), —Ge($Q_{13}$)($Q_{14}$)($Q_{15}$), —B($Q_{16}$)($Q_{17}$), —P(=O)($Q_{18}$)($Q_{19}$), —P($Q_{18}$)($Q_{19}$), or a combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_6$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a C$_1$-C$_{60}$ alkyl group, a C$_2$-C$_{60}$ alkenyl group, a C$_2$-C$_{60}$ alkynyl group, a C$_1$-C$_{60}$ alkoxy group, a C$_1$-C$_{60}$ alkylthio group, a C$_3$-C$_{10}$ cycloalkyl group, a C$_1$-C$_{10}$ heterocycloalkyl group, a C$_3$-C$_{10}$ cycloalkenyl group, a C$_1$-C$_{10}$ heterocycloalkenyl group, a C$_6$-C$_{60}$ aryl group, a C$_7$-C$_{60}$ alkyl aryl group, a C$_7$-C$_{60}$ aryl alkyl group, a C$_6$-C$_{60}$ aryloxy group, a C$_6$-C$_{60}$ arylthio group, a C$_1$-C$_{60}$ heteroaryl group, a C$_2$-C$_{60}$ alkyl heteroaryl group, a C$_2$-C$_{60}$ heteroaryl alkyl group, a C$_1$-C$_{60}$ heteroaryloxy group, a C$_1$-C$_{60}$ heteroarylthio group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —Ge(Q$_{23}$)(Q$_{24}$)(Q$_{25}$), —B(Q$_{26}$)(Q$_{27}$), —P(=O)(Q$_{28}$)(Q$_{29}$), —P(Q$_{28}$)(Q$_{29}$), or a combination thereof, —N(Q$_{31}$)(Q$_{32}$), —Si(Q$_{33}$)(Q$_{34}$)(Q$_{35}$), —Ge(Q$_{33}$)(Q$_{34}$)(Q$_{35}$), —B(Q$_{36}$)(Q$_{37}$), —P(=O)(Q$_{38}$)(Q$_{39}$), or —P(Q$_{38}$)(Q$_{39}$), or a combination thereof, and Q$_1$ to Q$_9$, Q$_{11}$ to Q$_{19}$, Q$_{21}$ to Q$_{29}$, and Q$_{31}$ to Q$_{39}$ may each independently be hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_1$-C$_{60}$ alkylthio group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_7$-C$_{60}$ alkyl aryl group, a substituted or unsubstituted C$_7$-C$_{60}$ aryl alkyl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted C$_2$—C$_{60}$ alkyl heteroaryl group, a substituted or unsubstituted C$_2$-C$_{60}$ heteroaryl alkyl group, a substituted or unsubstituted C$_1$-C$_{60}$ heteroaryloxy group, a substituted or unsubstituted C$_1$-C$_{60}$ heteroarylthio group, a substituted or unsubstituted monovalent non-aromatic condensed polycyclic group, or a substituted or unsubstituted monovalent non-aromatic condensed heteropolycyclic group.

The second dopant may emit a thermally activated delayed fluorescence.

In some embodiments, the second dopant may be a polycyclic compound represented by Formula 3:

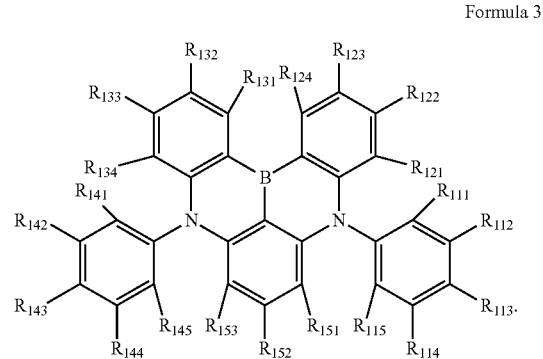

Formula 3

In Formula 3,

R$_{111}$ to R$_{115}$, R$_{121}$ to R$_{124}$, R$_{131}$ to R$_{134}$, R$_{141}$ to R$_{145}$, and R$_{151}$ to R$_{153}$ may each independently be one of Group R-1 to Group R-5, two or more adjacent groups among R$_{111}$ to R$_{115}$, R$_{121}$ to R$_{124}$, R$_{131}$ to R$_{134}$, R$_{141}$ to R$_{145}$, and R$_{151}$ to R$_{153}$ may optionally combine to form a ring, Group R-1 may be hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_6$ alkoxy group, a substituted or unsubstituted C$_1$-C$_{60}$ alkylthio group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, a substituted or unsubstituted C$_6$-C$_{60}$ aryl group, a substituted or unsubstituted C$_7$-C$_{60}$ alkyl aryl group, a substituted or unsubstituted C$_7$-C$_{60}$ aryl alkyl group, a substituted or unsubstituted C$_6$-C$_{60}$ aryloxy group, a substituted or unsubstituted C$_6$-C$_6$ arylthio group, a substituted or unsubstituted C$_1$-C$_{60}$ heteroaryl group, a substituted or unsubstituted C$_2$-C$_{60}$ alkyl heteroaryl group, a substituted or unsubstituted C$_1$-C$_{60}$ heteroaryloxy group, a substituted or unsubstituted C$_1$-C$_{60}$ heteroarylthio group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —C(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$(Q$_1$), —P(=O)(Q$_1$)(Q$_2$), and —P(=S)(Q$_1$)(Q$_2$), Q$_1$ to Q$_3$ may each independently be hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted C$_1$-C$_{60}$ alkyl group, a substituted or unsubstituted C$_2$-C$_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_1$-$C_{60}$ heteroaryloxy group, a substituted or unsubstituted $C_1$-$C_6$ heteroarylthio group, a substituted or unsubstituted monovalent non-aromatic condensed polycyclic group, or a substituted or unsubstituted monovalent non-aromatic condensed heteropolycyclic group, two adjacent groups among $R_{131}$ to $R_{134}$ may be optionally linked to each other and condensed with a benzene ring in which $R_{131}$ to $R_{134}$ are bonded to form a moiety,

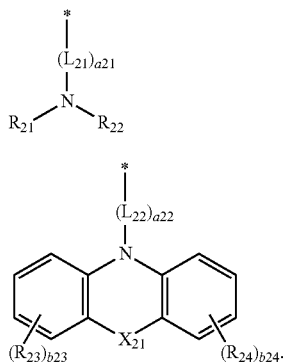

wherein $X_2$ is $N(Q_1)$, O, or S, * indicates a binding site to B in Formula 3, and *' indicates a binding site to N in Formula 3, and Group R-2 may be a group represented by Formula 3-1 or a group represented by Formula 3-2:

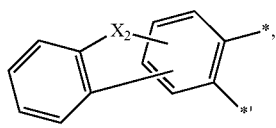

Formula 3-1

Formula 3-2

In Formulae 3-1 and 3-2,
$X_{21}$ may be a single bond, O, S, $N(R_{25})$, or $C(R_{25})(R_{26})$,
$L_{21}$ and $L_{22}$ may each independently be a substituted or unsubstituted $C_5$-$C_{30}$ carbocyclic group or a substituted or unsubstituted $C_1$-$C_{30}$ heterocyclic group,
a21 and a22 may each independently be 0, 1, or 2,
b23 and b24 may each independently be 0, 1, 2, 3, or 4,
$R_{21}$ to $R_{26}$ may each independently be a substituted or unsubstituted $C_1$-$C_{60}$ alkyl group, a substituted or unsubstituted $C_3$-$C_1$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_1$-$C_{600}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted monovalent non-aromatic condensed polycyclic group, or a substituted or unsubstituted monovalent non-aromatic condensed heteropolycyclic group, Group R-3 may be a group represented by Formula 3-3:

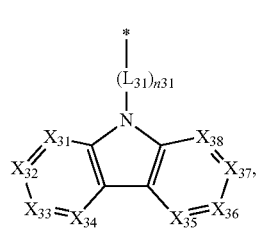

Formula 3-3 wherein, in Formula 3-3,
$L_{31}$ may be a substituted or unsubstituted $C_5$-$C_{60}$ carbocyclic group or a substituted or unsubstituted $C_1$-$C_{60}$ heterocyclic group,
n31 may be 0, 1 or 2,
$X_{31}$ may be $C(R_{31})$ or N, $X_{32}$ may be $C(R_{32})$ or N, $X_{33}$ may be $C(R_{33})$ or N, $X_{34}$ may be $C(R_{34})$ or N, $X_{35}$ may be $C(R_{35})$ or N, $X_{36}$ may be $C(R_{36})$ or N, $X_{37}$ may be $C(R_{37})$ or N, and $X_{38}$ may be $C(R_{38})$ or N, and
$R_{31}$ to $R_{38}$ may be as defined for Group R-1, Group R-4 may be a group represented by Formula 3-4:

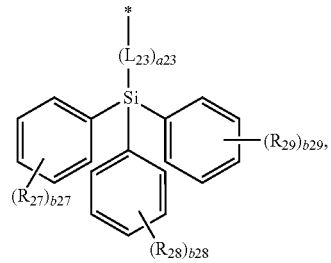

Formula 3-4 wherein, in Formula 3-4,
$L_{23}$ may be a substituted or unsubstituted $C_5$-$C_{30}$ carbocyclic group or a substituted or unsubstituted $C_1$-$C_{30}$ heterocyclic group,
a23 may be 0, 1 or 2, and
b27 to b29 may each independently be 0, 1, 2, 3, 4, or 5, and Group R-5 may be a group represented by Formula 3-5:

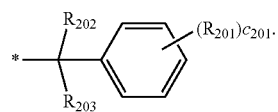

Formula 3-5

In Formula 3-5, $R_{201}$, $R_{202}$, and $R_{203}$ may each independently be a $C_1$-$C_{20}$ alkyl group unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a pyridinyl group, a pyrimidinyl group, a triazinyl group, a quinolinyl group, an isoquinolinyl group, a carbazolyl group, a dibenzofuranyl group, a dibenzothiophenyl group, —$N(Q_{31})(Q_{32})$, or a combination thereof, and c201 may be 1, 2, 3, 4, and 5.

The substrate may have a tandem structure.

The substrate may have a tandem structure further including at least one green light-emitting unit.

The color control portion may further include a second color control element including a second quantum dot for red color conversion.

The color control portion may further include a third color control element for expression of a blue color.

An average particle diameter of the core of the second quantum dot may be greater than an average particle diameter than the core of the first quantum dot.

The color control portion may further include a first color filter provided on the first color control element and a second color filter provided on the second color control element.

According to another aspect, an electronic apparatus includes the display apparatus.

BRIEF DESCRIPTION OF THE DRAWINGS

The above and other aspects, features, and advantages of certain exemplary embodiments will be more apparent from the following detailed description taken in conjunction with the accompanying drawings, in which.

DETAILED DESCRIPTION

Figure 1:
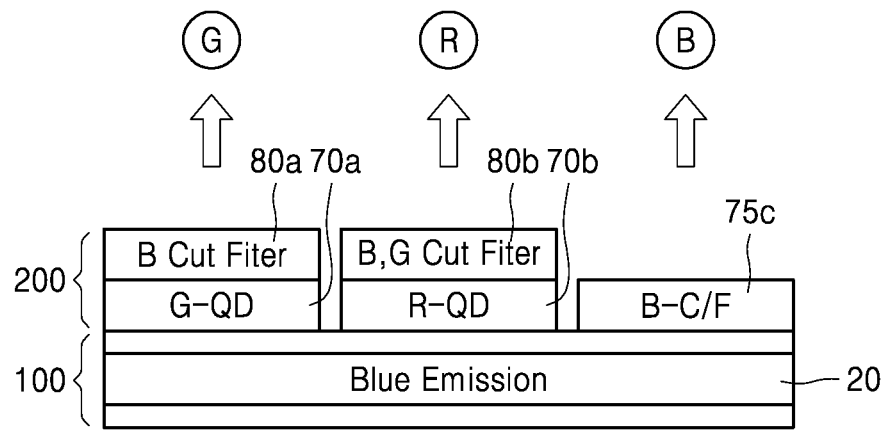
FIG. 1 is a cross-sectional view of a display apparatus according to one or more embodiments.

Reference will now be made in further detail to exemplary embodiments, examples of which are illustrated in the accompanying drawings, wherein like reference numerals refer to like elements throughout. In this regard, the present exemplary embodiments may have different forms and should not be construed as being limited to the detailed descriptions set forth herein. Accordingly, the exemplary embodiments are merely described in further detail below, and by referring to the figures, to explain certain aspects. As used herein, the term "and/or" includes any and all combinations of one or more of the associated listed items. Expressions such as "at least one of," when preceding a list of elements, modify the entire list of elements and do not modify the individual elements of the list.

The terminology used herein is for the purpose of describing one or more exemplary embodiments only and is not intended to be limiting. As used herein, the singular forms "a," "an," and "the" are intended to include the plural forms as well, unless the context clearly indicates otherwise. The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

It will be understood that when an element is referred to as being "on" another element, it can be directly in contact with the other element or intervening elements may be present therebetween. In contrast, when an element is referred to as being "directly on" another element, there are no intervening elements present.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Hereinafter, a display apparatus according to exemplary embodiments will be described in further detail with reference to the accompanying drawings. The width and thickness of the layers or regions shown in the accompanying drawings may be exaggerated for clarity of the specification and convenience of description.

FIG. 1 is a cross-sectional view of a display apparatus according to one or more embodiments.

With reference to FIG. 1, a substrate 100 (for example, an organic light-emitting device (OLED) substrate) and a color control portion 200 are configured to control a color of a light generated at the substrate 100.

The substrate 100 may be a light source OLED (i.e., the substrate 100 may be an OLED substrate). The substrate 100 may include at least one blue light-emitting unit. The at least one blue light-emitting unit may emit a blue light having a peak wavelength of about 430 nm to about 500 nm, or about 445 nm to about 475 nm. The blue light-emitting unit may include a blue fluorescence/delayed fluorescence material and/or a blue phosphorescent material.

For example, the substrate 100 may include one first blue light-emitting unit 20 as illustrated in FIG. 1. According to another embodiment, the substrate 100 may include two or more blue light-emitting units. For example, the substrate 100 may include three or more blue light-emitting units.

According to another embodiment, the substrate 100 may include at least one green light-emitting unit. The green light-emitting unit may emit a green light having a peak wavelength of about 500 nm to about 550 nm, or about 510 nm to about 540 nm. In such a case, the substrate 100 may emit a mixed light of a blue light and a green light.

The green light-emitting unit may include a green phosphorescent material and/or a green fluorescent material. As the lifespan of the blue light-emitting unit may be shorter than the lifespan of the green light-emitting unit, using two or more blue light-emitting units and a fewer number of green light-emitting unit may be advantageous. For example, the substrate 100 may have a stacked structure in which one green light-emitting unit is arranged between two blue light-emitting units. However, the configuration of the substrate 100 may vary.

When the substrate 100 has a tandem structure in which two or more light-emitting units are stacked, a charge generation layer (not shown) may be provided between adjacent light-emitting units. The tandem structure and the charge generation layer are to be described in detail with reference to FIGS. 9 and 10. In addition, the substrate 100 may further include a lower layer under the first blue light-emitting unit 20, and one or more upper layers on the first blue light-emitting unit 20. Although no separate reference numerals are assigned to denote the lower layer and the upper layer(s) in FIG. 1, the lower layer and the upper layer(s) may be considered as components included in the substrate 100. The lower layer and the upper layer(s) are to be described in further detail with reference to FIGS. 9 and 11.

The color control portion 200 may be provided on one surface of the substrate 100. The color control portion 200 may include a first color control element 70a including a first quantum dot (QD) for green color conversion, a second color control element 70b including a second QD for red color conversion, and a third color control element 75c for a blue color expression. The color control portion 200 may further include a first color filter 80a provided on the first color control element 70a and a second color filter 80b provided on the second color control element 70b.

The first color control element 70a may be a green-QD-containing layer, and may convert a light generated from the substrate 100 into a green light G. The second color control element 70b may be a red-QD containing layer and may convert a light generated from the substrate 100 to a red light R. Accordingly, the first color control element 70a may be referred to as a first color conversion element, and the second color control element 70b may be referred to as a second color conversion element. The color conversion element may include a mixture of a resin material, certain quantum dots, and a light scattering agent. The resin material may include, for example, a photoresist (PR) material. According to another embodiment, the color conversion element may be formed from a QD ink. The third color control element 75c may be a color filter that optionally allows the blue (B) wavelength region of the light generated from the substrate 100 to pass therethrough. In other words, the third color control element 75c may be a blue-color filter (C/F). In this case, the third color control element 75c may be an absorption type color filter including a certain pigment or a QD. The absorption type color filter may absorb light of wavelength band except light of the target wavelength band.

The first color filter 80a may cut off the remaining blue wavelength region of the light that has passed through the first color control element 70a. The second color filter 80b may cut off the remaining blue and green wavelength regions of the light that has passed through the second color control element 70b. The first color filter 80a may be referred to as a first blue-cut filter, and the second color filter 80b may be referred to as a blue & green-cut filter (B, G Cut Filter). Accordingly, color-controlling/filtering characteristics may be improved by the first color filter 80a and the second color filter 80b. Although not illustrated in the drawings, a separate optical film may be additionally provided on the third color control element 75c. Full colors of RGB may be realized by using the color control portion 200. The arrangement order or arrangement method of the RGB subpixels provided herein is an example, and may be variously changed.

The first QD that may be included in the first color control element 70a may be a green-QD, and the second QD that may be included in the second color control element 70b may be a red-QD. A QD refers to a semiconductor particle of a small sphere of nanometer (nm) size or a similar shape, and may have a size (diameter) of about several nm to several tens of nm. A QD may have a monolithic structure or a core-shell structure, and in the case of a core-shell structure, the quantum dot may have a single shell structure or a multi-shell structure. For example, a QD may have a core (center) including a first semiconductor material and a shell (exterior) including a second semiconductor material, where the first semiconductor material may be different from the second semiconductor material.

For example, the first semiconductor material and the second semiconductor material may each independently include at least one of a Group II-VI compound, a Group III-V compound, a Group III-VI compound, a Group II-III-VI compound, a Group I-III-VI compound, a Group IV-VI compound, or a Group IV compound.

The Group II-VI compound may include CdS, CdSe, CdTe, ZnS, ZnSe, ZnTe, ZnO, HgS, HgSe, HgTe, MgSe, MgS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, CdZnSeS, CdZnSeTe, CdZnSTe, CdHgSeS, CdHgSeTe, CdHgSTe, HgZnSeS, HgZnSeTe, HgZnSTe, or a combination thereof.

The Group III-V compound may include GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group II-III-V compound may include InZnP, InGaZnP, InAlZnP or a combination thereof.

The Group I-II-VI compound may include GaS, GaSe, Ga$_2$Se$_3$, GaTe, InS, InSe, In$_2$S$_3$, In$_2$Se$_3$, InTe, InGaS$_3$, InGaSea, or a combination thereof.

The Group I-III-VI compound may include AgInS, AgInS$_2$, CuInS, CuInS$_2$, CuGaO$_2$, AgGaO$_2$, AgAlO$_2$, or a combination thereof.

The Group IV-VI compound may include SnS, SnSe, SnTe, PbS, PbSe, PbTe, SnSeS, SnSeTe, SnSTe, PbSeS, PbSeTe, PbSTe, SnPbS, SnPbSe, SnPbTe, SnPbSSe, SnPbSeTe, SnPbSTe, or a combination thereof.

The Group IV compound may include Si, Ge, SiC, SiGe, or a combination thereof.

For example, the first semiconductor material and/or the second semiconductor material may be a semiconductor material not including cadmium, mercury, and/or lead.

For example, the first semiconductor material may be a Group III-V compound, and the second semiconductor material may be a Group II-VI compound. For example, the first semiconductor material may be a compound including In and P, and the second semiconductor material may be a compound including Zn and chalcogenide.

Because QDs are very small in size, QDs may exhibit a quantum confinement effect. When a particle is very small, electrons in the particle form a discontinuous energy state by the outer wall of the particle. As the size of the space inside the particle is small, the energy state of the electrons is relatively high, and the energy band gap increases.

This effect is called as the quantum confinement effect. According to such a quantum confinement effect, when light such as ultraviolet rays or visible rays is incident on a quantum dot, light of various wavelengths may be generated. The wavelength of light generated from a QD may be determined by the size, material, or structure of the particle (QD). Specifically, when light with a wavelength greater than the energy band gap is incident on the QD, the QD may be excited by absorbing the energy of the light and may transit to a ground state while emitting light of a specific wavelength. In this case, as the size of the quantum dot (or the size of the core of the quantum dot) is smaller, light of a relatively shorter wavelength, for example, a bluish light or a greenish light may be generated, and as the size of the quantum dot (or the size of the core of the quantum dot) is larger, light of a relatively longer wavelength, for example, a reddish light may be generated. Therefore, light of various colors may be realized according to the size of the quantum dot (or the size of the core of the quantum dot).

Quantum dot particles that may emit a greenish light may be referred to herein as green quantum dot (green-QD) particles, and quantum dot particles that may emit a reddish light may be referred to herein as red quantum dot (red-QD) particles. For example, green-QD particles (or the core thereof) may be particles having an average particle diameter of about 2 nm to about 3 nm, and red-QD particles (or the core thereof) may be particles having an average particle diameters of about 5 nm to about 6 nm. The emission wavelength may be controlled not only by the size (average particle diameter) of the quantum dot but also by the material and structure of the QD.

Since the first color control element 70a may be regarded as a kind of color filter that converts colors using quantum dots, the first color control element 70a may be referred to as a "first QD color filter". Similarly, the second color control element 70b may be referred to as a "second QD color filter".

The first color filter 80a and the second color filter 80b of cut-off filter type may be formed in, for example, a distributed Bragg reflector (DBR) structure. A DBR structure that passes or reflects only the desired wavelength band may be created by repeatedly stacking two material layers (dielectrics) having different refractive indices and adjusting the thickness and the number of layers to be stacked of the material layers. The DBR structure may be applied to the first color filter 80a and the second color filter 80b. For example, a SiO$_2$ layer and a TiO$_2$ layer may be stacked repeatedly under the condition of λ/4 (here, λ represents a wavelength of emitted light), and by adjusting the thickness and the stacking number of the layers, the reflectivity and transmittance in a desired wavelength may be increased. As the DBR structure is well known, the detailed descriptions thereof are omitted herein. In addition, at least one of the first color filter 80a and the second color filter 80b may have a structure other than the DBR structure, for example, a high-contrast grating (HCG) structure.

According to another embodiment, a light-scattering element may be further provided between the third color control element 75c and the substrate 100. An example thereof is illustrated in FIG. 2.

Figure 2:
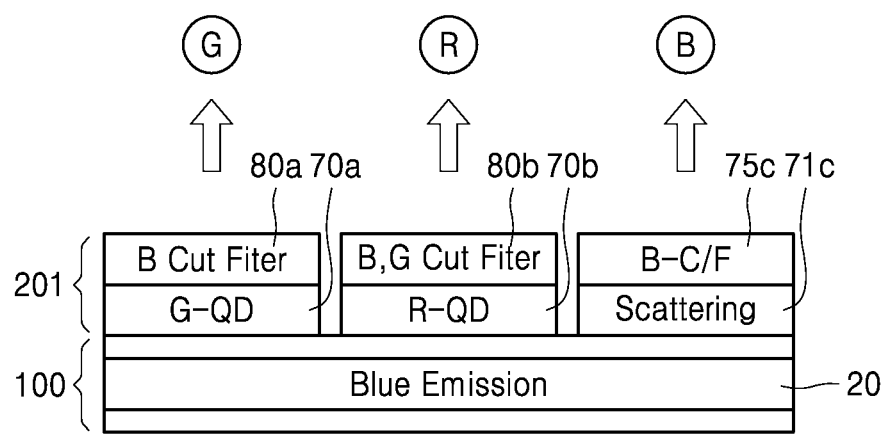
FIG. 2 is a cross-sectional view of a display apparatus according to one or more embodiments.

With reference to FIG. 2, a light-scattering element 71c may be further provided between the third color control element 75c and the substrate 100. In this case, the third color control element 75c may be a blue-color filter (C/F). The light-scattering element 71c may include a resin material and a light scattering agent. The resin material may include a photoresist (PR) material. According to one or more embodiments, the light-scattering element 71c may be formed from light-scattering ink. The light-scattering agent may include, for example, titanium oxide (TiO$_2$); however, embodiments are not limited thereto. The first color control element 70a and the second color control element 70b may each include a light scattering agent. Accordingly, by positioning the light-scattering element 71c under the third color control element 75c, the impression of colors may be balanced. In other words, change in the visibility in RGB regions may be reduced. In FIG. 2, the reference numeral 201 denotes the color control portion.

According to another embodiment, instead of the blue-color filter, a color conversion element containing blue-QDs may be used as the third color control element 75c of FIG. 1. An example thereof is illustrated in FIG. 3.

Figure 3:
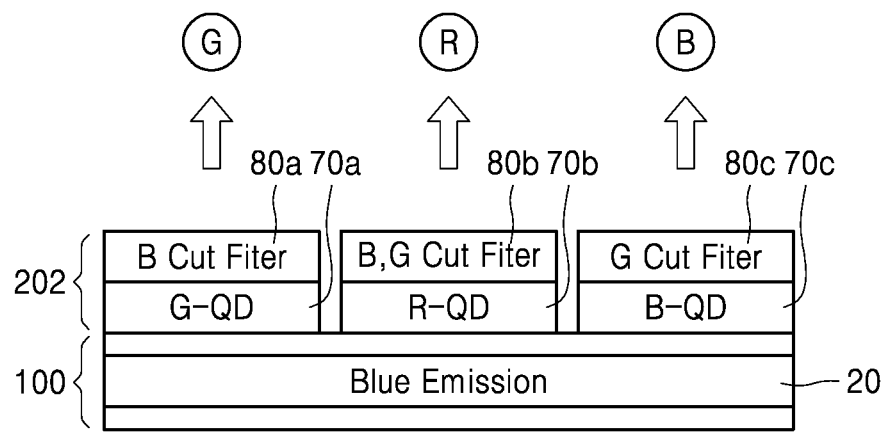
FIG. 3 is a cross-sectional view of a display apparatus according to one or more embodiments.

With reference to FIG. 3, the embodiment is similar to the configuration described in connection with FIG. 1, except that a blue-QD-containing layer may be used as a third color control element 70c instead of the blue-color filter 75c. The third color control element 70c may convert the light generated from the substrate 100 into a blue light B.

Accordingly, the third color control element 70c may be referred to as a third color conversion element. The third color control element 70c may include a resin material, quantum dots, and a light-scattering agent. According to another embodiment, the third color control element 70c may be formed from a QD ink. In this case, a color control portion 202 may further include a third color filter 80c provided on the third color control element 70c. The third color filter 80c may cut off the remaining green wavelength region of the light that has passed through the third color control element 70c. That is, the third color filter 80c may be a green-cut filter.

Figure 4:
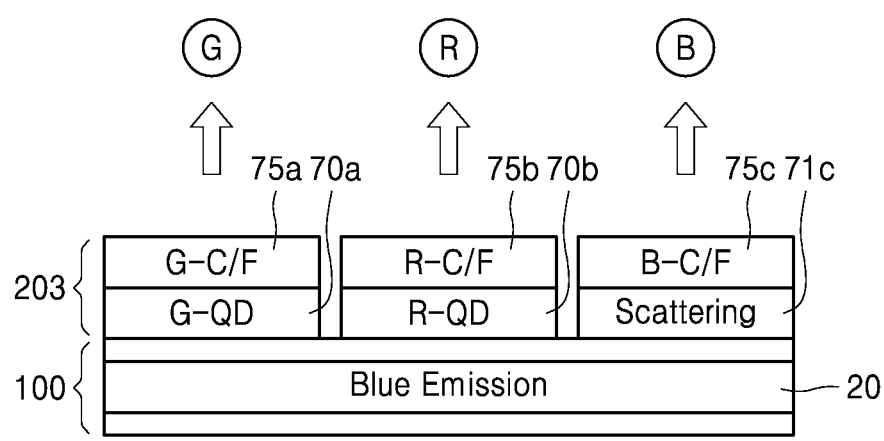
FIG. 4 is a cross-sectional view of a display apparatus according to one or more embodiments.

According to another embodiment, an absorption-type color filter may be used instead of the first color filter 80a and the second color filter 80b of cut-off type in FIGS. 1 and 2. An example thereof is illustrated in FIG. 4. FIG. 4 is a variation of the example illustrated in FIG. 2.

With reference to FIG. 4, as a first color filter 75a, an absorption-type green-color filter, not a blue-cut filter, may be used, and as a second color filter 75b, an absorption-type red-color filter, not a blue, green-cut filter, may be used. The green-color filter 75a may selectively transmit light in the green wavelength region and absorb light in the other wavelength regions. Similarly, the red-color filter 75b may selectively transmit light in the red wavelength region and absorb light in the other wavelength regions. The color control portion 203 of the present embodiment uses absorption type color filters 75a, 75b, and 75c respectively for the R-subpixel, G-subpixel, and B-subpixel regions. In this embodiment, the third color control element 70c containing the blue-QD in FIG. 3 may be used instead of the light-scattering element 71c.

In another embodiment, the display apparatus may further include a fourth sub-pixel, in addition to a R-subpixel (a first subpixel), a G-subpixel (a second subpixel), and a B-subpixel (a third subpixel). The fourth subpixel may be configured to exhibit a color (a fourth color) other than R, G, and B. The substrate may further include another light-emitting unit, for example, a green light-emitting unit, in addition to the blue light-emitting unit. The other color (fourth color) may be, for example, cyan (C); however, embodiments are not limited thereto. FIGS. 5 to 8 illustrate the case where the fourth subpixel region is further provided. In FIGS. 5 to 8, 100a denotes a substrate, and 200a to 203a denote color control portions.

Figure 5:
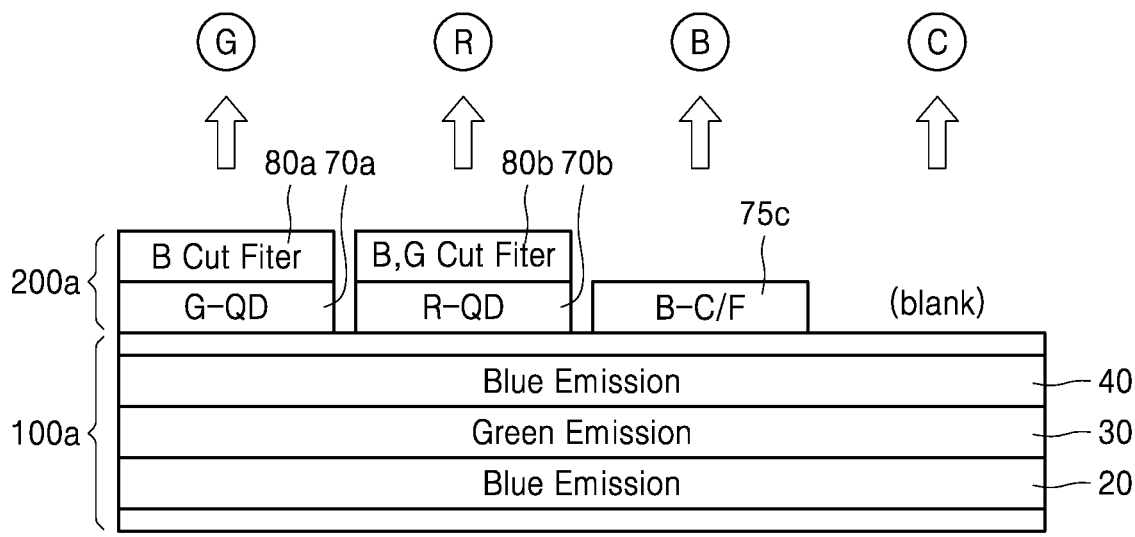
FIG. 5 is a cross-sectional view of a display apparatus according to one or more embodiments

With reference to FIG. 5, the embodiment is similar to the configuration described in connection with FIG. 1, except that an substrate 100a may have a structure in which a blue light-emitting unit 20, a green light-emitting unit 30, and a blue light-emitting unit 40 are sequentially stacked, and a partial region of the substrate 100a may be left as a blank region. The blank region may correspond to the fourth subpixel region, and cyan (C) color may be exhibited from the blank region.

Figure 6:
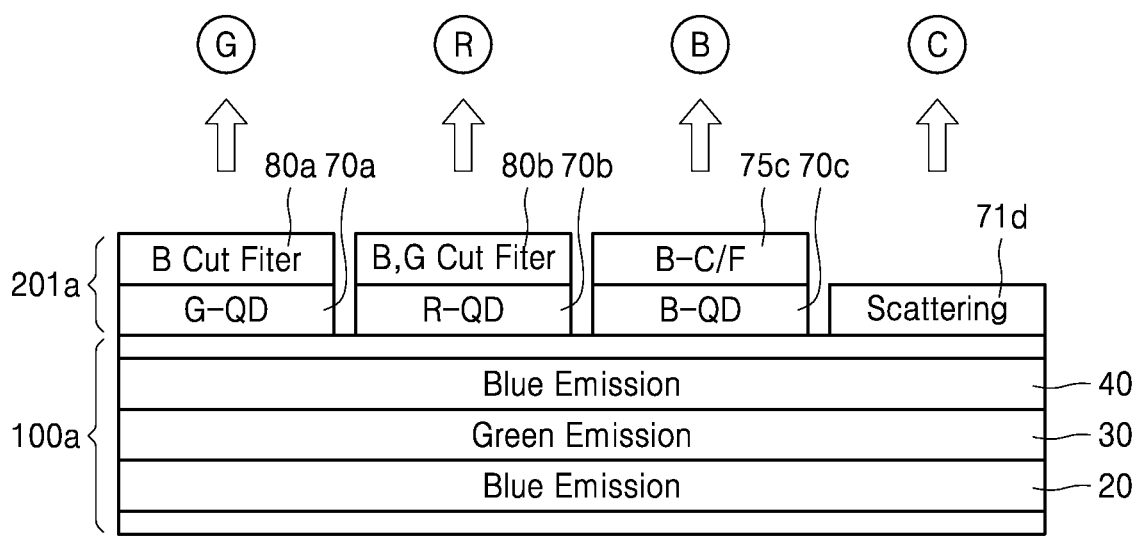
FIG. 6 is a cross-sectional view of a display apparatus according to one or more embodiments.

With reference to FIG. 6, the embodiment is similar to the configuration described in connection with FIG. 2, except that the substrate 100a may have a structure in which the blue light-emitting unit 20, the green light-emitting unit 30, and the blue light-emitting unit 40 are sequentially stacked, and a light-scattering element 71d may be provided in the fourth subpixel region of the substrate 100a. When the light-scattering element 71c provided under the third color control element 75c is a first light-scattering element, and the light-scattering element 71d provided in the fourth subpixel region may be referred to as a second light-scattering element. The first light-scattering element 71c and the second light-scattering element 71d may have the same or similar material composition.

Figure 7:
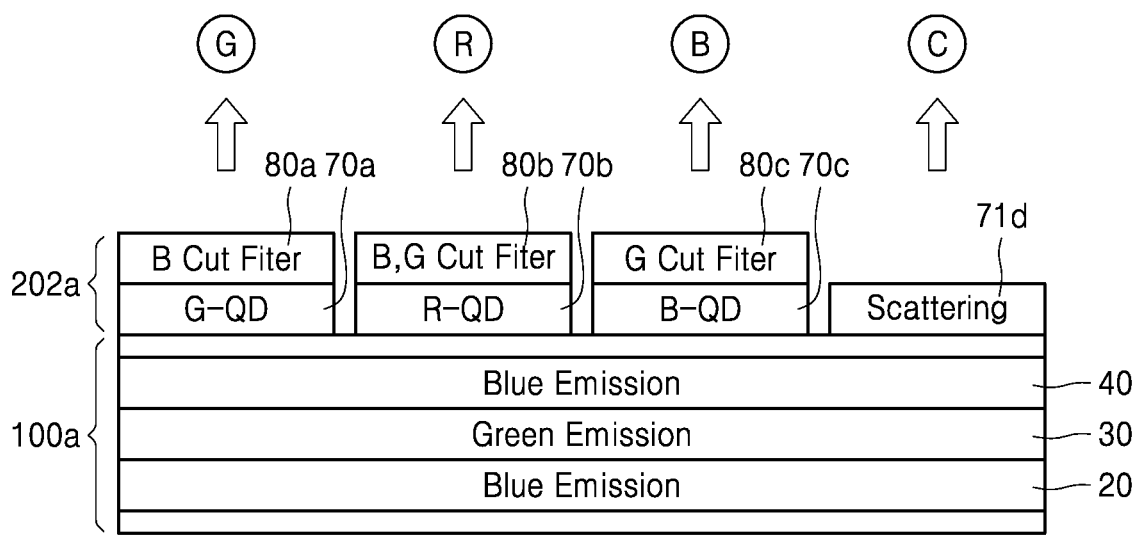
FIG. 7 is a cross-sectional view of a display apparatus according to one or more embodiments.

With reference to FIG. 7, the embodiment is similar to the configuration described in connection with FIG. 3, except that the substrate 100a may have a structure in which the blue light-emitting unit 20, the green light-emitting unit 30, and the blue light-emitting unit 40 are sequentially stacked, and the light-scattering element 71d may be provided in the fourth subpixel region of the substrate 100a.

Figure 8:
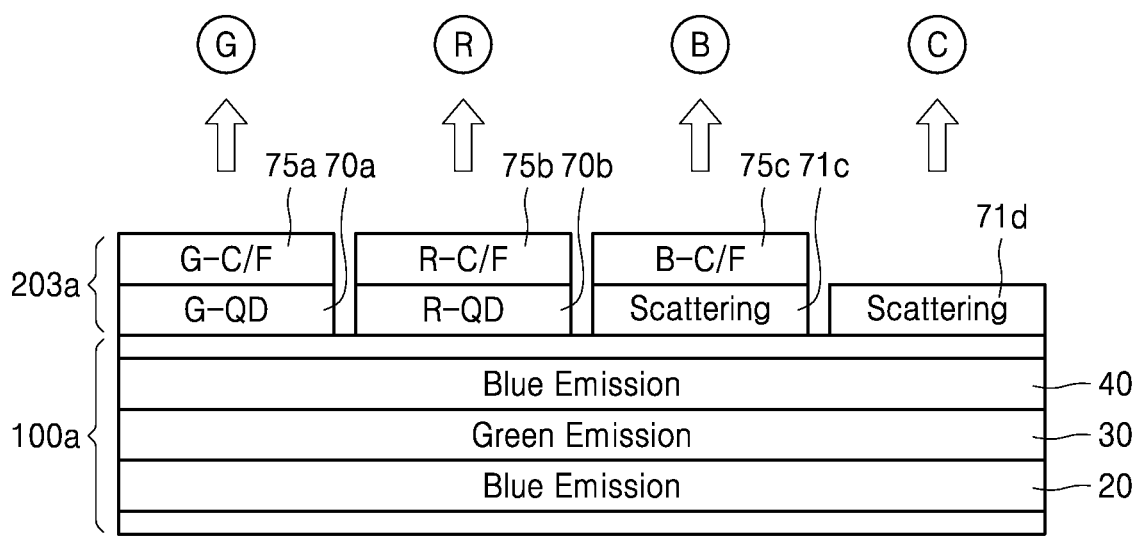
FIG. 8 is a cross-sectional view of a display apparatus according to one or more embodiments.

With reference to FIG. 8, the embodiment is similar to the configuration described in connection with FIG. 4, except that the substrate 100a may have a structure in which the blue light-emitting unit 20, the green light-emitting unit 30, and the blue light-emitting unit 40 are sequentially stacked, and the light-scattering element 71d may be provided in the fourth subpixel region of the substrate 100a.

In the embodiments illustrated in FIGS. 5 to 8, the arrangement order and method of the R-subpixel (the first subpixel), the G-subpixel (the second subpixel), the B-subpixel (the third subpixel), and the C-subpixel (the fourth subpixel) are illustrative only, and various other embodiments are possible. In one or more embodiments, the R, G, B, and C subpixel regions may be arranged such that a square shape matrix may be formed when viewed from a top view. In addition, the color exhibited in the C-subpixel (the fourth subpixel) region may be any color other than cyan (C).

Figure 9:
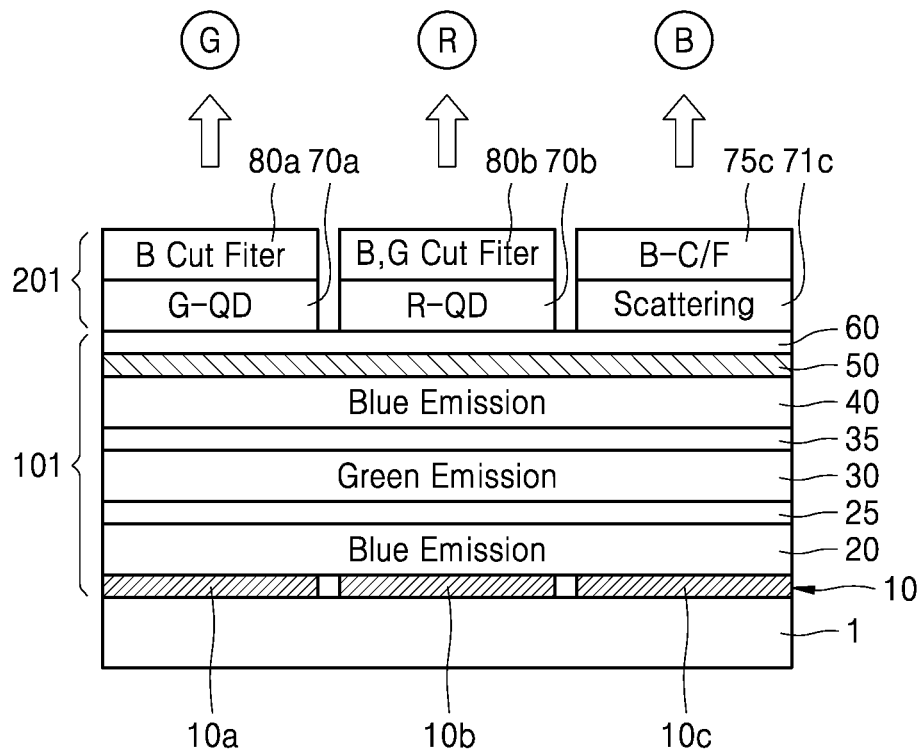
FIG. 9 is a detailed cross-sectional view illustrating configuration of a display apparatus according to one or more embodiments.

FIG. 9 is a detailed cross-sectional view illustrating a configuration of a display apparatus according to one or more embodiments.

With reference to FIG. 9, a thin-film transistor (TFT) array substrate 1 including a plurality of TFTs (not shown) may be provided, and an substrate 101 may be provided on the TFT array substrate 1. The plurality of TFTs of the TFT array substrate 10 may be a device for driving pixel (subpixel) regions of the substrate 101. A color control portion 201 may be provided on the substrate 101.

The substrate 101 may include a plurality of first electrodes 10 (i.e., the first electrodes 10a, 10b, and 10c). The plurality of first electrodes 10a, 10b, and 10c may be elements patterned to respectively correspond to subpixels. Each of the plurality of first electrodes 10a, 10b, and 10c may be electrically connected with each of the TFT devices of the TFT array substrate 1. The first blue light-emitting unit 20, the green light-emitting unit 30, and the second blue light-emitting unit 40 may be sequentially stacked on the first electrodes 10a, 10b, and 10c in the stated order.

A first charge generation layer 25 may be provided between the first blue light-emitting unit 20 and the green light-emitting unit 30. Furthermore, a second charge generation layer 35 may be provided between the green light-emitting unit 30 and the second blue light-emitting unit 40.

Accordingly, the first blue light-emitting unit 20, the green light-emitting unit 30, and the second blue light-emitting unit 40 may be connected to each other in series to form a tandem structure. A second electrode 50 may be provided on the second blue light-emitting unit 40. Although the second electrode 50 is described herein as not being patterned, in some embodiments, the second electrode 50 may be patterned into a plurality of electrode elements. The first electrode 10 may be an anode, and the second electrode 50 may be a cathode, or vice versa. The second electrode 50 may be patterned without patterning the first electrode 10, or both of the first electrode 10 and the second electrode 50 may be patterned. The plurality of light-emitting units (i.e., the first blue light-emitting unit 20, the green light-emitting unit 30, and the second blue light-emitting unit 40) located between the first electrode 10 and the second electrode 50 and the charge generation layers (i.e., the first charge generation layer 25 and the second charge generation layer 35) therebetween may have a structure patterned by the unit of subpixel. A protective layer 60 may be further provided on the second electrode 50. The protective layer 60 may be formed of a transparent insulating material. According to another embodiment, the green light-emitting unit 30 may be replaced with a blue light-emitting unit.

The color control portion 201 may be provided on the protective layer 60. Although the color control portion 201 is described as having the same configuration as the color control portion 201 of FIG. 2, the configuration may be modified in various ways.

Figure 10:
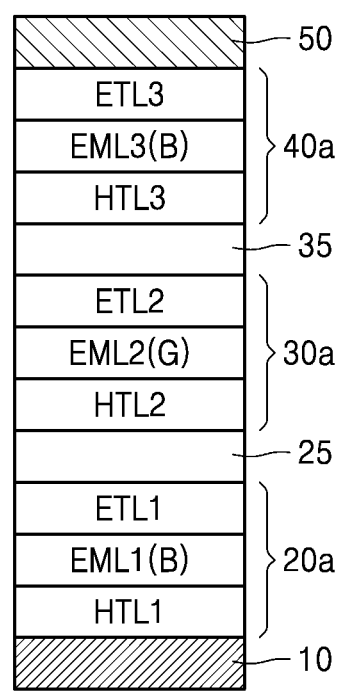
FIG. 10 is a detailed cross-sectional view illustrating configuration of an organic light-emitting device (OLED) substrate which may be applied to a display apparatus according to one or more embodiments.

FIG. 10 is a detailed cross-sectional view illustrating a configuration of a substrate which may be applied to a display apparatus according to one or more embodiments. FIG. 10 shows in detail a possible configuration of the substrate 101 of FIG. 9.

With reference to FIG. 10, a first blue light-emitting unit 20a, a first charge generation layer 25, a green light-emitting unit 30a, a second charge generation layer 35, a second blue light-emitting unit 40a, and a second electrode 50 may be provided sequentially on the first electrode 10 in the stated order.

The first blue light-emitting unit 20a may include a first blue light-emitting layer EML1 including an organic-based blue light-emitting material, and may further include a first hole transport layer HTL1 and a first electron transport layer ETL1. The first hole transport layer HTL1 may be arranged between the first blue light-emitting layer EML1 and the first electrode 10, and the first electron transport layer ETL1 may be arranged between the first blue light-emitting layer EML1 and the first charge generation layer 25. The green light-emitting unit 30a may include a green light-emitting layer EML2 including an organic-based green light-emitting material, and may further include a second hole transport layer HTL2 and a second electron transport layer ETL2. The second blue light-emitting unit 40a may include a second blue light-emitting layer EML3 including an organic-based blue light-emitting material, and may further include a third hole transport layer HTL3 and a third electron transport layer ETL3. Although it is not shown in the drawings, each of the first blue light-emitting unit 20a, the green light-emitting unit 30a, and the second blue light-emitting unit 40a may further include at least one of a hole injection layer, an electron injection layer, or a combination thereof. The first charge generation layer 25 and the second charge generation layer 35 may be formed of a metal or a metallic material, and may perform the function of increasing the emission efficiency of the substrate. According to another embodiment, the green light-emitting unit 30a may be replaced with a blue light-emitting unit.

According to another embodiment, in the structure as described in FIG. 9, a selective reflection film may be further provided in the substrate 101 and the color control portion 201. An example thereof is illustrated in FIG. 11.

Figure 11:
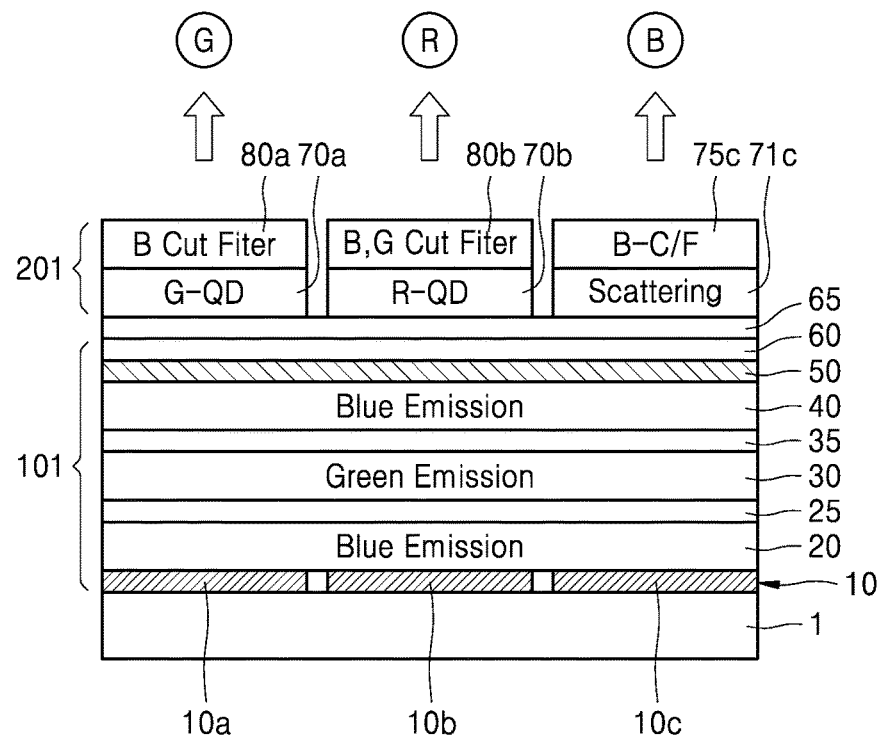
FIG. 11 is a detailed cross-sectional view illustrating configuration of a display apparatus according to one or more embodiments.

With reference to FIG. 11, the embodiment is similar to the configuration described in connection with FIG. 9, except that a selective reflection film 65 may be further provided between the substrate 101 and the color control portion 201. The selective reflection film 65 may be configured to transmit a blue light and a green light, and to reflect a red light. The selective reflection film 65 may act to transmit a wavelength region of about 440 nm to about 550 nm and to reflect a wavelength region of about 610 nm to about 760 nm. Accordingly, the mixed light including the blue light and the green light emitted from the substrate 101 may be irradiated to the color control portion 201 through the selective reflection film 65. In addition, a red light emitted downward from the second color control element 70b may be reflected by the selective reflection film 65 and emitted upward. The emission efficiency may be improved by the selective reflection film 65. When necessary, the selective reflection film 65 may be optionally formed only under the second color control element 70b.

For example, the selective reflection film 65 may be formed in a distributed Bragg reflector (DBR) structure. A DBR structure that passes or reflects only the desired wavelength band may be created by repeatedly stacking two material layers (dielectrics) having different refractive indices and adjusting the thickness and the number of layers to be stacked of the material layers. The DBR structure may be applied to the selective reflection film 65. For example, a first dielectric layer and a second dielectric layer may be repeatedly stacked, and the reflectance or transmittance of the desired wavelength band may be increased by adjusting the material, the thickness, and the number of layers to be stacked of the material layers. However the configuration of the selective reflection film 65 is not limited to the DBR structure and may vary. The selective reflection film 65 may have a dichroic mirror structure.

Although FIGS. 9 and 11 illustrate that the TFT array substrate 1 may be provided under the substrate 101, and the color control portion 201 is arranged on the substrate 101, their relative location may be changed. When the substrate 101 is a bottom emission device, other than a top emission device, the color control portion 201 may be provided on a lower surface of the TFT array substrate 1. In addition to the foregoing, the configuration of the display apparatus described with reference to FIGS. 9 and 11 may be modified in various ways.

Hereinafter, the emission layer of the blue light-emitting unit applicable to the substrate of the display apparatus according to one or more embodiments is described in further detail.

The blue emission layer may introduce a hyperfluorescence system and includes a host, a first dopant, and a second dopant.

The first dopant may be, as a sensitizer, a phosphorescent material, and the second dopant may be, as a primary light-emitting material, a delayed fluorescence material. The first dopant may perform, as a sensitizer, the function of effectively transferring excitons generated at the host to the second dopant. The lowest triplet energy level of the first dopant may be greater than or equal to the lowest triplet energy level of the second dopant, and the lowest triplet energy level of the first dopant may be greater than or equal to the lowest singlet energy level of the second dopant. Furthermore, a difference between the lowest singlet energy of the second dopant, which is a delayed fluorescence material, and the lowest triplet energy of the second dopant may be 0.3 electron Volts (eV).

Fluorescent light may be emitted from the second dopant to which the excitons are transferred by such hyperfluorescence system (main emission). Phosphorescent light may be emitted from the second dopant by the remaining excitons in the second dopant (sub-emission). Accordingly, the emission from the emission layer may be combined emission of the emission from the first dopant and the emission from the second dopant.

The peak of the emission spectrum of the emission layer of the substrate according to the embodiment may be a combined emission peak of two or more emission peaks. The emission peak may be divided into individual peaks by deconvolution. Among the deconvoluted peaks, the most intensive emission peak (main emission peak) may be referred to as a first emission peak, and an emission peak which is less intensive than the first emission peak yet more intensive than other emission peaks may be referred to as a second emission peak. A difference between the first emission peak and the second emission peak of the emission layer of the substrate according to the embodiment may be less than or equal to about 30 nm, and a full width at half maximum (FWHM) of the emission peak in the emission spectrum may be maintained to be within about 40 nm. As the FWHM of the emission peak is within the aforementioned range, the luminescence color purity may remain at a high level.

With respect to the absorption spectrum of the QD of the color control element of the color control portion in a wavelength region that overlaps with the emission spectrum of the OLED, the most intensive peak may be referred to herein as the first absorption peak. As used herein, a part showing the lowest light absorption between adjacent absorption peaks may be referred to as an absorption valley. An absorption valley between the first absorption peak and another adjacent absorption peak may be referred to herein as the first absorption valley.

The second emission peak of the emission spectrum of the OLED light-emitting unit according to the embodiment may be apart from the first absorption valley by, for example less than or equal to about 10 nm in the absorption spectrum of the QD. In this case, by adjusting a composition ratio of the first dopant and the second dopant, a distance between the second emission peak and the first absorption valley may be adjusted. When the second emission peak is in a close distance from the first absorption valley, for example, in a distance less than or equal to about 10 nm, the second emission peak may not be absorbed by the QD.

The first dopant, which is a phosphorescent sensitizer, may have a longer lifespan than the second dopant, which is a delayed fluorescence material. Accordingly, the higher a content ratio of the first dopant in the emission layer is, the longer the lifespan of the emission layer may be. However, when the second emission peak based on the phosphorescent dopant is out of the first emission peak, which is the main emission peak, the luminescence color purity of the OLED may be degraded. When the second emission peak is close to or overlaps with the first absorption valley of the QD, as the light of the second emission peak is not absorbed by the color control element, the color purity of the display apparatus may be less affected, and the lifespan of the substrate may be improved.

In the emission spectrum of the blue OLED light-emitting unit, the first emission peak is represented by $\lambda_{BEM1}$, and the second emission peak is represented by $\lambda_{BEM2}$. In the absorption spectrum of the QD of the color control element for the green color conversion in the color control portion, the first absorption peak is represented by $\lambda_{ABP1}$, and the first absorption valley is represented by $\lambda_{ABVL1}$.

The blue OLED light-emitting unit according to one or more embodiments may have a maximum emission wavelength ($\lambda_{BEM1}$) of about 430 nm to about 500 nm, for example, about 445 nm to about 475 nm, and may emit a blue light having a FWHM of less than or equal to about 50 nm, for example, less than or equal to about 40 nm. The absorption spectrum of the QD of the color control element for green color conversion according to one or more embodiments may have a maximum absorption peak ($\lambda_{ABP1}$) of about 430 nm to about 550 nm, for example, about 450 nm to about 510 nm. The QD of the color control element for green color conversion may have a first emission peak in a wavelength range of about 500 nm to about 550 nm. The first emission peak may have the most intense peak in the spectrum of converted and emitted light that has been absorbed by the QD.

When the photoluminescence (PL) transient decay lifetime of the blue OLED light-emitting unit is represented by $T_{BEM}$, and the PL transient decay lifetime of the case where only the first dopant is used as a light-emitting material of the emission layer is represented by $T_{D1}$, ($T_{BML}/T_{D1}$) may be in a range greater than 1 and less than 2, for example, greater than or equal to 1.2 and less than or equal to 1.8, or for example, greater than or equal to 1.3 and less than or equal to 1.7. The PL transient decay lifetime of the phosphorescent dopant may be relatively shorter than that of the delayed fluorescence dopant. When the PL transient decay lifetime is short, the time in which molecules are in a high-energy state may be shortened, which leads to reduced deterioration due to high energy. When ($T_{BML}/T_{D1}$) is in the aforementioned range, a dopant may be less deteriorated, while the emission efficiency is maintained at a high level.

According to one or more embodiments, an absolute value of a difference between the second emission peak ($\lambda_{BEM2}$) and the first absorption valley ($\lambda_{ABVL1}$) may be less than a difference between the first emission peak ($\lambda_{BEM1}$) and the second emission peak ($\lambda_{BEM2}$). In this case, the emission spectrum of the OLED unit and the absorption spectrum of the QD of the color control element may overlap with each other to maintain high emission efficiency of the display apparatus according to the embodiment.

The triplet energy of the first dopant ($T_1(D_1)$) is greater than or equal to the triplet energy of the second dopant ($T_1(D_2)$) and the singlet energy of the second dopant ($S_1(D_1)$).

The first dopant may be at least one organometallic compound represented by Formula 1 below, and the second dopant may be a polycyclic compound represented by Formula 3 below.

Hereinafter, the first dopant and the second dopant are described in further detail.

According to one or more embodiments, the organometallic compound of the first dopant may be represented by Formula 1:

Formula 1

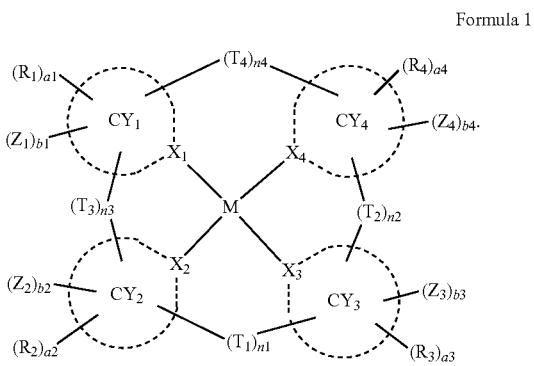

M in Formula 1 may be a transition metal.

For example, M may be a Period 1 transition metal of the Periodic Table of Elements, a Period 2 transition metal of the Periodic Table of Elements, or Period 3 transition metal of the Periodic Table of Elements.

In another example, M may be iridium, platinum, osmium, titanium, zirconium, hafnium, europium, terbium, thulium, rhodium, palladium, or gold.

According to one or more embodiments, M in Formula 1 may be platinum, palladium, or gold.

In Formula 1, $X_1$ to $X_4$ may each independently be C or N.

According to one or more embodiments, $X_2$ and $X_3$ may be C, and $X_4$ may be N.

In Formula 1, two bonds of a bond between $X_1$ and M, a bond between $X_2$ and M, a bond between $X_3$ and M, and a bond between $X_4$ and M may be coordinate bonds, and the other two bonds may be covalent bonds.

According to one or more embodiments, a bond between $X_1$ and M in Formula 1 may be a coordinate bond.

According to another embodiment, in Formula 1, a bond between $X_1$ and M and a bond between $X_4$ and M may be a coordinate bond, and a bond between $X_2$ and M and a bond between $X_3$ and M may be a covalent bond.

According to another embodiment, in Formula 1, $X_2$ and $X_3$ may each be C, $X_4$ may be N, a bond between $X_2$ and M and a bond between $X_3$ and M may each be a covalent bond, and a bond between $X_4$ and M may be a coordinate bond.

In Formula 1, $Z_1$ to $Z_4$ may each independently be a group represented by Formula 2:

Formula 2

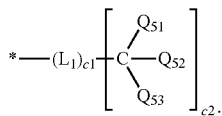

Details of Formula 2 are as described herein.

In Formula 1, b1 to b4 respectively represent the numbers of $Z_1$ to $Z_4$, and may each independently be an integer from 0 to 20 (e.g., 0, 1, 2, or 3), wherein a sum of b1 to b4 may be 1 or greater (e.g., 1, 2, 3, 4, 5, or 6). That is, the organometallic compound represented by Formula 2 may include at least one (e.g., 1, 2, 3, 4, 5, or 6) group represented by Formula 2. When b1 is 2 or greater, two or more of $Z_1$ may be identical to or different from each other, when b2 is 2 or greater, two or more of $Z_2$ may be identical to or different from each other, when b3 is 2 or greater, two or more of $Z_3$ may be identical to or different from each other, and when b4 is 2 or greater, two or more of $Z_4$ may be identical to or different from each other.

According to one or more embodiments, in Formula 1, i) b1 may be 1 or 2, and b2, b3, and b4 may be 0;

ii) b2 may be 1 or 2, and b1, b3, and b4 may be 0;

iii) b3 may be 1 or 2, and b1, b2, and b4 may be 0;

iv) b4 may be 1 or 2, and b1, b2, and b3 may be 0; or v) b1 and b4 may each independently be 1 or 2, and b2 and b3 may be 0.

Ring $CY_1$ to ring $CY_4$ in Formula 1 may each independently be a $C_6$-$C_{30}$ carbocyclic group or a $C_1$-$C_{30}$ heterocyclic group.

For example, ring $CY_1$ to ring $CY_4$ in Formula 1 may each independently be i) a first ring, ii) a second ring, iii) a condensed ring group in which two or more first rings are condensed with each other, iv) a condensed ring group in which two or more second rings are condensed with each other, or v) a condensed ring group in which at least one first ring and at least one second ring are condensed with each other, the first ring may be a cyclopentane group, a cyclopentadiene group, a furan group, a thiophene group, a pyrrole group, a silole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, a triazine group, an oxazine group, a thiazine group, a dihydropyrazine group, a dihydropyridine group, or a dihydroazasilole group.

According to one or more embodiments, ring $CY_1$ in Formula 1 may be i) a first ring, ii) a condensed ring group in which two or more first rings are condensed with each other, or iii) a condensed ring group in which at least one first ring and at least one second ring are condensed with each other, and C or N in the first ring included in ring $CY_1$ may be $X_1$ in Formula 1. That is, the first ring (e.g., a 5-membered ring) included in ring $CY_1$ may be combined with M in Formula 1. In this regard, the first ring and the second ring are as described herein.

According to another embodiment, ring $CY_1$ to ring $CY_4$ in Formula 1 may each independently be a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an iso-oxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group.

According to another embodiment, ring $CY_1$ in Formula 1 may be a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a pyridine group, a pyrimidine group, a pyrazine group, a pyridazine group, a triazine group, a quinoline group, an isoquinoline group, a quinoxaline group, a quinazoline group, a 5,6,7,8-tetrahydroisoquinoline group, or a 5,6,7,8-tetrahydroquinoline group.

According to another embodiment, ring $CY_2$ and ring $CY_4$ in Formula 1 may each independently be a benzene group, a naphthalene group, a carbazole group, a fluorene group, a dibenzosilole group, a dibenzothiophene group, a dibenzofuran group, an azacarbazole group, an azafluorene group, an azadibenzosilole group, an azadibenzothiophene group, an azadibenzofuran group, a pyridine group, a pyrimidine group, a pyrazine group, a pyridazine group, a triazine group, a quinoline group, an isoquinoline group, a quinoxaline group, a quinazoline group, a 5,6,7,8-tetrahydroisoquinoline group, or a 5,6,7,8-tetrahydroquinoline group.

In Formula 1, $T_1$ may be a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)*', *—Ge($R_{5a}$)($R_{5b}$)—*', *—S—*', *—Se*', *—O—*', *—C(=O)—*', *—S(=O)—*', *—S(=O)$_2$—*', *—C($R_{5a}$)=*', *=C($R_{5a}$)—*', *—C($R_{5a}$)=C($R_{5b}$)—*', *—C(=S)—*', *—C—C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_2$ may be a single bond, a double bond, *—N($R_{6a}$)—*', *—B($R_{6a}$)—*', *—P($R_{6a}$)—*', *—C($R_{6a}$)($R_{6b}$)—*', *—Si($R_{6a}$)($R_{6b}$)—*', *—Ge($R_{6a}$)($R_{6b}$)—*', *—S—*', *—Se—*', *—O—*', *—C(=O)—*', *—S(=O)—*', *—S(=O)$_2$—*', *—C($R_{6a}$)=*', *=C($R_{6a}$)—*', *—C($R_{6a}$)=C($R_{6b}$)—*', *—C(=S)—*', *—C=C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_3$ may be a single bond, a double bond, *—N($R_{7a}$)—*', *—B($R_{7a}$)—*', *—P($R_{7a}$)—*', *—C($R_{7a}$)($R_{7b}$)—*', *—Si($R_{7a}$)($R_{7b}$)—*', *—Ge($R_{7a}$)($R_{7b}$)—*', *—S*', *—Se—*', *—O—*', *—C(=O)—*', *—S(=O)—*'' *—S(=O)$_2$*', *—C($R_{7a}$)=*', *=C($R_{7a}$)*', *—C($R_{7a}$)=C($R_{7b}$)—*', *—C(=S)—*', *—CC—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, and $T_4$ may be a single bond, a double bond, *—N($R_{8a}$)—*—B($R_{8a}$)—*', *—P($R_{8a}$)—*', *—C($R_{8a}$)($R_{8b}$)—*', *—Si($R_{8a}$)($R_{8b}$)—*', *—Ge($R_{8a}$)($R_{8b}$)*', *—S—*', *—Se—*', *—C(=O)—*', *—S(=O)—*, *—S(=O)$_2$*', *—C($R_{8a}$)=*', *=C($R_{8a}$)—*', *—C($R_{8a}$)=C($R_{8b}$)—*', *—C(=S)—*', *—C—C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$. Each of $R_{5a}$, $R_{5b}$, $R_{6a}$, $R_{6b}$, $R_{7a}$, $R_{7b}$, $R_{8a}$, and $R_{8b}$ is as described herein.

In Formula 1, n1 to n4 may each independently be an integer from 0 to 5, and three or more of n1 to n4 may each independently be an integer from 1 to 5. That is, an organometallic compound represented by Formula 1 may have a tetradentate ligand.

In Formula 1, when n1 is 0, then $T_1$ is absent, when n2 is 0, then $T_2$ is absent, when n3 is 0, then $T_3$ is absent, and when n4 is 0, then $T_4$ is absent.

In Formula 1, when n1 is 2 or greater, two or more of $T_1$ may be identical to or different from each other, when n2 is 2 or greater, two or more of $T_2$ may be identical to or different from each other, when n3 is 2 or greater, two or more of $T_3$ may be identical to or different from each other, and when n4 is 2 or greater, two or more of $T_4$ may be identical to or different from each other.

For example, in Formula 1,
1) n4 may be 0, and n1, n2, and n3 may be 1;
2) n4 may be 1, 2, 3, or 4, and n1, n2, and n3 may be 1;
3) n3 may be 0, n1 and n2 may be 1, and n4 may be 1, 2, 3, or 4;
4) n2 may be 0, n1 and n3 may be 1, and n4 may be 1, 2, 3, or 4; or
5) n1 may be 0, n2 and n3 may be 1, and n4 may be 1, 2, 3, or 4.

In another example, in Formula 1, n1 and n3 may not be 0.

According to one or more embodiments, in Formula 1, n1 may not be 0, and $T_1$ may be *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)—*', *—S-', or *—O—*'.

According to another embodiment, in Formula 1, n2 may not be 0, and $T_2$ may be a single bond.

According to another embodiment, in Formula 1, n2 may not be 0, and $T_2$ may be *—N($R_{6a}$)—*', *—B($R_{6a}$)—*', *—P($R_{6a}$)—*', *—C($R_{6a}$)($R_{6b}$)—*', *—Si($R_{6a}$)($R_{6b}$)—*', *—Ge($R_{6a}$)($R_{6b}$)—*', *—S—*' or *—O*'

According to another embodiment, in Formula 1, n3 may not be 0, and $T_3$ may be a single bond.

According to another embodiment, n3 in Formula 1 may be 0.

According to another embodiment, n4 in Formula 1 may be 0.

According to another embodiment, in Formula 1, n4 may not be 0, and $T_4$ may be *—N($R_{8a}$)—*', *—B($R_{8a}$)—*', *—P($R_{8a}$)—*', *—C($R_{8a}$)($R_{8b}$)—*', *—Si($R_{8a}$)($R_{8b}$)—*', *—Ge($R_{8a}$)($R_8$)*', *—S—*', *—Se—*', *—O—*', *—C(=O)—*', *—S(=O)—*', *—S(=O)$_2$—*', *—C($R_{8a}$)=*', *=C($R_{8a}$)—*', * C($R_{8a}$)=C($R_{8b}$)—*', *—C(=S)*', *—C=C*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

According to another embodiment, in Formula 1, n4 may be 1, 2, 3, or 4, and $T_4$ may be *—C($R_{8a}$)($R_{8b}$)—*',

*—S—*', *—O—*', or a $C_5$-$C_{30}$ carbocyclic group unsubstituted or substituted with at least one $R_{10a}$.

$R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ in Formulae 1 and 1-1, may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{00}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, and at least one of $Q_{51}$ to $Q_{55}$ (e.g., one or two of $Q_{51}$ to $Q_{53}$) in Formula 2 may each independently be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

For example, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ may each independently be:

hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, $C_1$-$C_{20}$ alkyl group, a $C_1$-$C_{20}$ alkenyl group, a $C_1$-$C_{20}$ alkoxy group, or a $C_1$-$C_{20}$ alkylthio group;

a $C_1$-$C_{20}$ alkyl group, a $C_1$-$C_{20}$ alkenyl group, a $C_1$-$C_{20}$ alkoxy group, or a $C_1$-$C_{20}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or a combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a deuterated $C_2$-$C_{20}$ alkyl group, a $C_1$-$C_{20}$ alkoxy group, a $C_1$-$C_{20}$ alkylthio group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.1]heptyl group, a ($C_1$-$C_{20}$ alkyl)bicyclo[2.2.2]octyl group, a phenyl group, a ($C_1$-$C_{20}$ alkyl)

phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, an isobenioxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or a combination thereof; or
—N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$),
and
$Q_1$ to $Q_9$ may each independently be:
deuterium, —F, —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, —$CD_2CDH_2$, —$CF_3$, —$CF_2H$, —$CFH_2$, —$CH_2CF_3$, —$CH_2CF_2H$, —$CH_2CFH_2$, —$CHFCH_3$, —$CHFCF_2H$, —$CHFCFH_2$, —$CHFCF_3$, —$CF_2CF_3$, —$CF_2CF_2H$, or —$CF_2CFH_2$; or
an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with at least one of deuterium, —F, a $C_1$-$C_{10}$ alkyl group, a phenyl group, or a combination thereof.

According to one or more embodiments, $Q_{51}$ to $Q_{53}$ may each independently be a substituted or unsubstituted $C_1$-$C_{60}$ alkyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, and at least one of $Q_{51}$ to $Q_{53}$ (e.g., one or two of $Q_{51}$ to $Q_{53}$) may be a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group.

According to another embodiment, $Q_{51}$ to $Q_{53}$ may each independently be a $C_1$-$C_{20}$ alkyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a ($C_1$-$C_{20}$ alkyl)phenyl group, a biphenyl group, a terphenyl group, a naphthyl group, a pyridinyl group, a pyrimidinyl group, or a combination thereof, and at least one of $Q_{51}$ to $Q_{55}$ (e.g., one or two of $Q_{51}$ to $Q_{53}$) may be a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, a benzoisothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, or an azadibenzothiophenyl group, each unsubstituted or substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a phenyl group, a ($C_1$-$C_{20}$ alkyl)phenyl group, a biphenyl group, a terphenyl group, a naphthyl group, a pyridinyl group, a pyrimidinyl group, or a combination thereof.

According to another embodiment, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ in Formulae 1 and 2 may each independently be hydrogen, deuterium, —F, —$CH_3$, —$CD_3$, —$CD_2H$, —$CDH_2$, —$CF_3$, —$CF_2H$, —CFH$_2$, a C$_1$-C$_{10}$ alkenyl group, a C$_1$-C$_{10}$ alkoxy group, a C$_1$-C$_{10}$ alkylthio group, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 9-201 to 9-237, a group represented by one of Formulae 9-201 to 9-237 in which at least one hydrogen is substituted with deuterium, a group represented by one of Formulae 9-201 to 9-237 in which at least one hydrogen is substituted with —F, a group represented by one of Formulae 10-1 to 10-129, a group represented by one of Formulae 10-1 to 10-129 in which at least one hydrogen is substituted with deuterium, a group represented by one of Formulae 10-1 to 10-129 in which at least one hydrogen is substituted with —F, a group represented by one of Formulae 10-201 to 10-350, a group represented by one of Formulae 10-201 to 10-350 in which at least one hydrogen is substituted with deuterium, a group represented by one of Formulae 10-201 to 10-350 in which at least one hydrogen is substituted with —F, —Si(Q$_3$)(Q$_4$)(Q$_5$), or —Ge(Q$_3$)(Q$_4$)(Q$_5$), wherein Q$_3$ to Q$_5$ are as described herein:

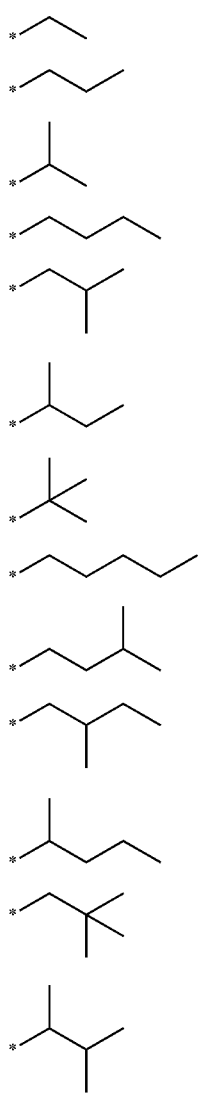

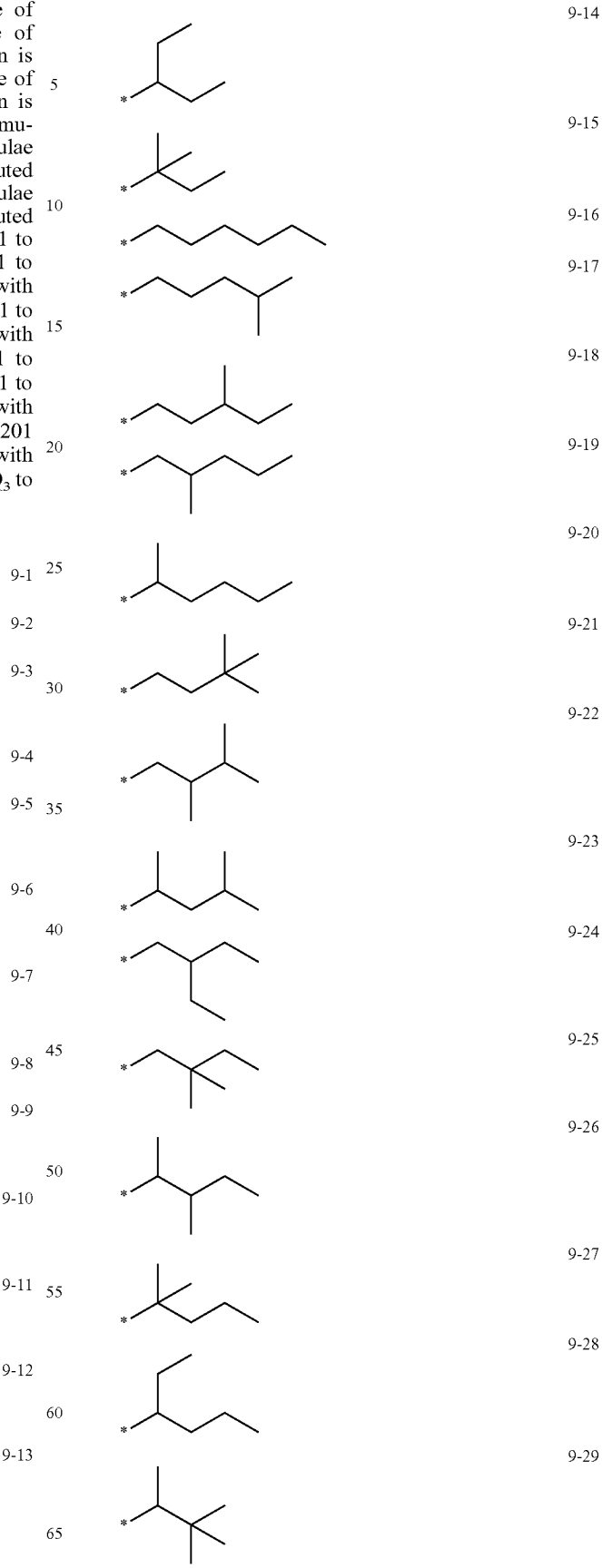

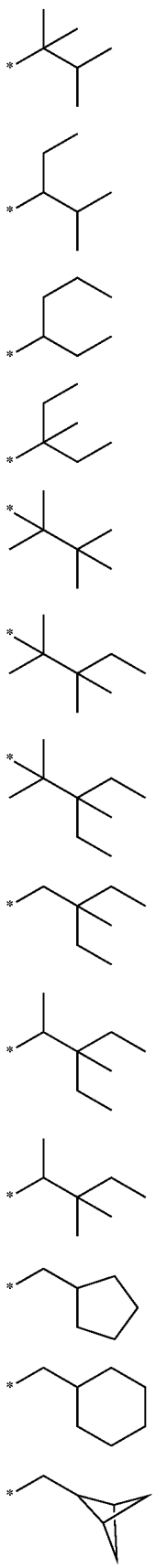
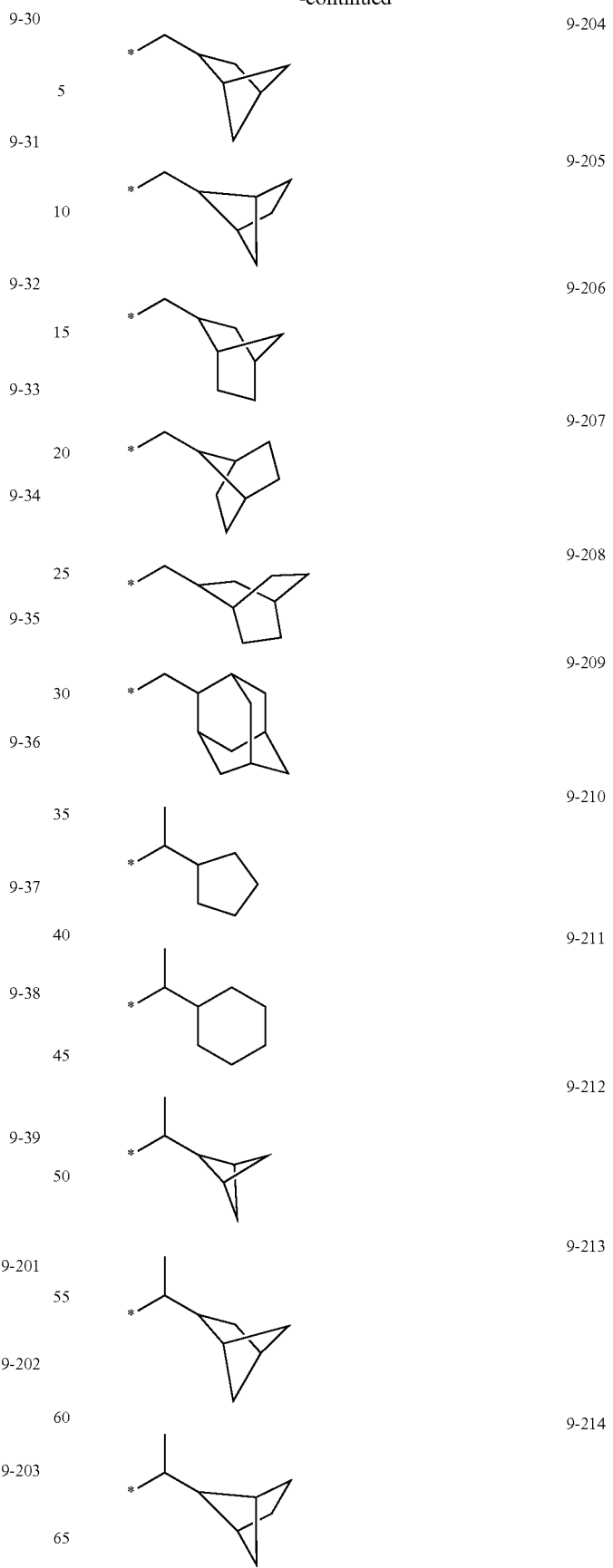

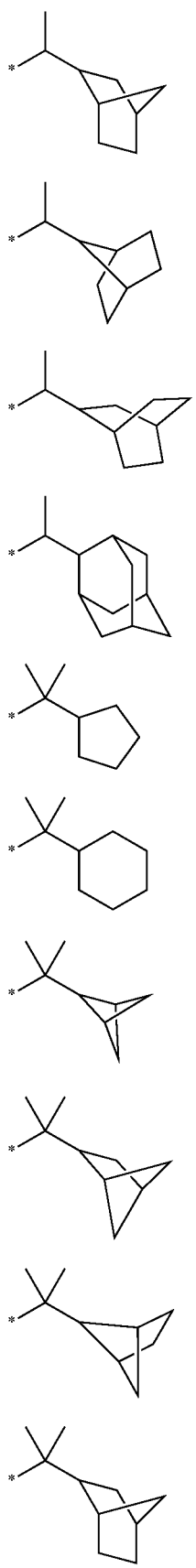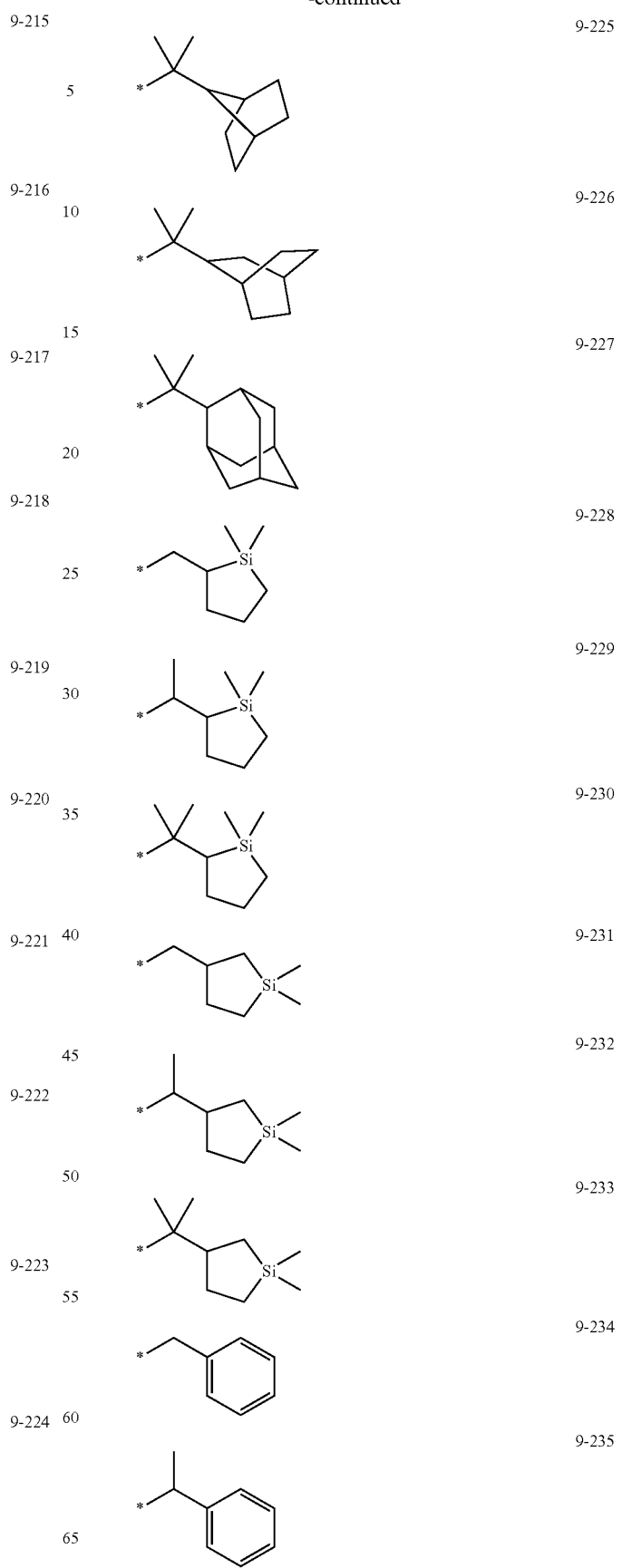

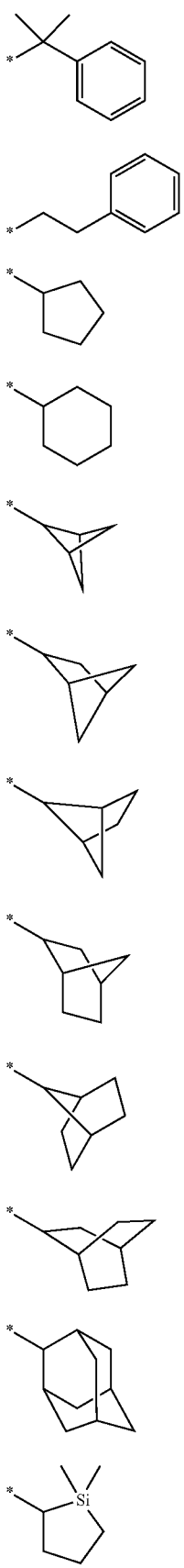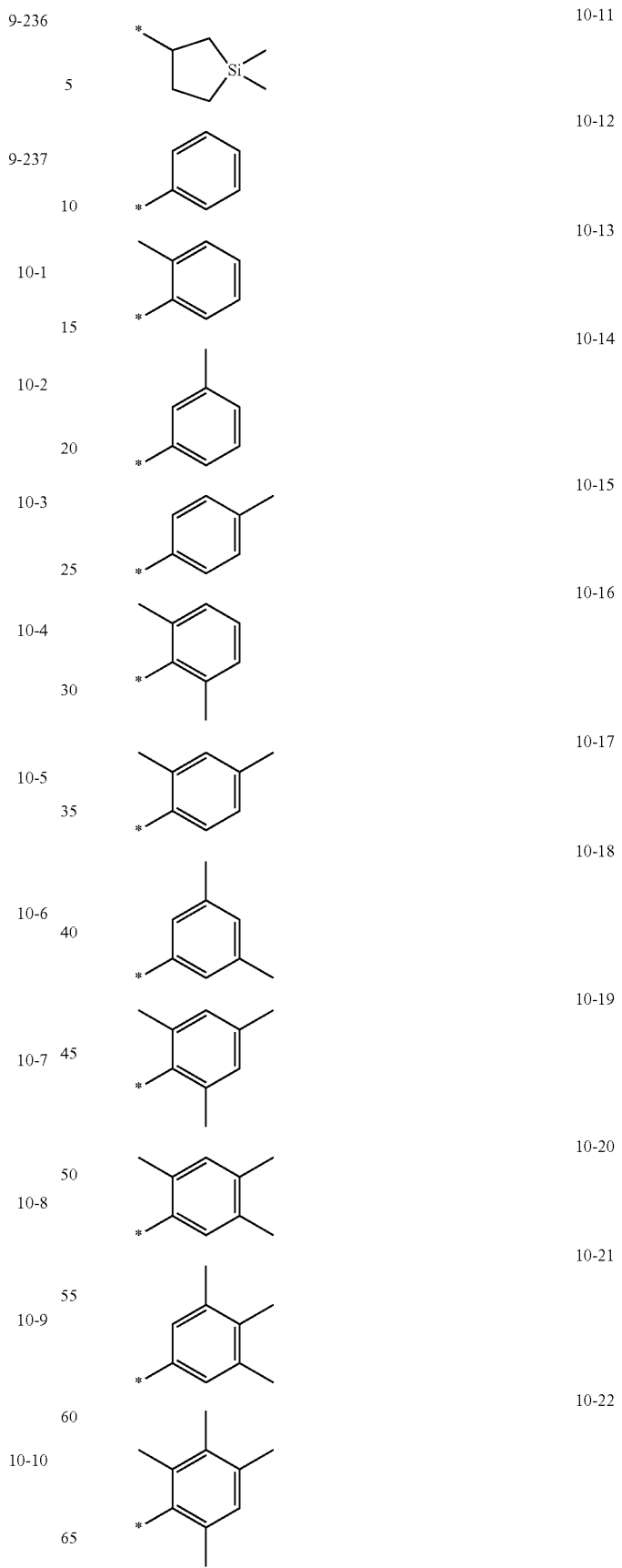

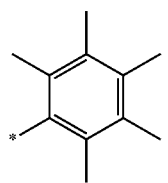
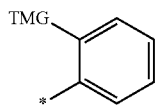
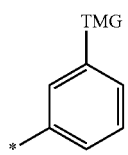
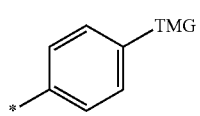
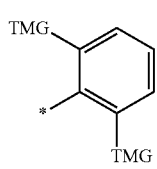
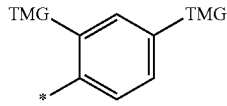
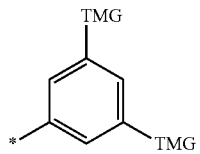
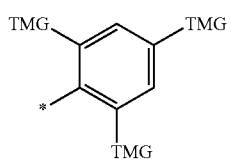
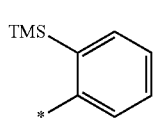
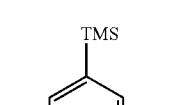
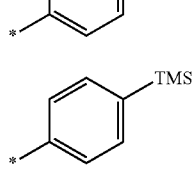
10-23
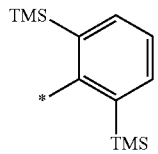
10-24
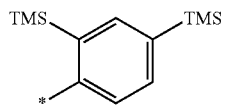
10-25
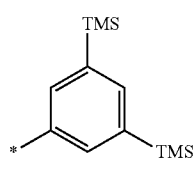
10-26
10-27
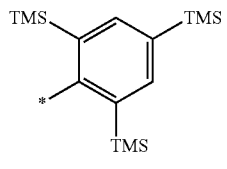
10-28
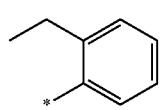
10-29
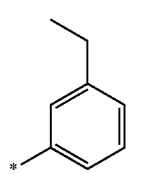
10-30
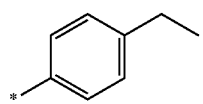
10-31
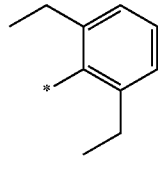
10-32
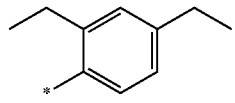
10-33
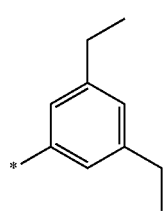
10-34
10-35
10-36
10-37
10-38
10-39
10-40
10-41
10-42
10-43

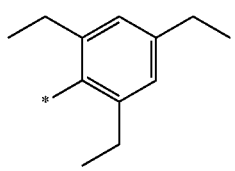
10-44
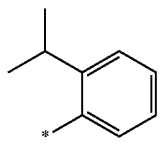
10-45
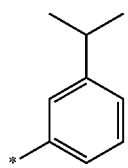
10-46
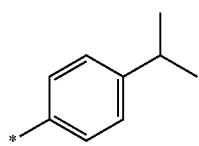
10-47
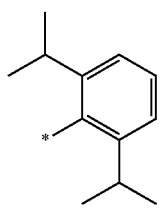
10-48
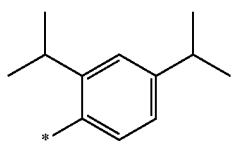
10-49
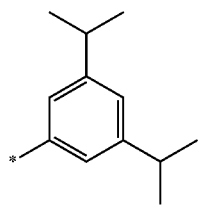
10-50
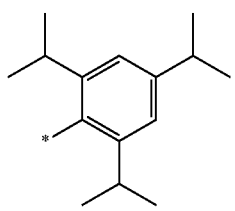
10-51
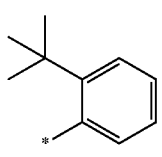
10-52
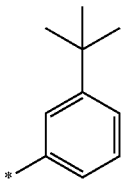
10-53
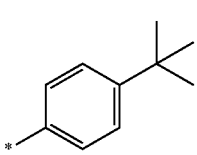
10-54
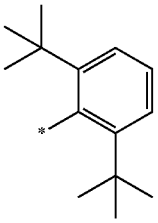
10-55
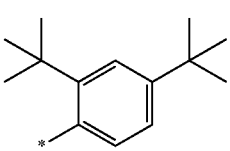
10-56
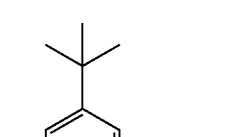
10-57
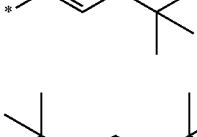
10-58
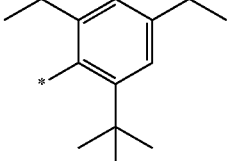
10-59
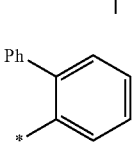
10-60
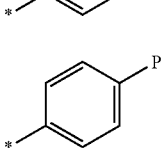
10-61

| | |
|---|---|
| 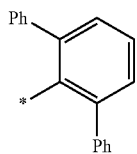 | 10-62 |
| 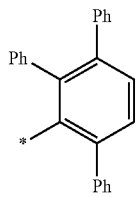 | 10-63 |
| 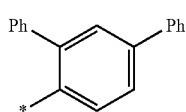 | 10-64 |
| 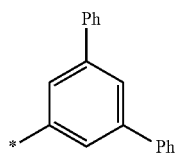 | 10-65 |
| 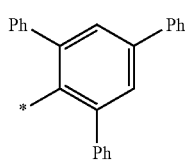 | 10-66 |
| 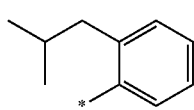 | 10-67 |
| 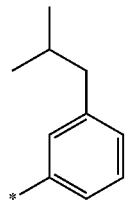 | 10-68 |
| 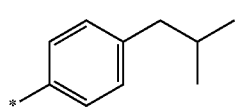 | 10-69 |
| 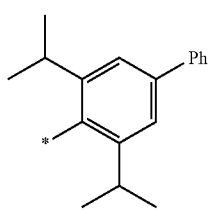 | 10-70 |
| 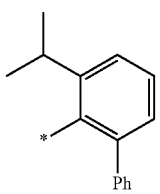 | 10-71 |
| 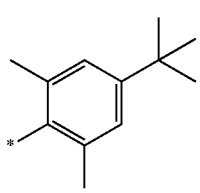 | 10-72 |
| 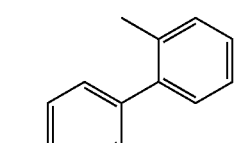 | 10-73 |
| 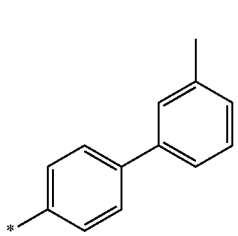 | 10-74 |
| 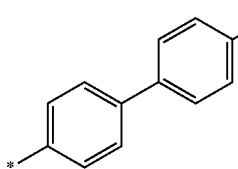 | 10-75 |
| 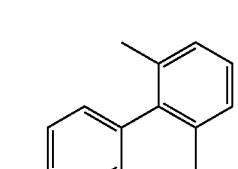 | 10-76 |
| 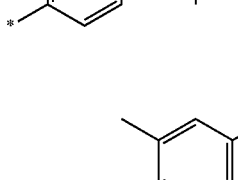 | 10-77 |
| 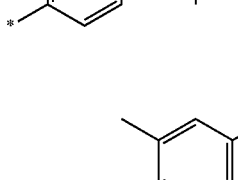 | 10-78 |

10-79 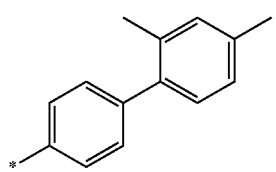
10-80 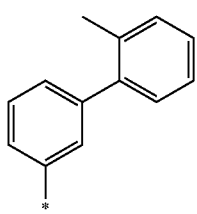
10-81 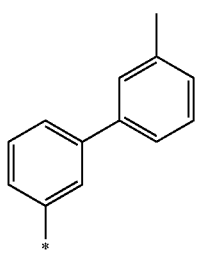
10-82 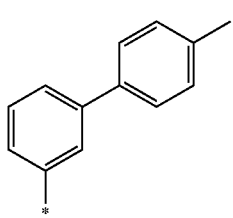
10-83 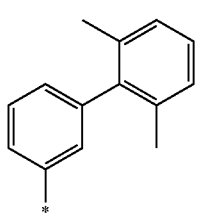
10-84 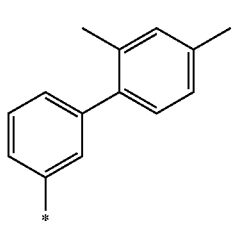
10-85 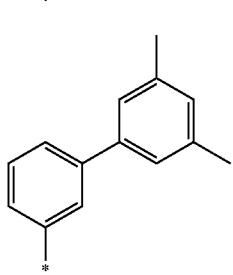
10-86 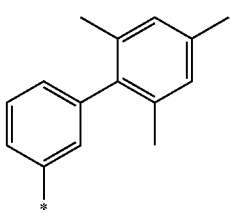
10-87 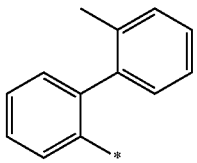
10-88 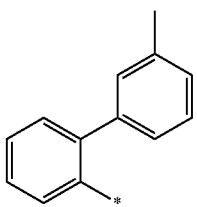
10-89 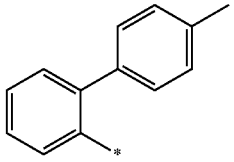
10-90 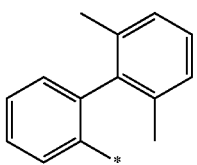
10-91 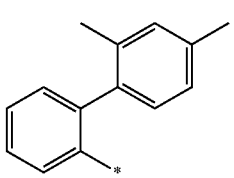
10-92 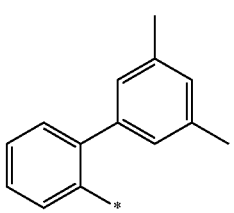
10-93 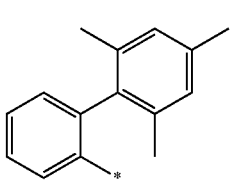

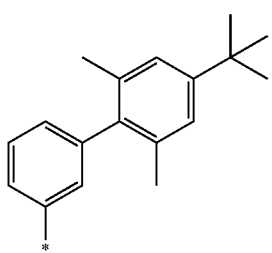
10-94
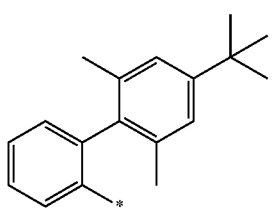
10-95
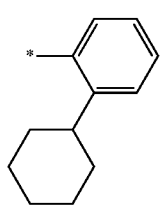
10-96
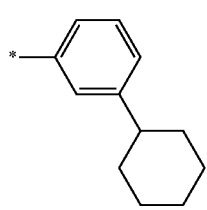
10-97
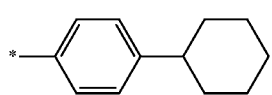
10-98
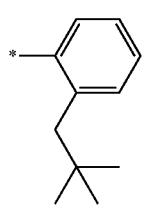
10-99
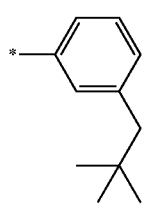
10-100
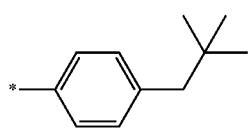
10-101
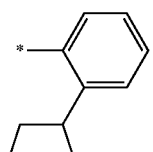
10-102
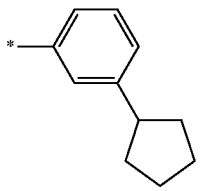
10-103
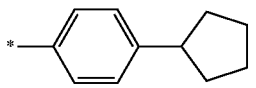
10-104
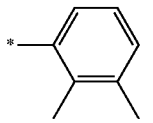
10-105
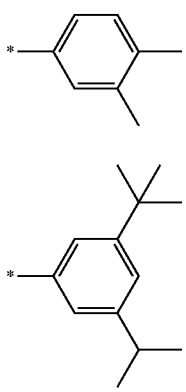
10-106
10-107
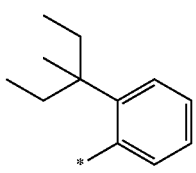
10-108
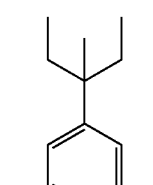
10-109
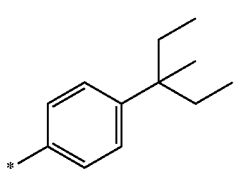
10-110

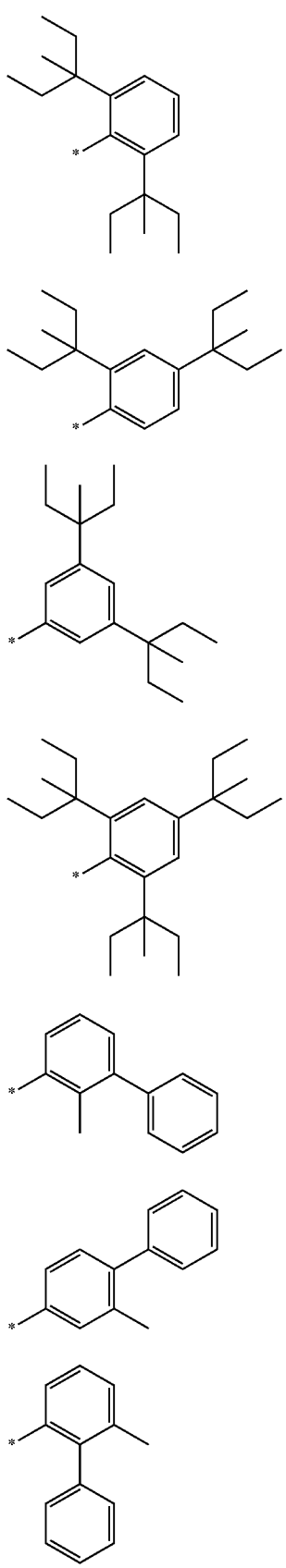

10-124 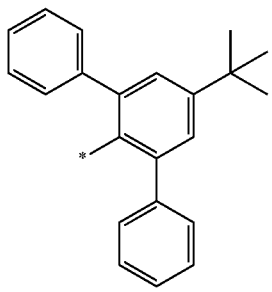
10-125 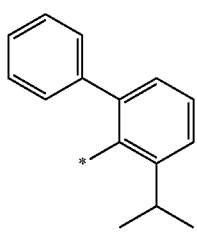
10-126 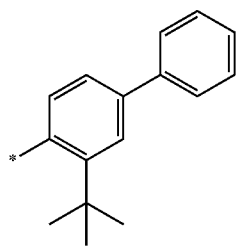
10-127 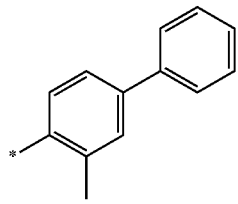
10-128 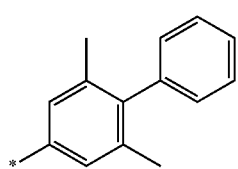
10-129 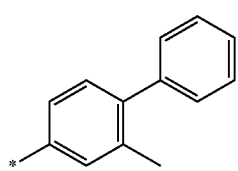
10-201 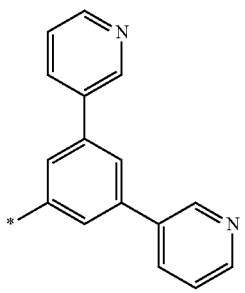
10-202 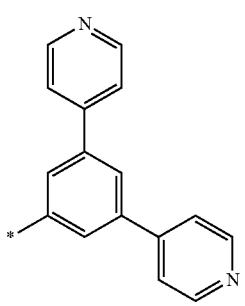
10-203 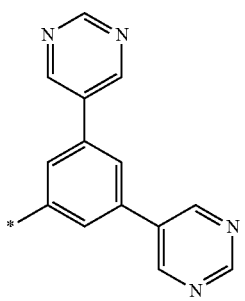
10-204 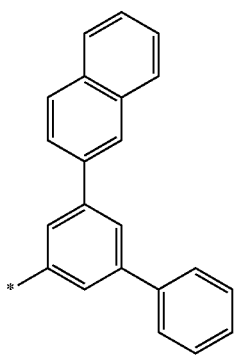
10-205 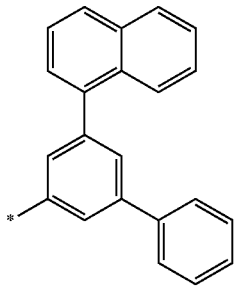

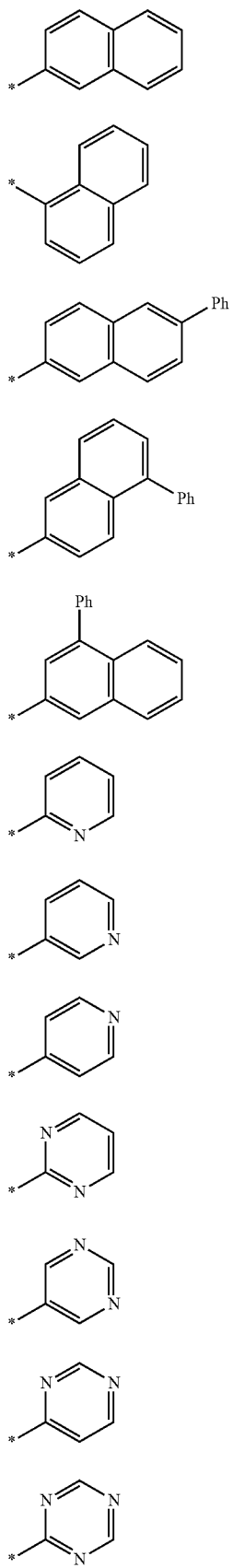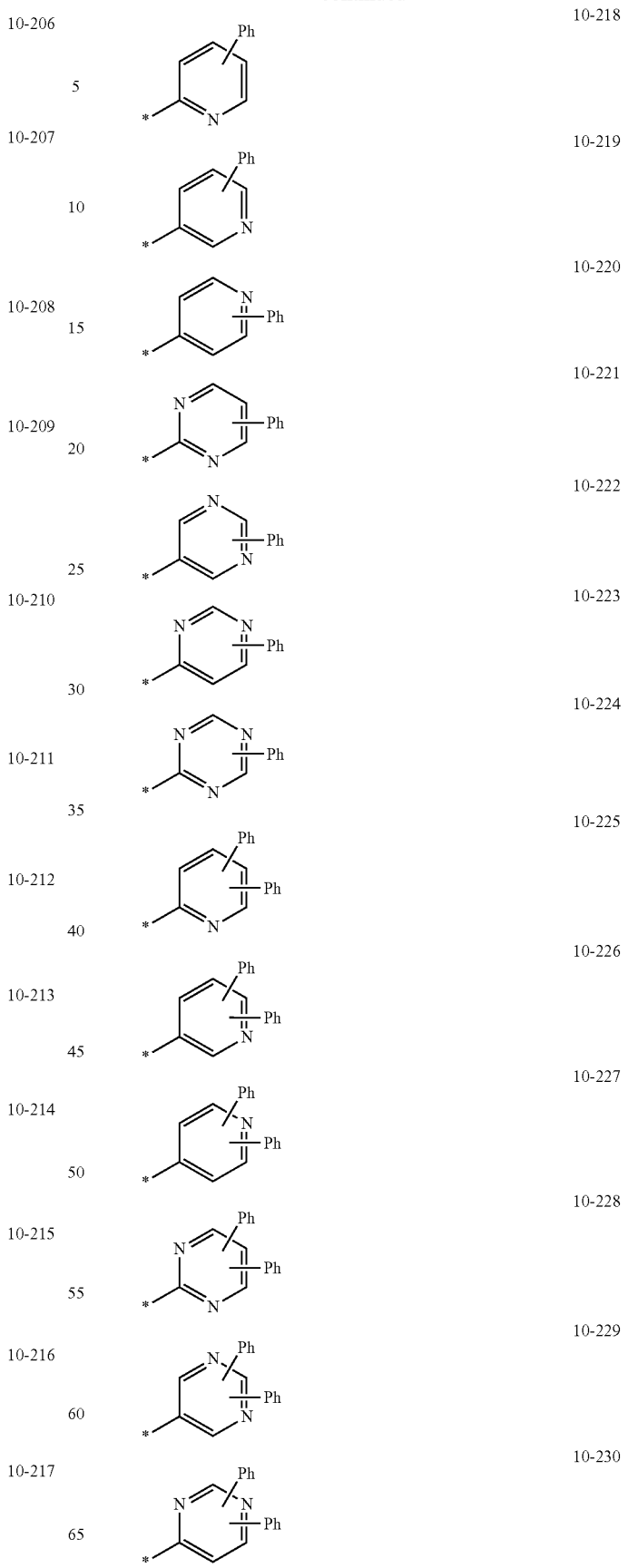

10-231 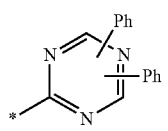
10-232 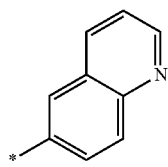
10-233 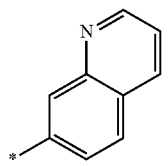
10-234 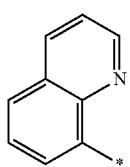
10-235 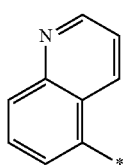
10-236 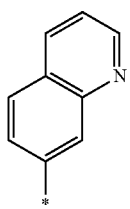
10-237 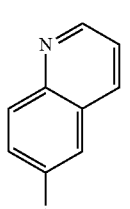
10-238 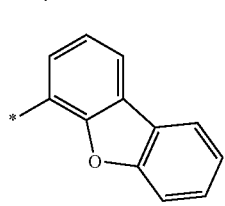
10-239 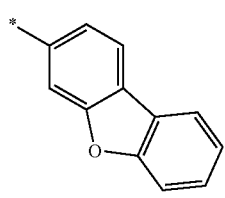
10-240 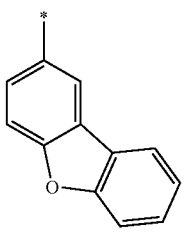
10-241 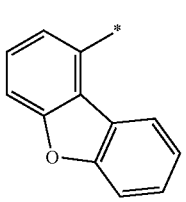
10-242 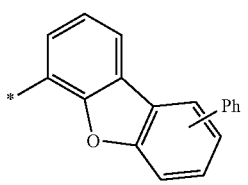
10-243 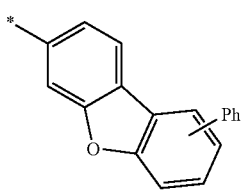
10-244 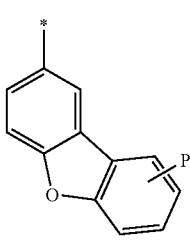
10-245 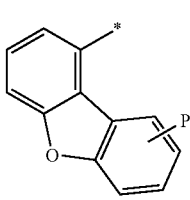
10-246 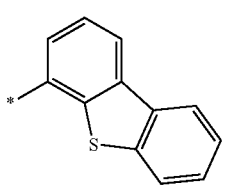
10-247 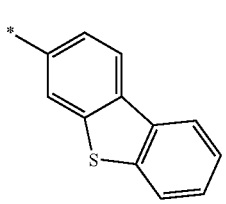

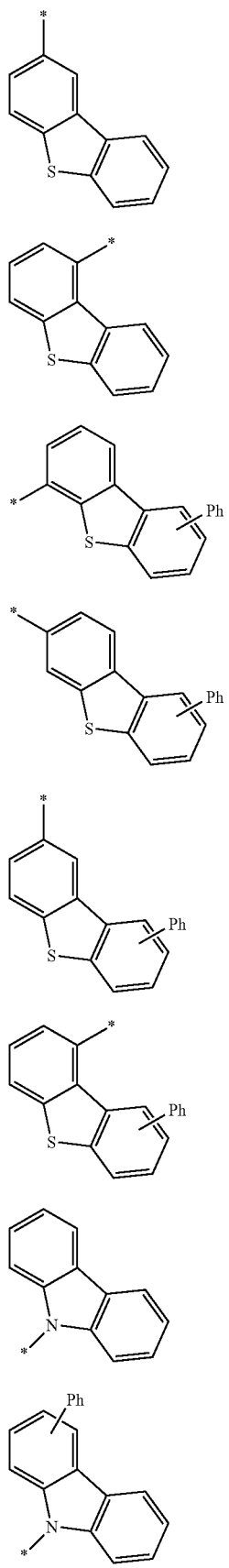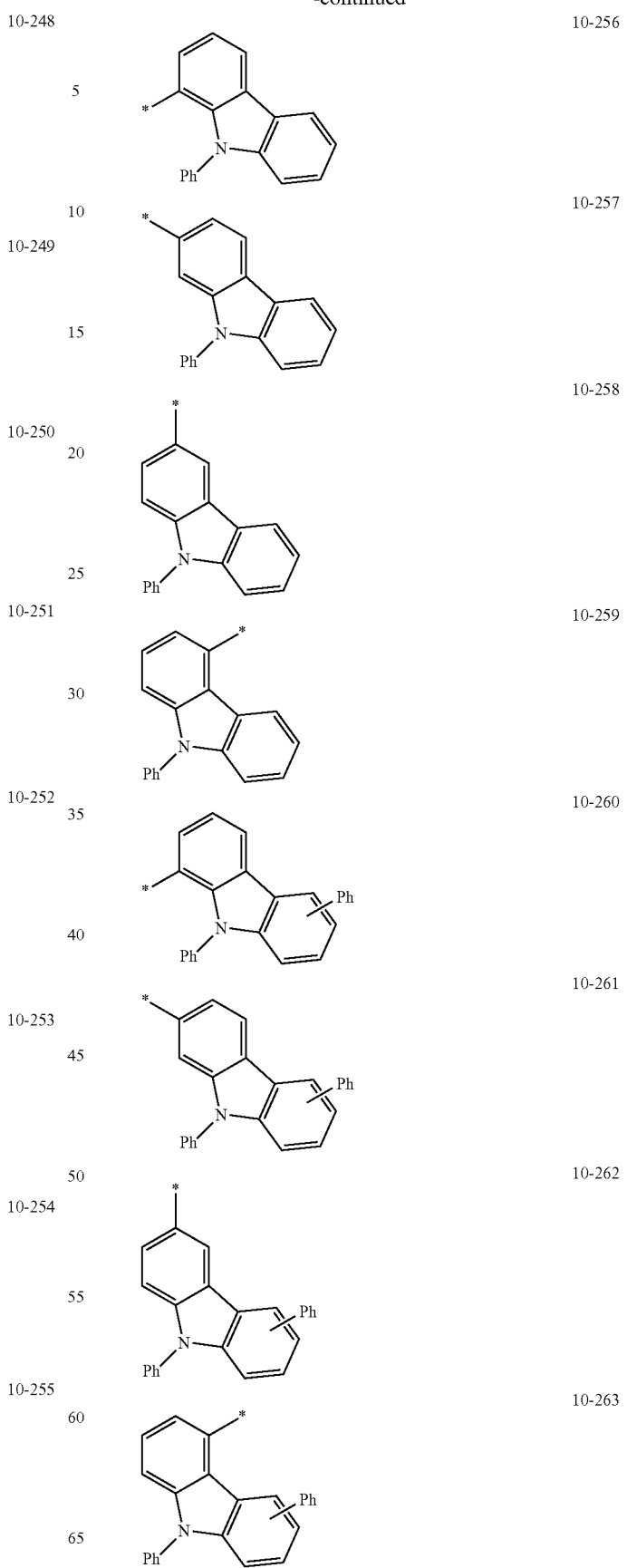

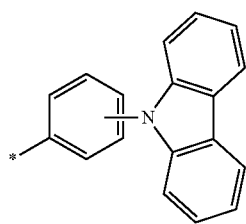
10-257
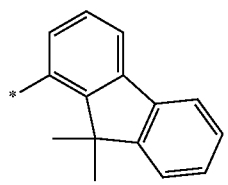
10-258
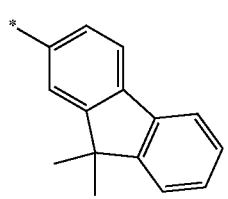
10-259
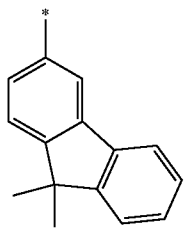
10-260
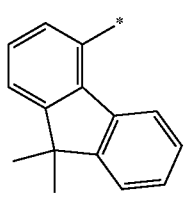
10-261
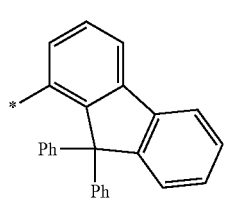
10-262
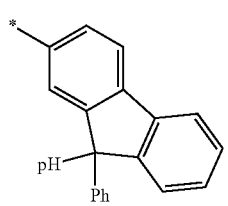
10-263
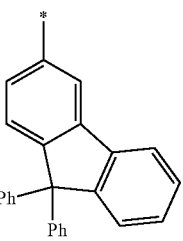
10-264
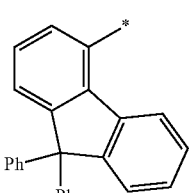
10-265
10-266
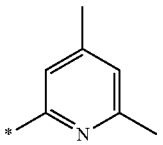
10-267
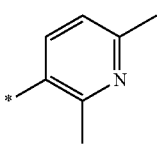
10-268
10-269
10-270
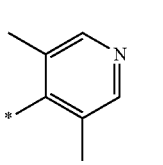
10-271
10-272
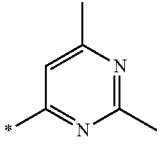
10-273
10-274
10-275
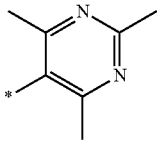
10-276
10-277
10-278
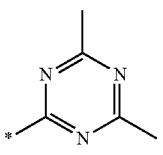
10-279

-continued
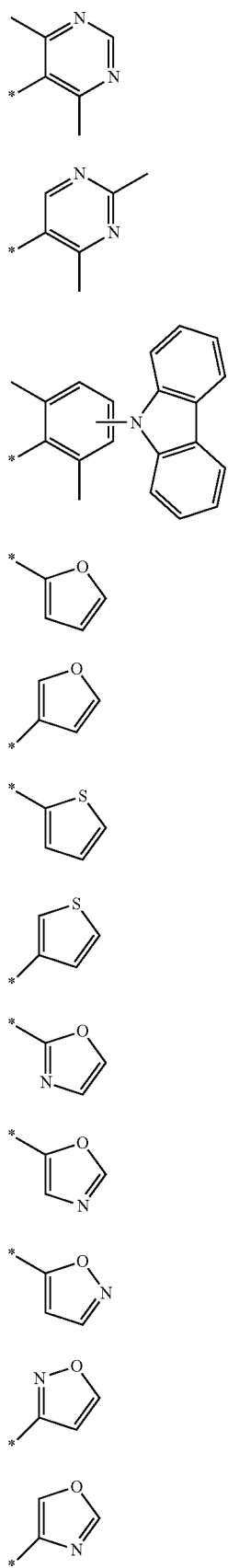
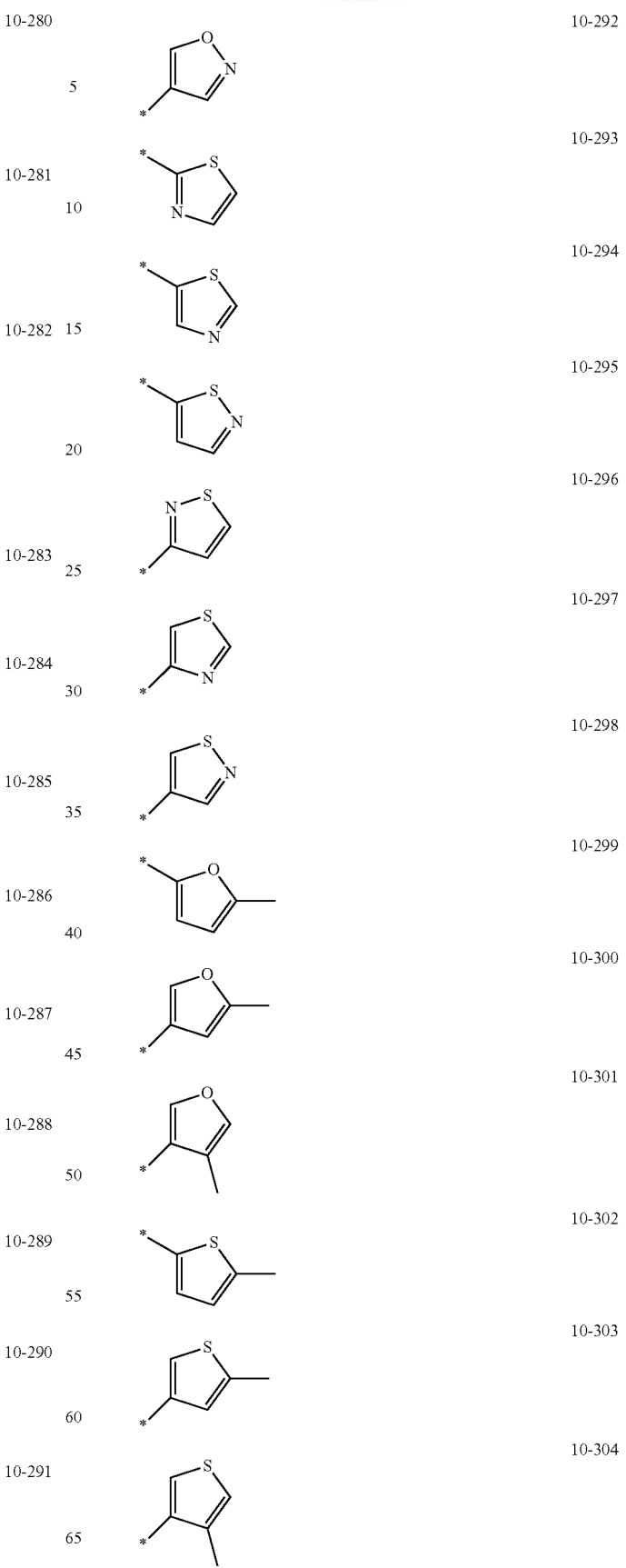

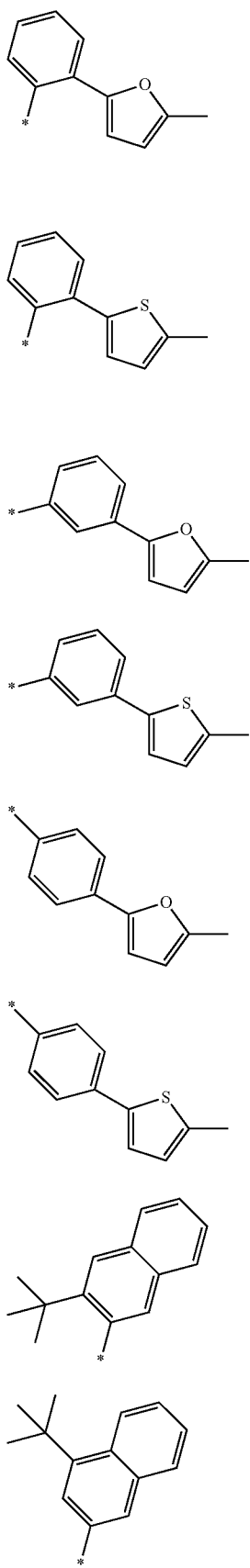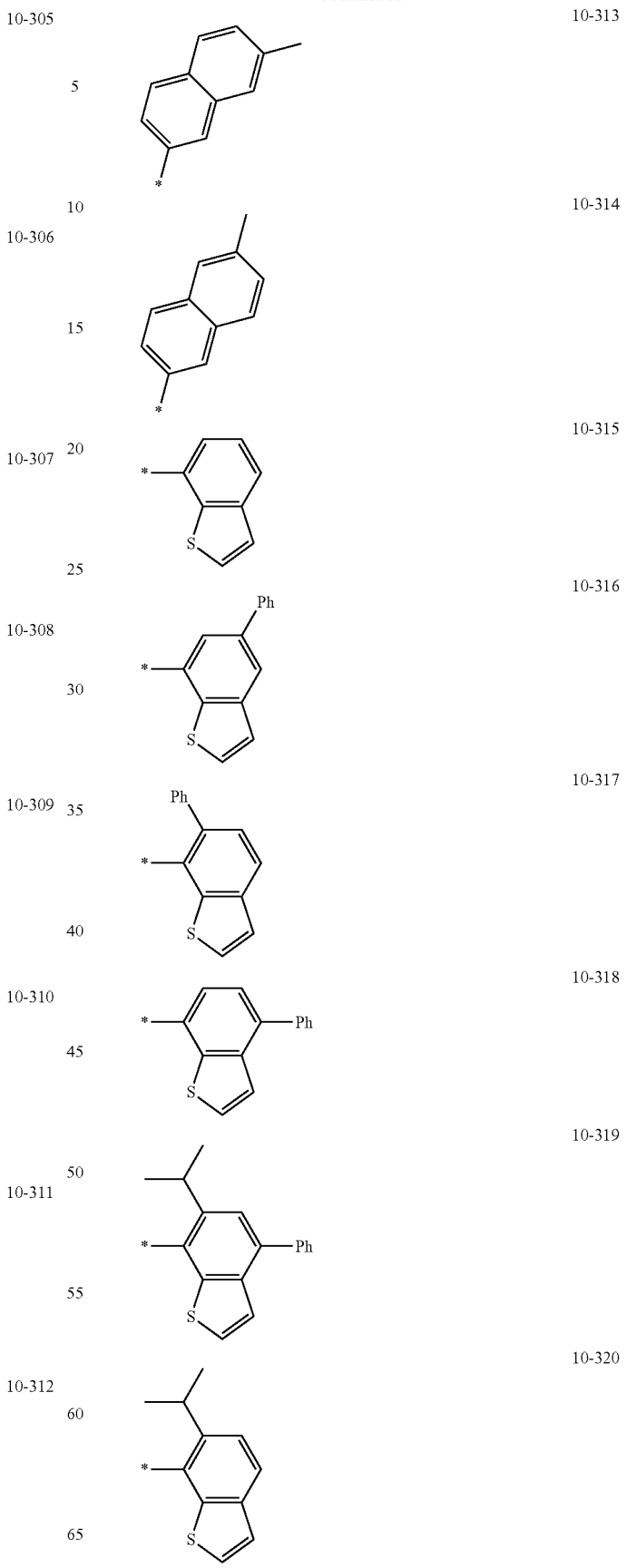

| | |
|---|---|
| 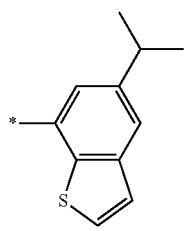 | 10-321 |
| 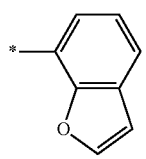 | 10-322 |
| 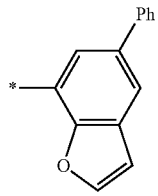 | 10-323 |
| 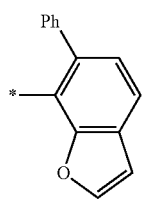 | 10-324 |
| 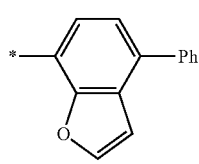 | 10-325 |
| 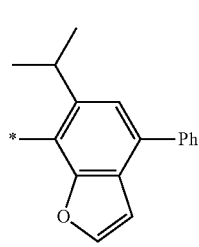 | 10-326 |
| 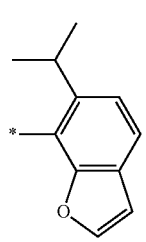 | 10-327 |
| | |
|---|---|
| 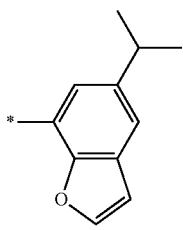 | 10-328 |
| 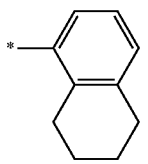 | 10-329 |
| 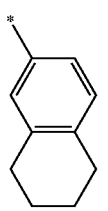 | 10-330 |
| 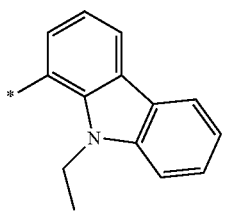 | 10-331 |
| 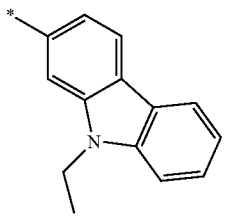 | 10-332 |
| 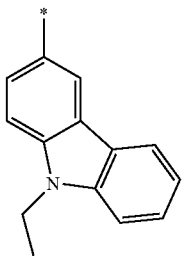 | 10-333 |
| 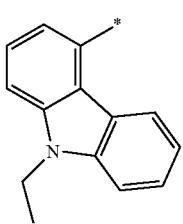 | 10-334 |

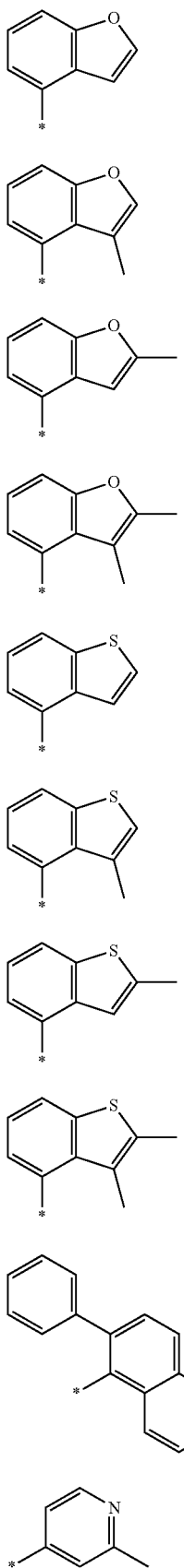

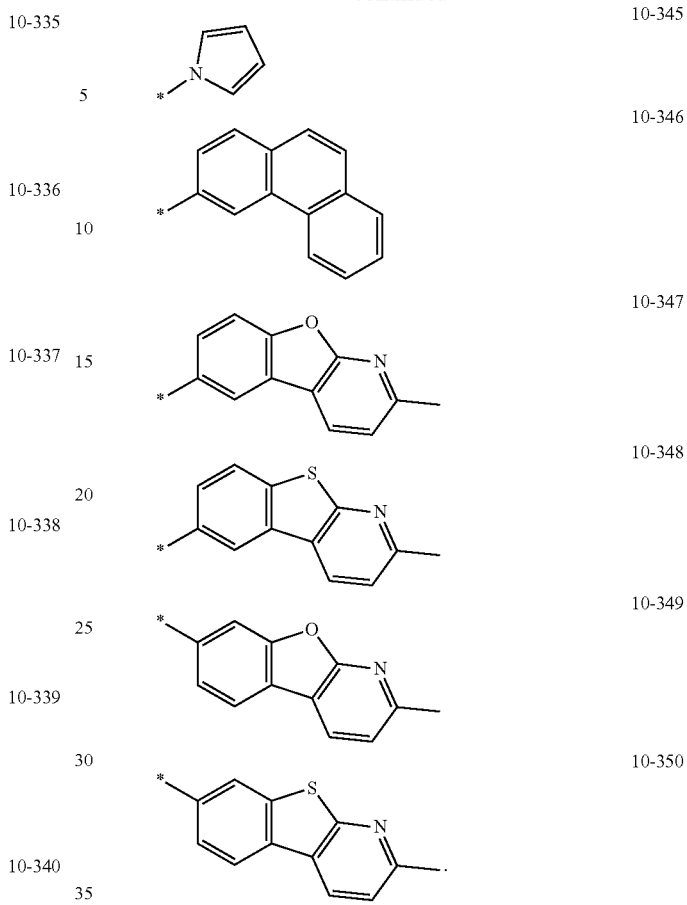

* in Formulae 9-1 to 9-39, 9-201 to 9-237, 10-1 to 10-129, and 10-201 to 10-350 indicates a binding site to a neighboring atom, "Ph" is a phenyl group, "TMS" is a trimethylsilyl group, and "TMG" is a trimethylgermyl group.

According to another embodiment, $Q_{51}$ to $Q_{53}$ may each independently be —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-1 to 9-39 in which at least one hydrogen is substituted with —F, a group represented by one of Formulae 10-12 to 10-129, a group represented by one of Formulae 10-12 to 10-129 in which at least one hydrogen is substituted with deuterium, a group represented by one of Formulae 10-12 to 10-129 in which at least one hydrogen is substituted with —F.

According to anther embodiment, at least one of $Q_{51}$ to $Q_{53}$ (e.g., one of $Q_{51}$ to $Q_{53}$) may be a group represented by one of Formulae 10-12 to 10-129, a group represented by one of Formulae 10-12 to 10-129 in which at least one hydrogen is substituted with deuterium, or a group represented by one of Formulae 10-12 to 10-129 in which at least one hydrogen is substituted with —F.

The "group represented by one of Formulae 9-1 to 9-39 in which at least one hydrogen is substituted with deuterium" and the "group represented by one of Formulae 9-201 to 9-237 in which at least one hydrogen is substituted with deuterium" may be, for example, a group represented by one of Formulae 9-501 to 9-514 or 9-601 to 9-636:

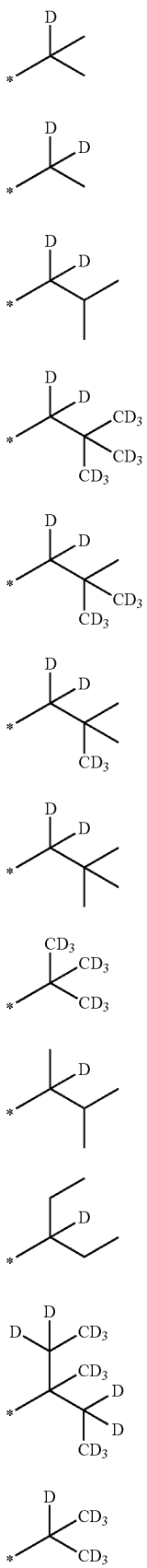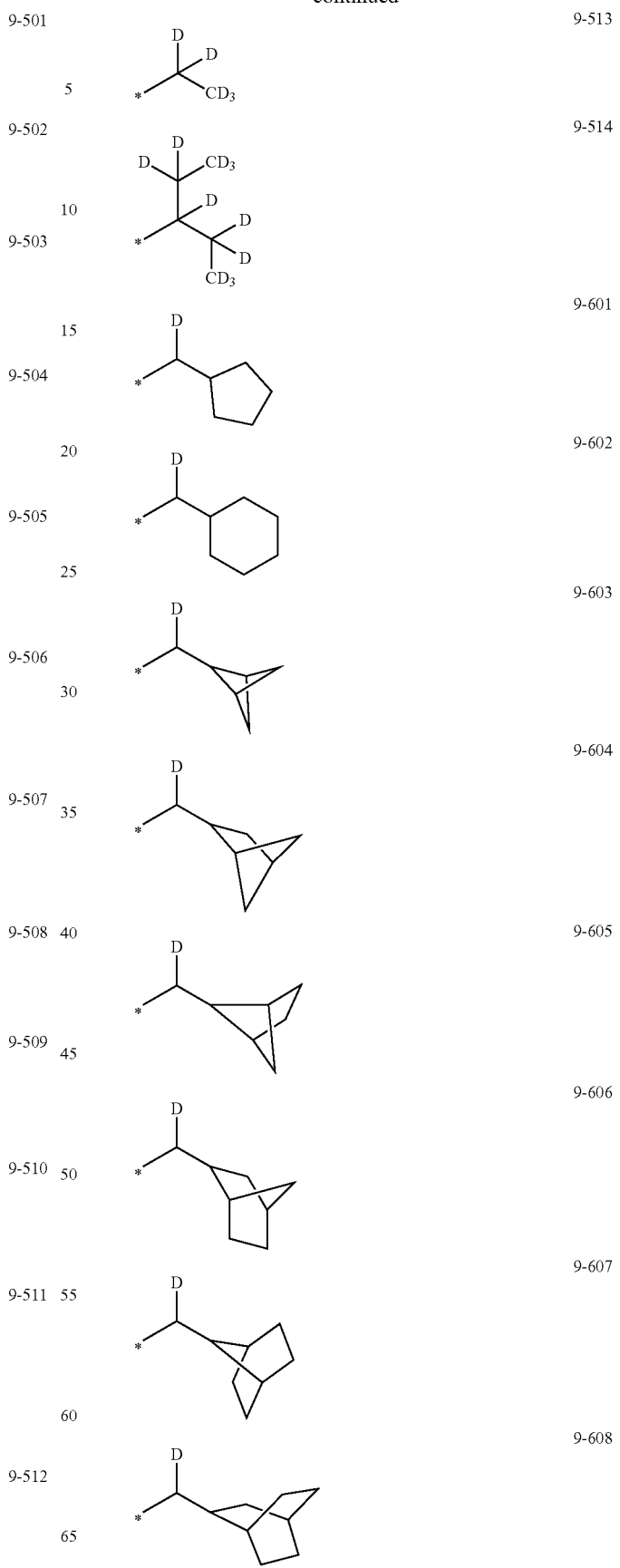

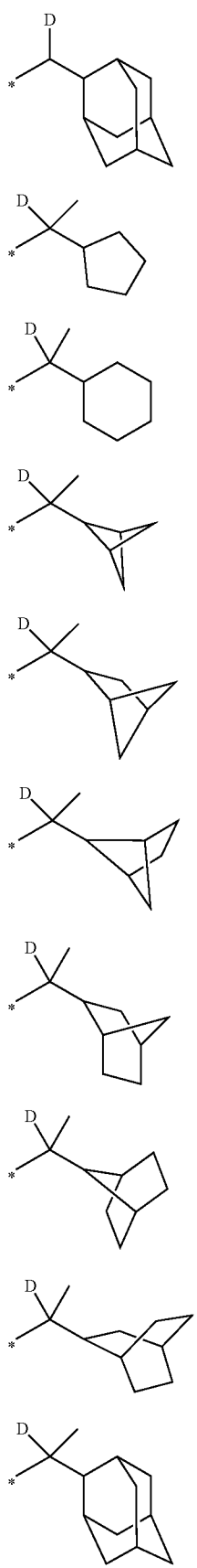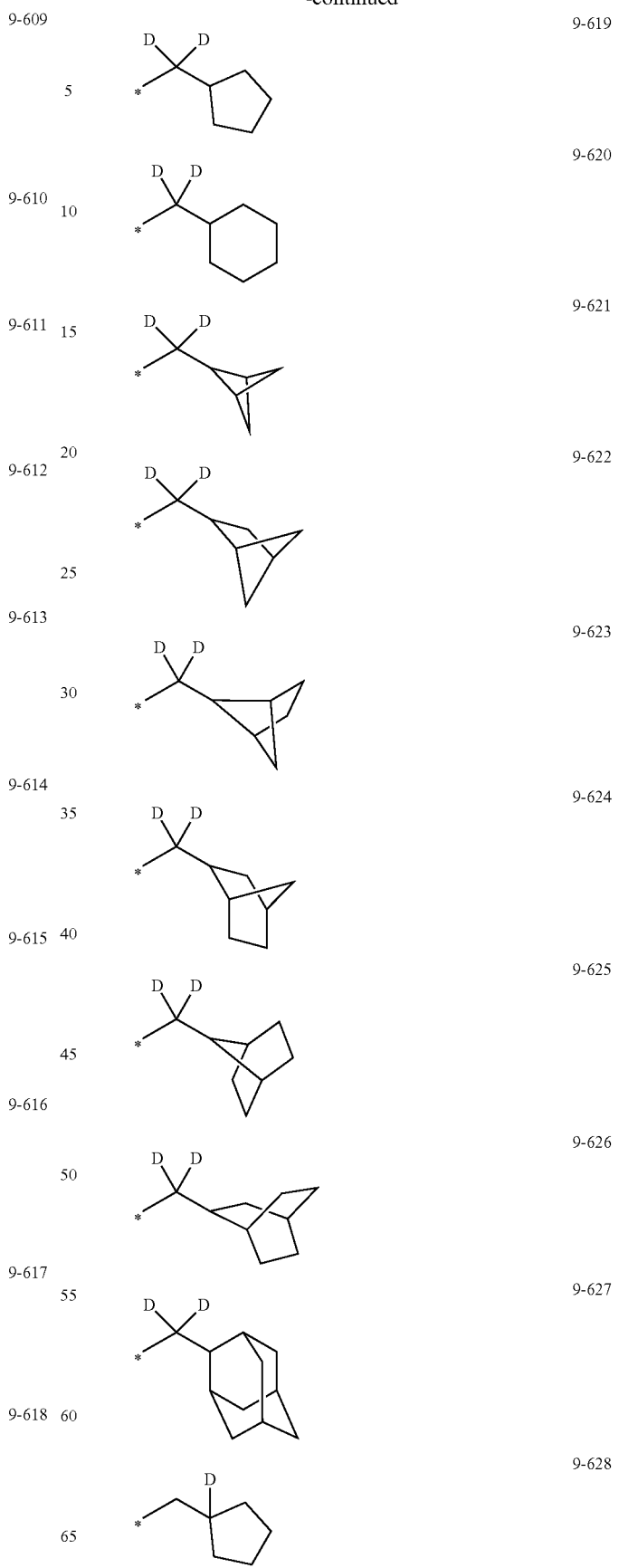

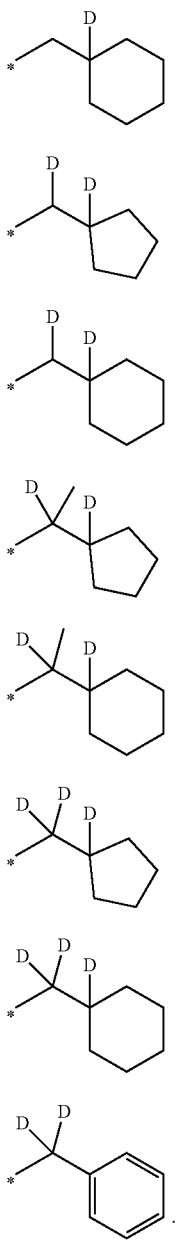

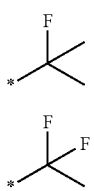

The "group represented by one of Formulae 9-1 to 9-39 in which at least one hydrogen is substituted with —F" and the "group represented by one of Formulae 9-201 to 9-236 in which at least one hydrogen is substituted with —F" may be, for example, a group represented by one of Formulae 9-701 to 9-710:

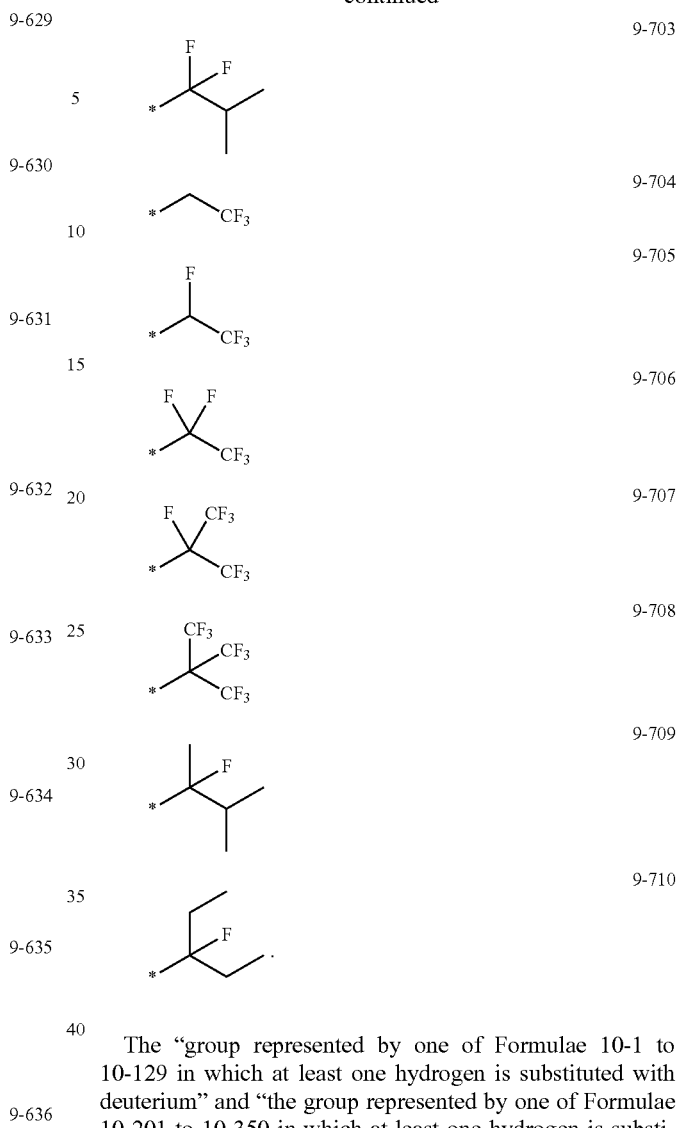

The "group represented by one of Formulae 10-1 to 10-129 in which at least one hydrogen is substituted with deuterium" and "the group represented by one of Formulae 10-201 to 10-350 in which at least one hydrogen is substituted with deuterium" may each be, for example, a group represented by one of Formulae 10-501 to 10-553:

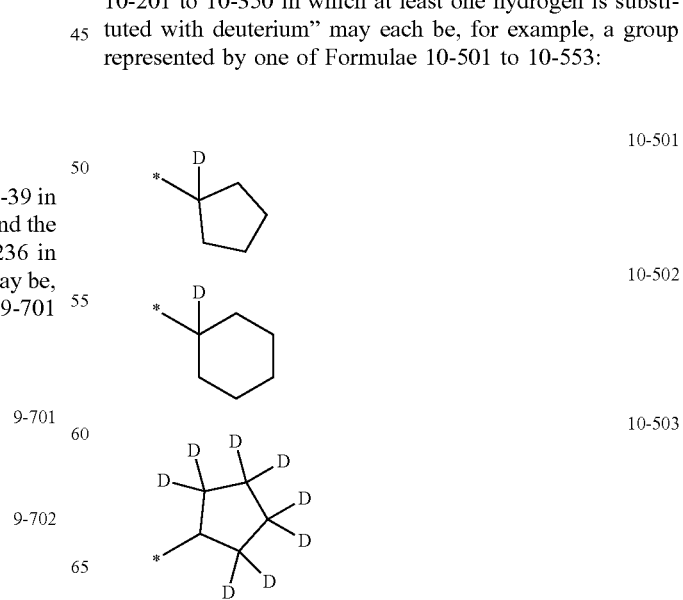

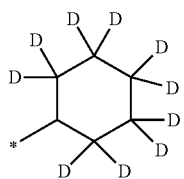
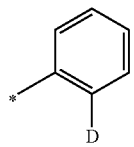
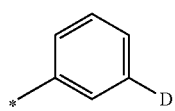
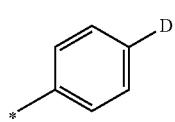
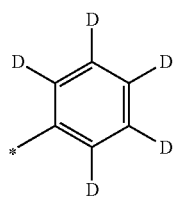
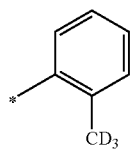
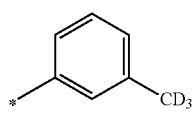
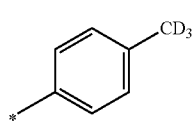
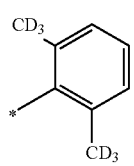
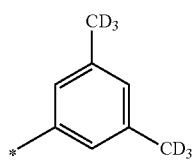
10-504
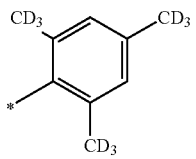
10-505
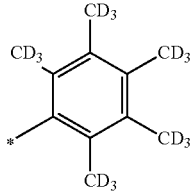
10-506
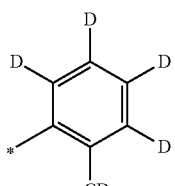
10-507
10-508
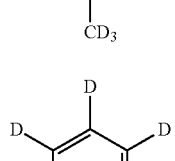
10-509
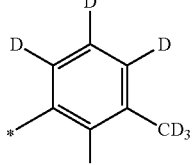
10-510
10-511
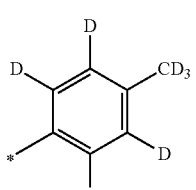
10-512
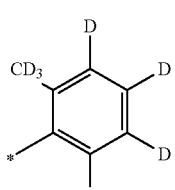
10-513
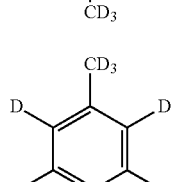
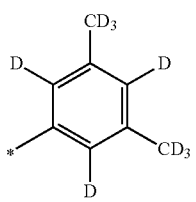
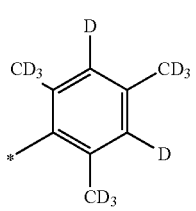
10-514
10-515
10-516
10-517
10-518
10-519
10-520
10-521

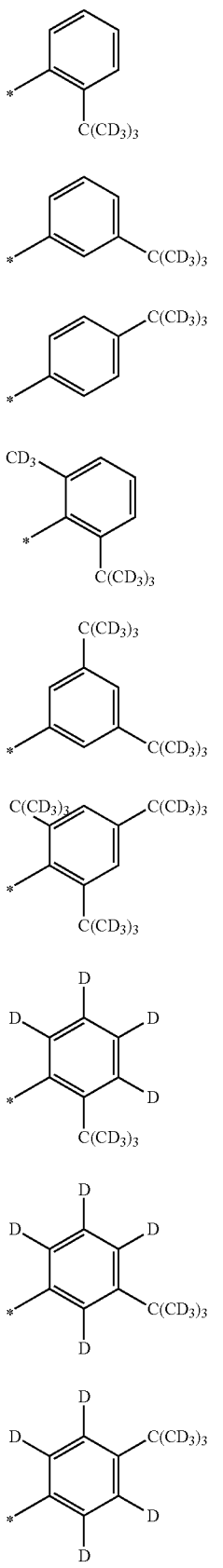
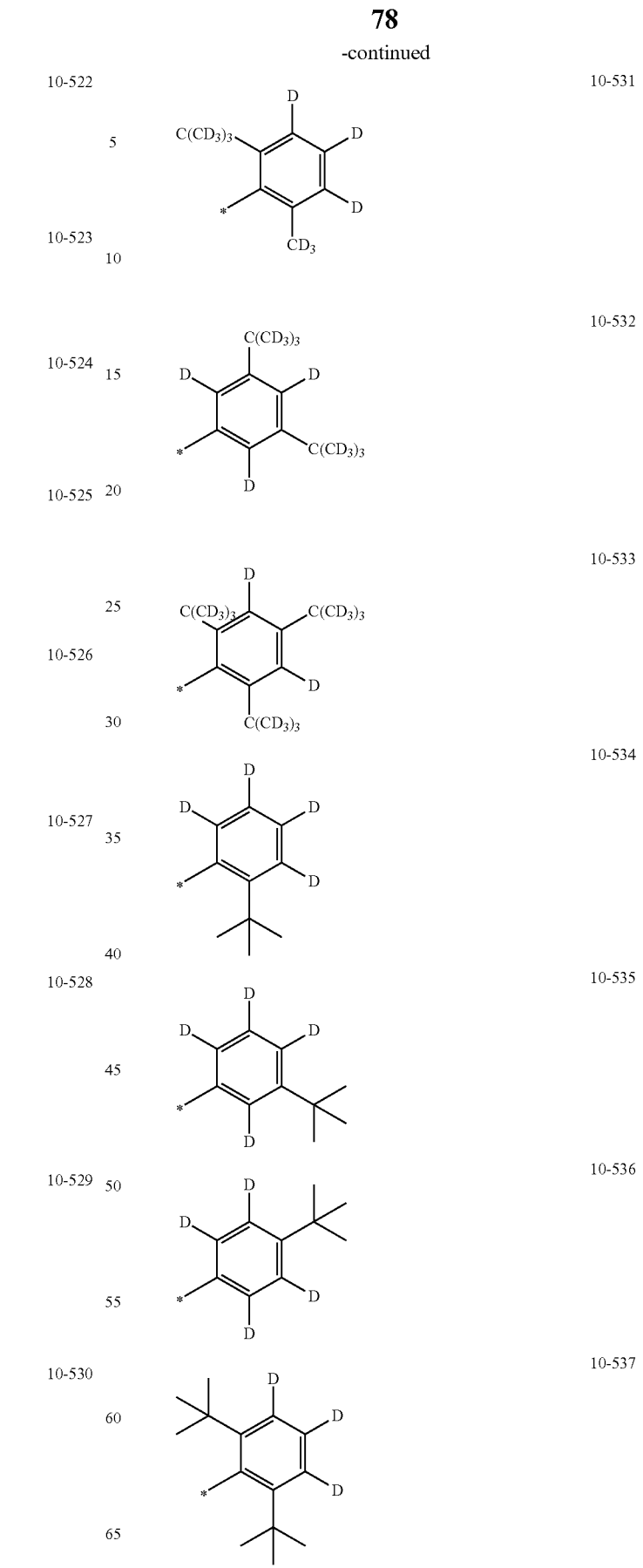

10-538 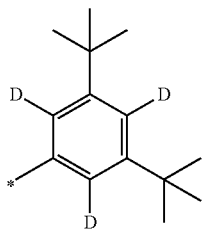
10-540 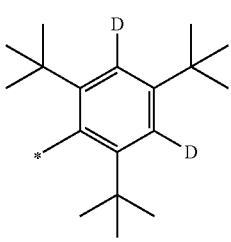
10-541 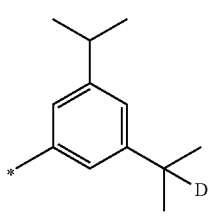
10-542 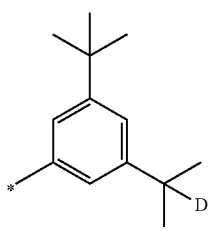
10-543 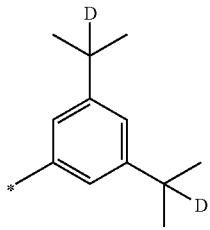
10-544 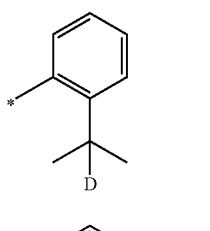
10-545 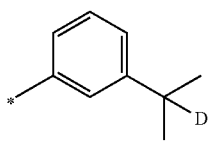
10-546 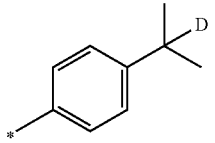
10-547 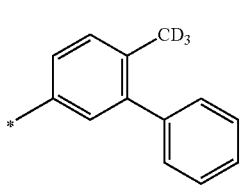
10-548 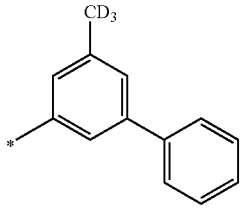
10-549 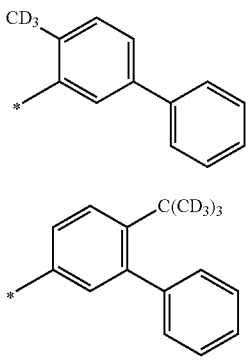
10-550 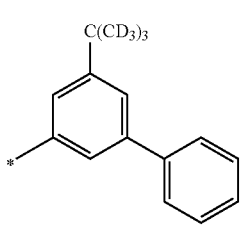
10-551 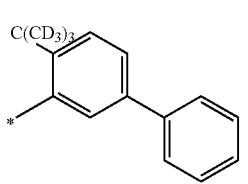
10-552 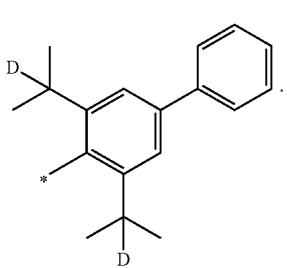
10-553 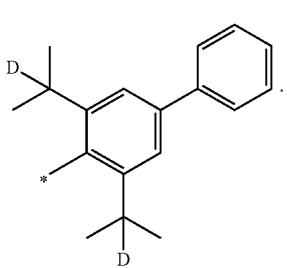
The "group represented by one of Formulae 10-1 to 10-129 in which at least one hydrogen is substituted with —F" and the "group represented by one of Formulae 10-201 to 10-350 in which at least one hydrogen is substituted with —F" may each be, for example, a group represented by one of Formulae 10-601 to 10-617:

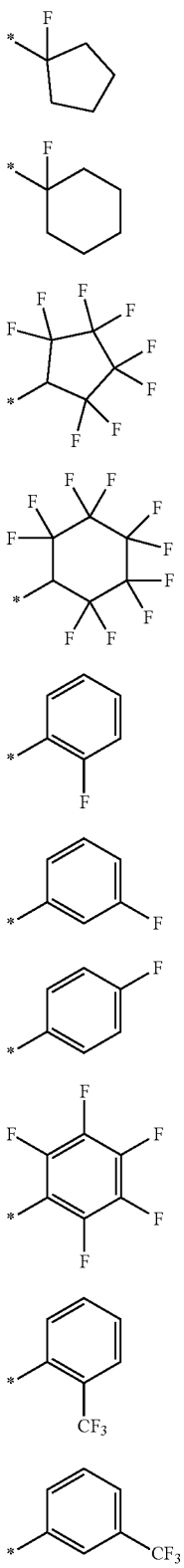

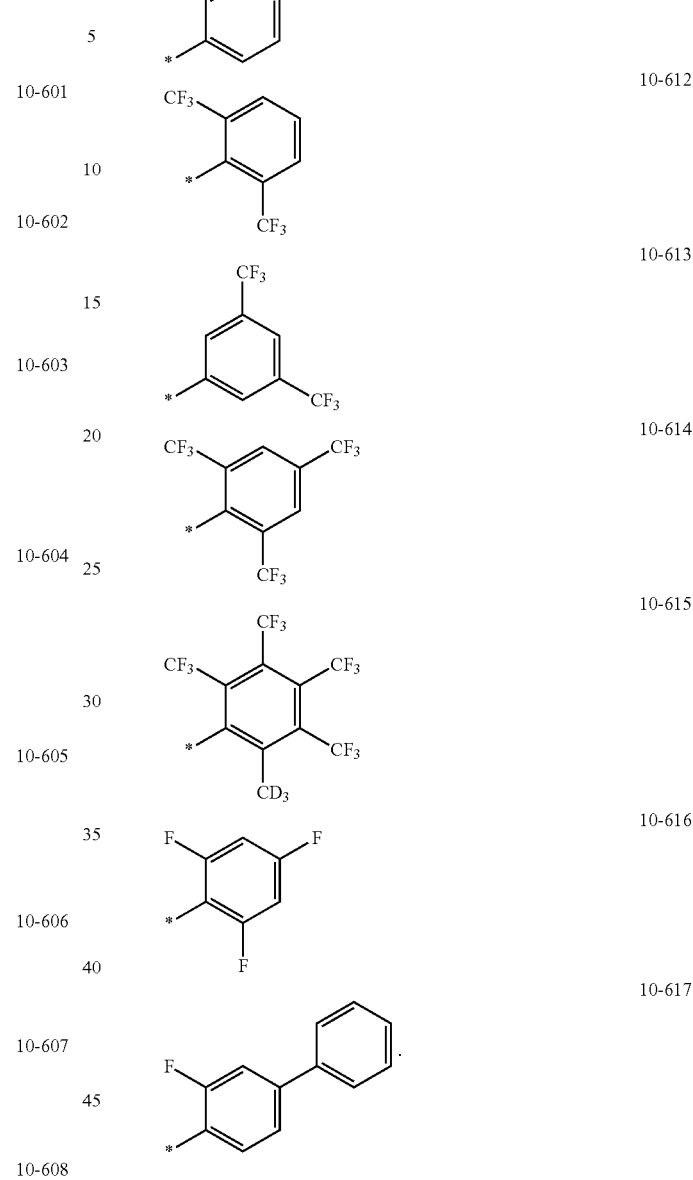

a1 to a4 in Formula 1 each indicate the numbers of $R_1$ to $R_4$ groups, respectively, and may each independently be an integer from 0 to 20 (for example, 0, 1, 2, or 3). When a1 is 2 or greater, two or more of $R_{1(s)}$ may be identical to or different from each other, when a2 is 2 or greater, two or more of $R_{2(s)}$ may be identical to or different from each other, when a3 is 2 or greater, two or more of $R_{3(s)}$ may be identical to or different from each other, and when a4 is 2 or greater, two or more of $R_{4(s)}$ may be identical to or different from each other.

According to one or more embodiments, in Formula 1,
i) a1, a2, a3, and a4 may be 0;
ii) a1 may be 1, and a2, a3, and a4 may be 0;
iii) a2 may be 1, and a1, a3, and a4 may be 0;
iv) a3 may be 1, and a1, a2, and a4 may be 0;
v) a4 may be 1, and a1, a2, and a3 may be 0; or
vi) a1 and a4 may be 1, and a2 and a3 may be 0.

In Formula 2, $L_1$ may be a single bond, a $C_5$-$C_{30}$ carbocyclic group unsubstituted or substituted with $R_{10a}$, or a $C_1$-$C_{30}$ heterocyclic group unsubstituted or substituted with $R_{10a}$.

For example, in Formula 2, $L_1$ may be:
a single bond; or
a cyclopentene group, a cyclohexane group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluoren-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, a 5,6,7,8-tetrahydroquinoline group, an adamantane group, a norbornane group, or a norbornene group, each substituted or unsubstituted with at least one $R_{10a}$.

According to one or more embodiments, $L_1$ may be:
a single bond; or
a phenylene group unsubstituted or substituted with at least one $R_{10a}$.

c1 in Formula 2 indicates the number of $L_1$ groups, and may be an integer from 1 to 10, for example, 1, 2, or 3. When c1 is 2 or greater, two or more $L_1$ may be identical to or different from each other.

c2 in Formula 2 may indicate the number of group(s) represented by *—$C(Q_{51})(Q_{52})(Q_{53})$ (where, * indicates a binding site to a neighboring $L_1$) and may be an integer from 1 to 20, for example, 1, 2, or 3. When c2 is 2 or greater, two or more groups represented by *—$C(Q_{51})(Q_{52})(Q_{53})$ may be identical to or different from each other.

In Formula 1, 1) two or more of $R_1$ may optionally be bonded together to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, 2) two or more of $R_2$ may optionally be bonded together to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, 3) two or more of $R_3$ may optionally be bonded together to form a $C_5$-$C_{30}$ carbocyclic group unsubstituted or substituted with at least one $R_{10a}$, or a $C_1$-$C_{30}$ heterocyclic group unsubstituted or substituted with at least one $R_{1a}$, 4) two or more of $R_4$ may optionally be bonded together to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, and 5) two or more of $R_1$ to $R_4$, $R_{5a}$, $R_{5b}$, $R_{6a}$, $R_{6b}$, $R_{7a}$, $R_{7b}$, $R_{8a}$, and $R_{8b}$ may optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

$R_{10a}$ is as described herein in connection with $R_1$.

According to one or more embodiments, n3 in Formula 1 may not be 0, and ring CY1 may be represented by one of Formulae CY1(1) to CY1(56) or CY1(101) to CY1(108):

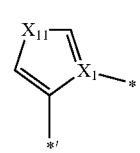
CY1(1)

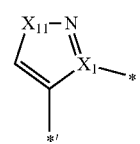
CY1(2)

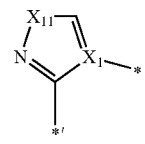
CY1(3)

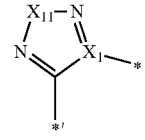
CY1(4)

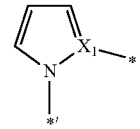
CY1(5)

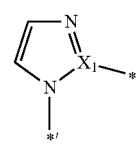
CY1(6)

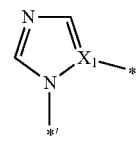
CY1(7)

-continued

CY1(8)
CY1(9)
CY1(10)
CY1(11)
CY1(12)
CY1(13)
CY1(14)
CY1(15)
CY1(16)
CY1(17)

-continued

CY1(18)
CY1(19)
CY1(20)
CY1(21)
CY1(22)
CY1(23)
CY1(24)

-continued
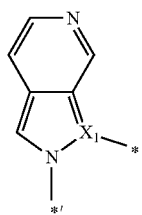 CY1(25)
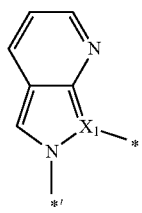 CY1(26)
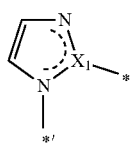 CY1(27)
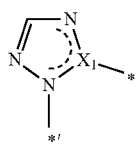 CY1(28)
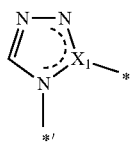 CY1(29)
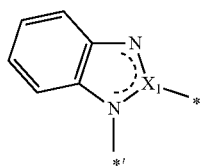 CY1(30)
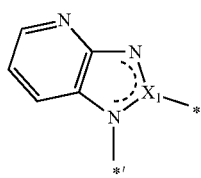 CY1(31)
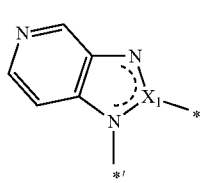 CY1(32)
-continued
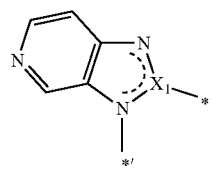 CY1(33)
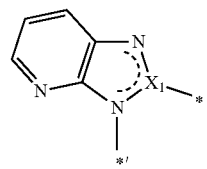 CY1(34)
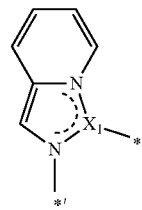 CY1(35)
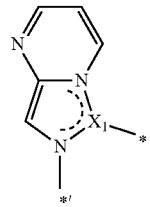 CY1(36)
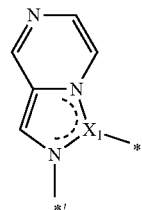 CY1(37)
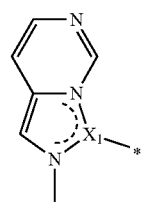 CY1(38)
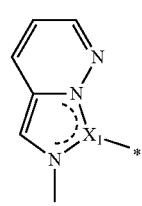 CY1(39)

-continued
CY1(40)
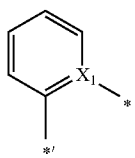
CY1(41)
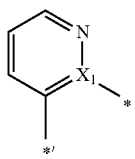
CY1(42)
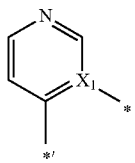
CY1(43)
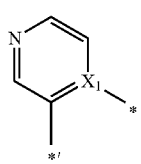
CY1(44)
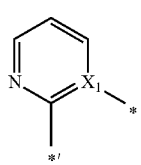
CY1(45)
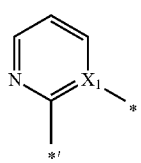
CY1(46)
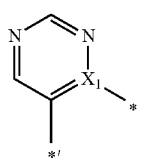
CY1(47)
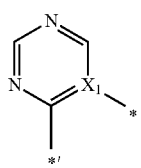
CY1(48)
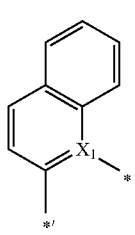
-continued
CY1(49)
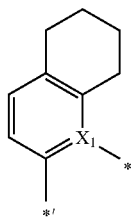
CY1(50)
CY1(51)
CY1(52)
CY1(53)
CY1(54)
CY1(55)

CY1(56) 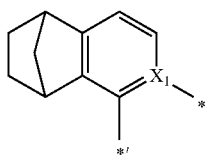

CY1(101) 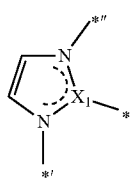

CY1(102) 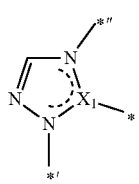

CY1(103) 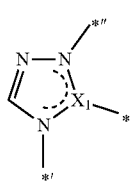

CY1(104) 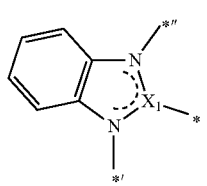

CY1(105) 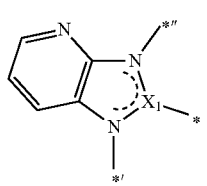

CY1(106) 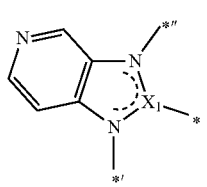

CY1(107) 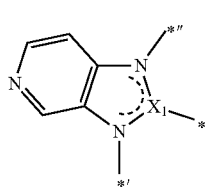

CY1(108) 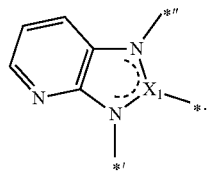

In Formulae CY1(1) to CY1(56) and CY1(101) to CY1(108), $X_1$ may be C or N, and $X_1$ in Formulae CY1(27) to CY1(39) and CY1(101) to CY1(108) may be C, $X_{11}$ may be O, S, $N(R_{18})$, $C(R_{18})(R_{19})$, or $Si(R_{18})(R_{19})$, and $R_{18}$ and $R_{19}$ may each be understood by referring to the description of $R_1$ provided herein, \* may indicate a binding site to M in Formula 1, \*' may indicate a binding site to $T_3$ in Formula 1, and \*" may indicate a binding site to $T_4$ in Formula 1.

According to another embodiment, n3 in Formula 1 may not be 0, n4 may be 0, and a group represented by

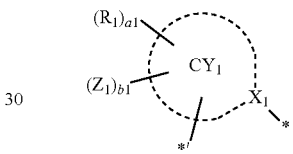

may be a group represented by one of Formulae CY1-1 to CY1-31 or CY1-1Z to CY1-21Z:

CY1-1 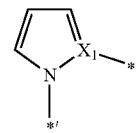

CY1-2 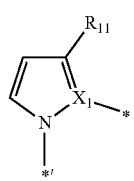

CY1-3 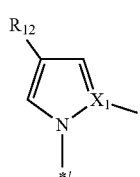

CY1-4 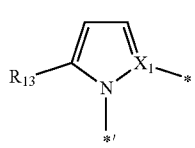

CY1-5
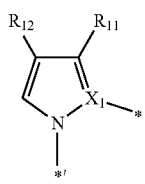
CY1-6
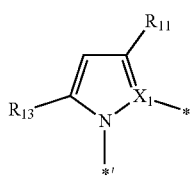
CY1-7
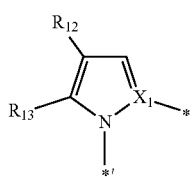
CY1-8
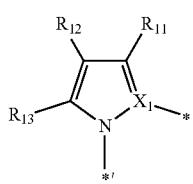
CY1-9
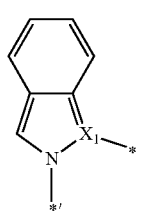
CY1-10
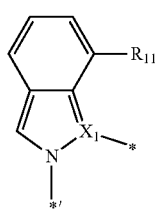
CY1-11
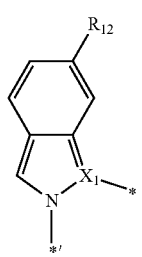
CY1-12
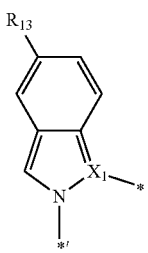
CY1-13
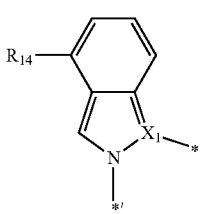
CY1-14
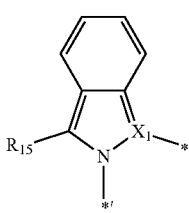
CY1-15
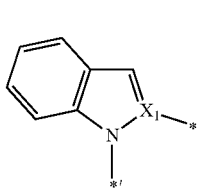
CY1-16
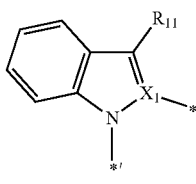
CY1-17
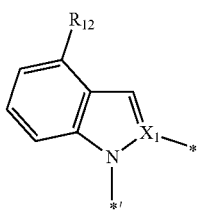
CY1-18
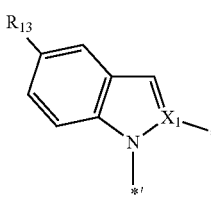

-continued
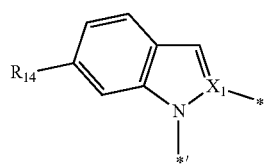
CY1-19
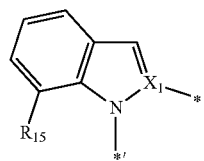
CY1-20
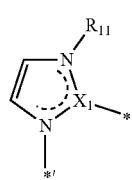
CY1-21
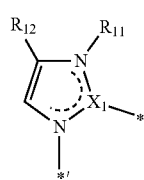
CY1-22
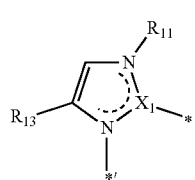
CY1-23
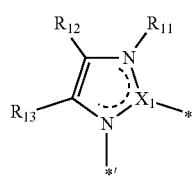
CY1-24
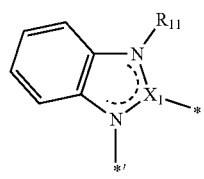
CY1-25
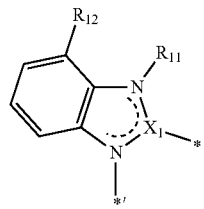
CY1-26
-continued
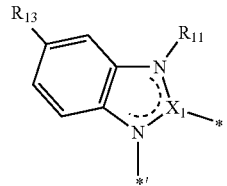
CY1-27
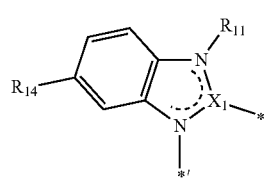
CY1-28
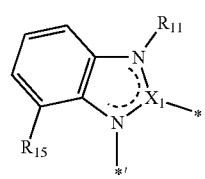
CY1-29
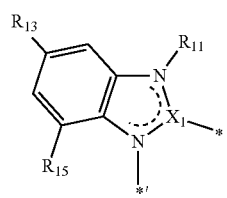
CY1-30
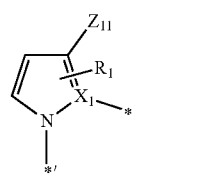
CY1-31
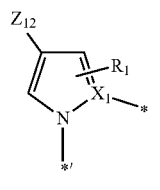
CY1-1Z
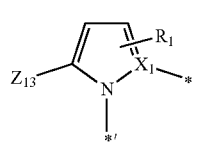
CY1-2Z
CY1-3Z

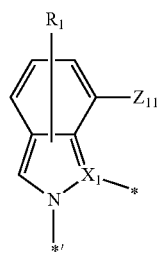
CY1-4Z
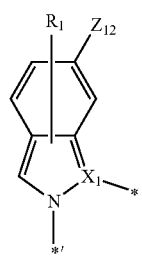
CY1-5Z
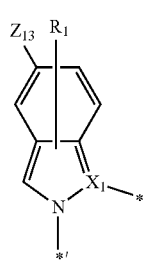
CY1-6Z
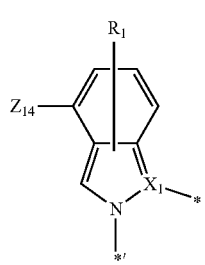
CY1-7Z
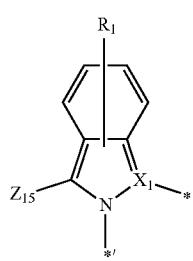
CY1-8Z
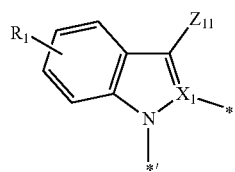
CY1-9Z
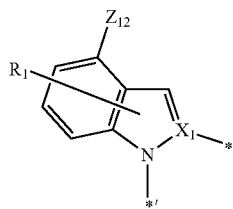
CY1-10Z
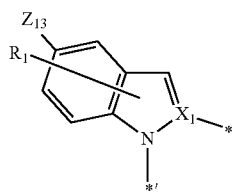
CY1-11Z
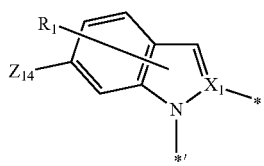
CY1-12Z
CY1-13Z
CY1-14Z
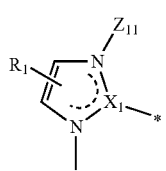
CY1-15Z
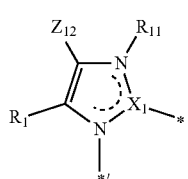
CY1-16Z
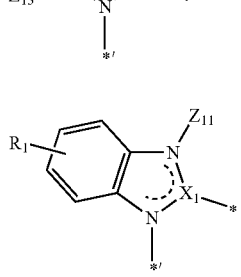
CY1-17Z -continued

CY1-18Z

CY1-19Z

CY1-20Z

CY1-21Z

In Formulae CY1-1 to CY1-31 and CY1-1Z to CY1-21Z, $X_1$ may be C or N, or $X_1$ in Formulae CY1-21 to CY1-31 and CY1-14Z to CY1-21Z may be C, $R_1$ and $R_{11}$ to $R_{15}$ may each be understood by referring to the description of $R_1$ provided herein, provided that each of $R_{11}$ to $R_{15}$ may not be hydrogen, $Z_{11}$ to $Z_{15}$ may each be understood by referring to the descriptions of $Z_1$ provided herein,

* may indicate a binding site to M in Formula 1, and

*' may indicate a binding site to $T_3$ in Formula 1.

According to another embodiment, in Formula 1, n3 may not be 0, n4 may be 0, a group represented by may be represented by one of Formula CY1-1Z, Formula CY1-9Z, Formula CY1-14Z, or Formula CY1-17Z, and $Z_{11}$ in Formulae CY1-1Z, CY1-9Z, CY1-14Z, and CY1-17Z may be a group represented by Formula 2 in which $L_1$ is not a single bond.

According to one or more embodiments, in Formula 1, n1 may not be 0, n3 may not be 0, and ring CY2 may be represented by one of Formulae CY2(1) to CY2(15):

CY2(1)

CY2(2)

CY2(3)

CY2(4)

CY2(5)

CY2(6)

CY2(7)

CY2(8)

CY2(9)

-continued

CY2(10)
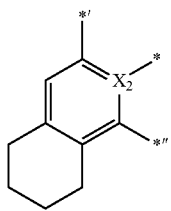

CY2(11)
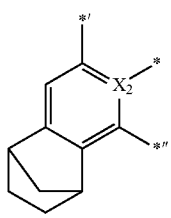

CY2(12)
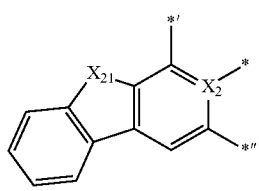

CY2(13)
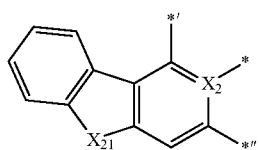

CY2(14)
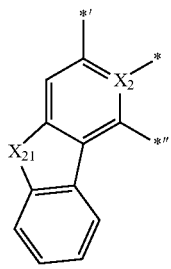

CY2(15)
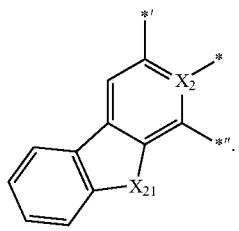

In Formulae CY2(1) to CY2(15),
$X_2$ may be C or N,
$X_{21}$ may be O, S, $N(R_{28})$, $C(R_{28})(R_{29})$, or $Si(R_{28})(R_{29})$, and $R_{28}$ and $R_{29}$ may each be understood by referring to the description of $R_2$ provided herein,
*' may indicate a binding site to $T_3$ in Formula 1, and
* may indicate a binding site to M in Formula 1, and
*" may indicate a binding site to $T_1$ in Formula 1.

According to another embodiment, in Formula 1, n1 may not be 0, n3 may not be 0, a group represented by

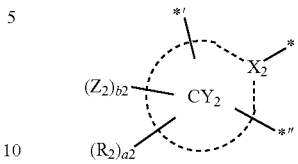

may be a group represented by one of Formulae CY2-1 to CY2-8 or CY2-1Z to CY2-5Z:

CY2-1, CY2-2, CY2-3, CY2-4, CY2-5, CY2-6, CY2-7

-continued

CY2-8
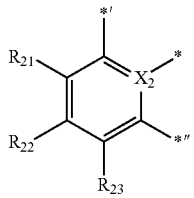

CY2-1Z
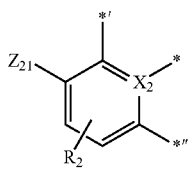

CY2-2Z
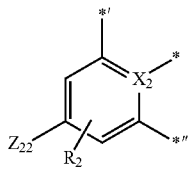

CY2-3Z
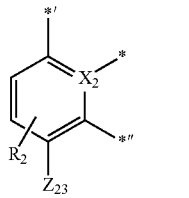

CY2-4Z
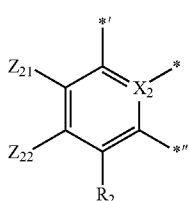

CY2-5Z
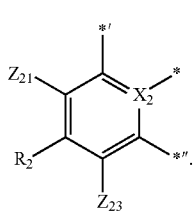

In Formulae CY2-1 to CY2-8 and CY2-1Z to CY2-5Z, $X_1$ may be C or N, $R_2$ and $R_{21}$ to $R_{23}$ may each be understood by referring to the description of $R_2$ provided herein, provided that each of $R_{21}$ to $R_{23}$ may not be hydrogen, $Z_{21}$ to $Z_{23}$ may each be understood by referring to the descriptions of $Z_2$ provided herein,

*' may indicate a binding site to $T_3$ in Formula 1,

* may indicate a binding site to M in Formula 1, and

*'' may indicate a binding site to $T_1$ in Formula 1.

According to another embodiment, in Formula 1, n1 may not be 0, n2 may not be 0, and ring CY3 may be a group represented by Formula CY3-A or CY3-B:

CY3-A
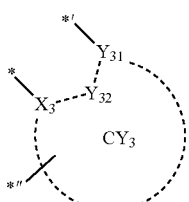

CY3-B
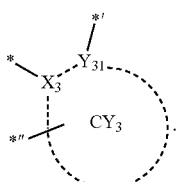

In Formulae CY3-A and CY3-B, $X_3$ and ring CY3 may respectively be understood by referring to the descriptions of $X_3$ and ring CY3 provided herein, $Y_{31}$ and $Y_{32}$ may each independently be O, S, N, C, or Si, In Formula CY3-A, a bond between $X_3$ and $Y_{32}$ and a bond between $Y_{32}$ and $Y_{31}$ may each be a chemical bond, and in Formula CY3-B, a bond between $X_3$ and $Y_{31}$ may be a chemical bond,

*'' may indicate a binding site to $T_1$ in Formula 1,

* may indicate a binding site to M in Formula 1, and

*' may indicate a binding site to $T_2$ in Formula 1.

For example, in Formula 1, n1 may not be 0, n2 may not be 0, and ring CY3 may be a group represented by Formula CY3-A.

According to another embodiment, in Formula 1, n1 may not be 0, and ring CY3 may be a group represented by one of Formulae CY3(1) to CY3(12) or CY3(101) to CY3(122):

CY3(1)
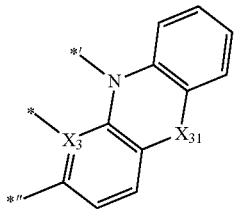

CY3(2)
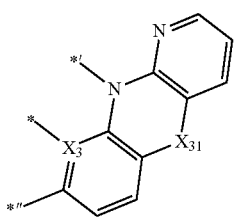

CY3(3)
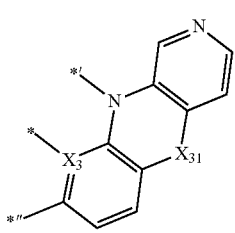

-continued
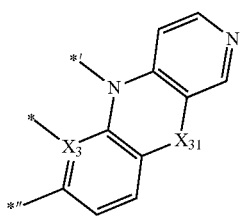
CY3(4)
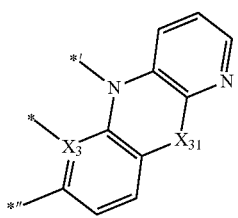
CY3(5)
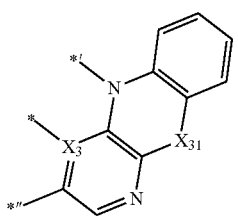
CY3(6)
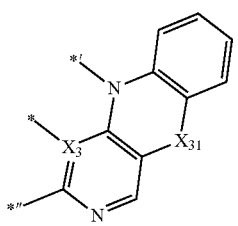
CY3(7)
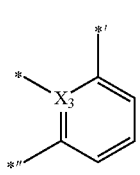
CY3(8)
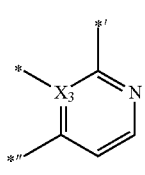
CY3(9)
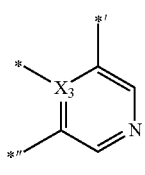
CY3(10)
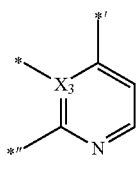
CY3(11)
-continued
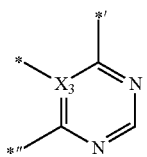
CY3(12)
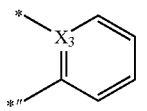
CY3(101)
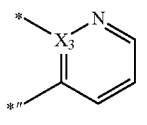
CY3(102)
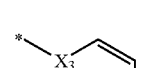
CY3(103)
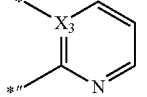
CY3(104)
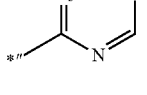
CY3(105)
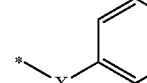
CY3(106)
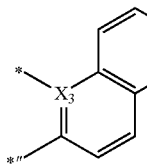
CY3(107)
CY3(108)
CY3(109)

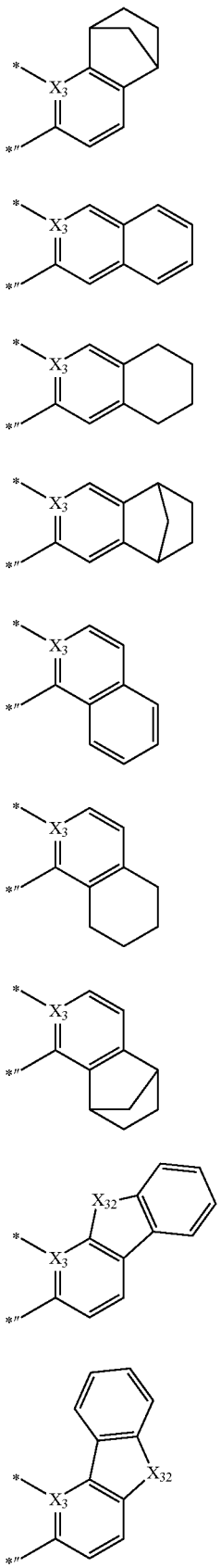

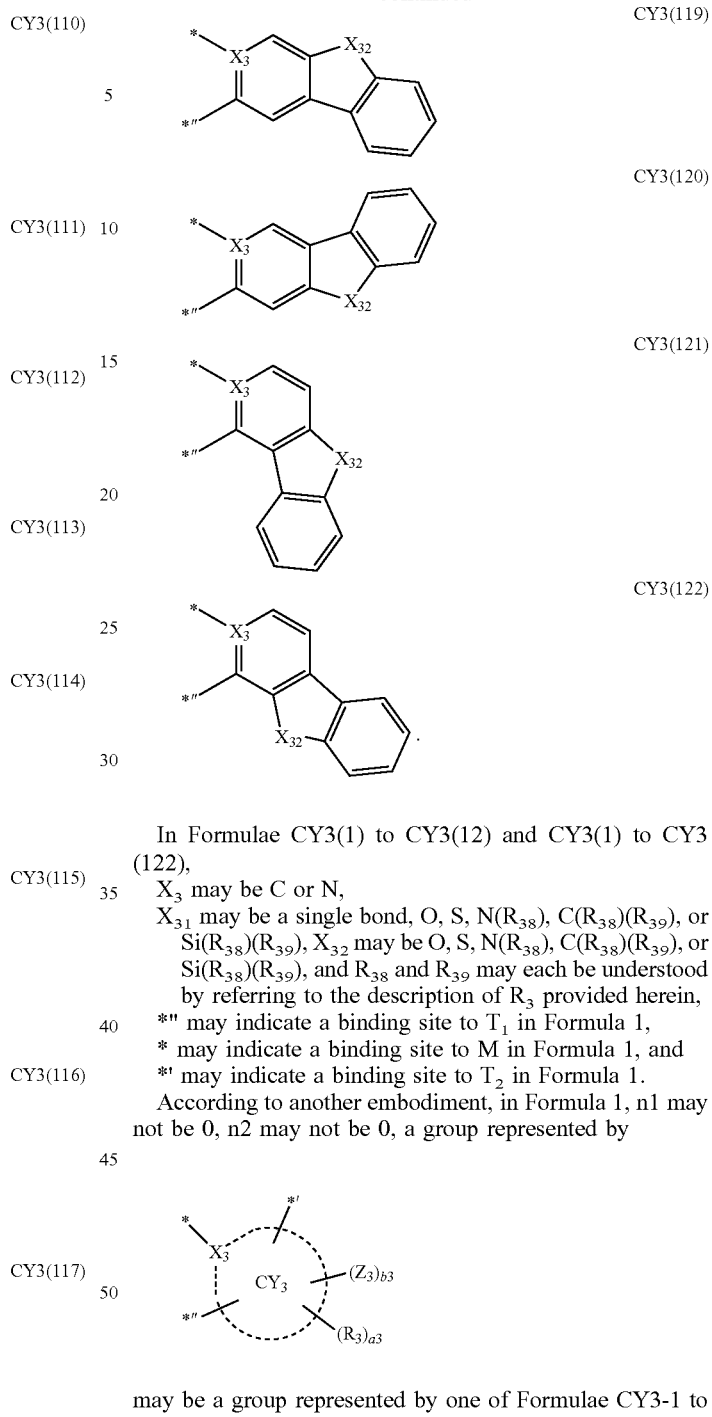

In Formulae CY3(1) to CY3(12) and CY3(1) to CY3(122), $X_3$ may be C or N, $X_{31}$ may be a single bond, O, S, $N(R_{38})$, $C(R_{38})(R_{39})$, or $Si(R_{38})(R_{39})$, $X_{32}$ may be O, S, $N(R_{38})$, $C(R_{38})(R_{39})$, or $Si(R_{38})(R_{39})$, and $R_{38}$ and $R_{39}$ may each be understood by referring to the description of $R_3$ provided herein,

*″ may indicate a binding site to $T_1$ in Formula 1,

* may indicate a binding site to M in Formula 1, and

*′ may indicate a binding site to $T_2$ in Formula 1.

According to another embodiment, in Formula 1, n1 may not be 0, n2 may not be 0, a group represented by

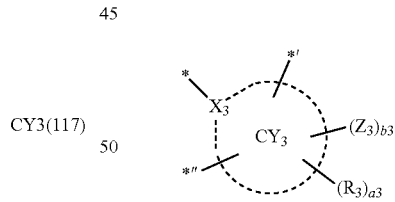

may be a group represented by one of Formulae CY3-1 to CY3-16 or CY3-1Z to CY3-7Z:

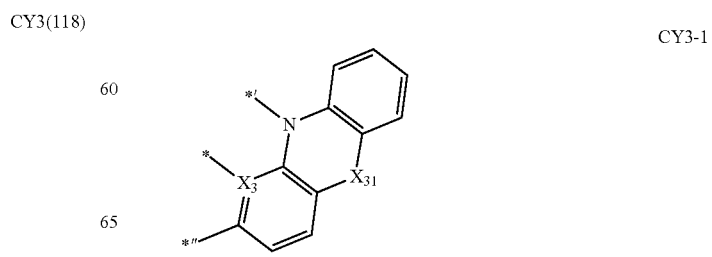

CY3-2
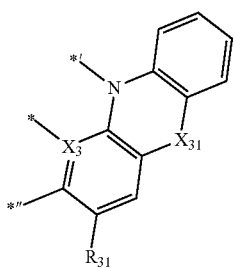
CY3-3
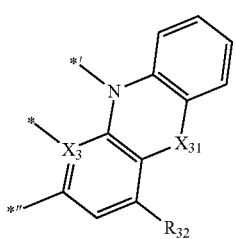
CY3-4
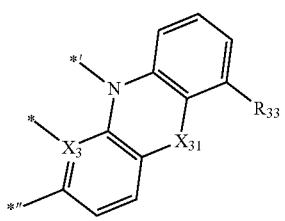
CY3-5
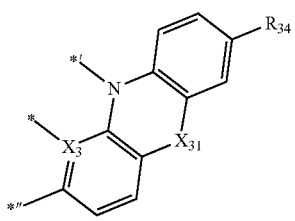
CY3-6
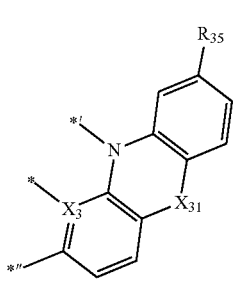
CY3-7
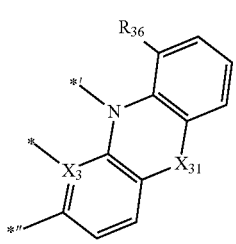
CY3-8
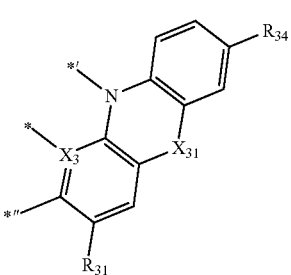
CY3-9
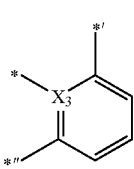
CY3-10
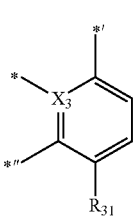
CY3-11
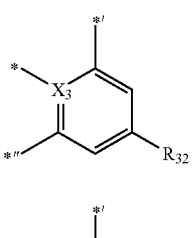
CY3-12
CY3-13
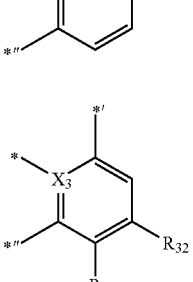
CY3-14
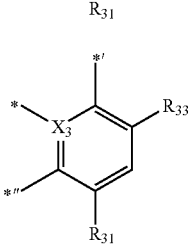
CY3-15

-continued

CY3-16

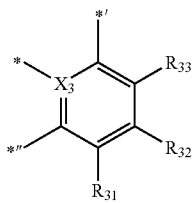

CY3-1Z

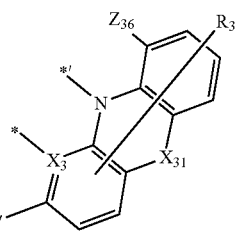

CY3-6Z

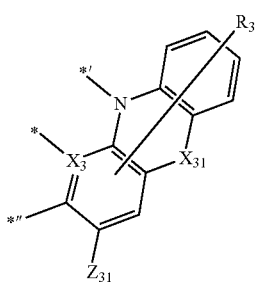

CY3-2Z

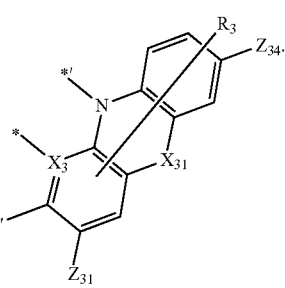

CY3-7Z

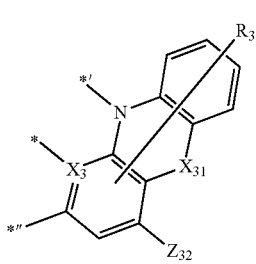

CY3-3Z

In Formulae CY3-1 to CY3-16 and CY3-1Z to CY3-7Z,
  $X_3$ may be C or N,
  $R_3$ and $R_{31}$ to $R_{36}$ may each be understood by referring to the description of $R_3$ provided herein, provide that each of $R_{31}$ to $R_{36}$ may not be hydrogen,
  $Z_{31}$ to $Z_{36}$ may each be understood by referring to the descriptions of $Z_3$ provided herein,
  *″ may indicate a binding site to $T_1$ in Formula 1,
  * may indicate a binding site to M in Formula 1, and
  *′ may indicate a binding site to $T_2$ in Formula 1.

According to another embodiment, in Formula 1, n2 may not be 0, n4 may be 0, and ring CY4 may be a group represented by Formula CY4-A or CY4-B:

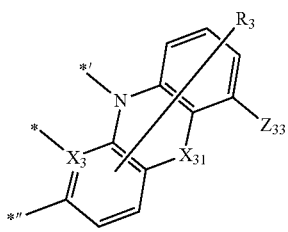

CY3-4Z

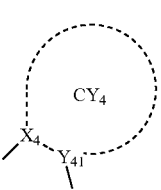

CY4-A

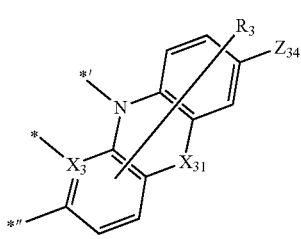

CY3-5Z

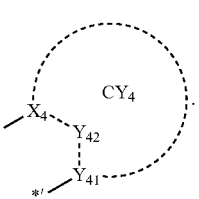

CY4-B

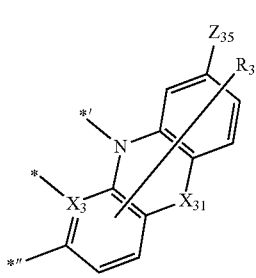

In Formulae CY4-A and CY4-B,
  $X_4$ and ring CY4 may respectively be as described herein,
  $Y_{41}$ and $Y_{42}$ may each independently be O, S, N, C or Si,
  in Formula CY4-A, a bond between $X_4$ and $Y_{41}$ may be a chemical bond, and in Formula CY4-B, a bond between $X_4$ and $Y_{42}$ and a bond between $Y_{42}$ and $Y_{41}$ may each be a chemical bond,
  * may indicate a binding site to M in Formula 1, and
  *′ may indicate a binding site to $T_2$ in Formula 1.

For example, in Formula 1, n2 may not be 0, n4 may be 0, and ring CY4 may be a group represented by Formula CY4-A.

According to another embodiment, in Formula 1, n2 may not be 0, and ring CY4 may be a group represented by one of Formulae CY4(1) to CY4(21) or CY4(101) to CY4(111):
CY4(1)
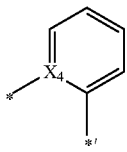
CY4(2)
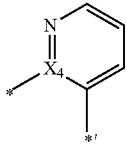
CY4(3)
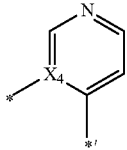
CY4(4)
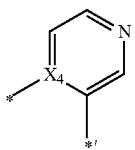
CY4(5)
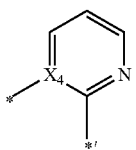
CY4(6)
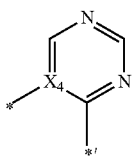
CY4(7)
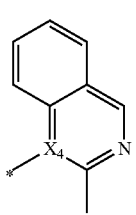
CY4(8)
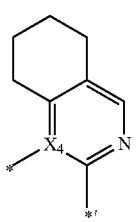
-continued
CY4(9)
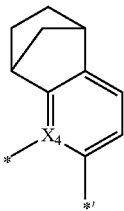
CY4(10)
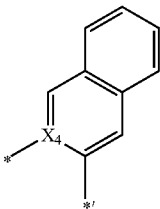
CY4(11)
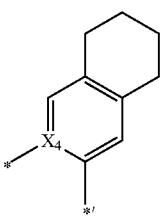
CY4(12)
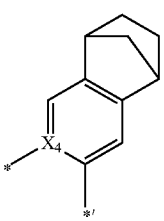
CY4(13)
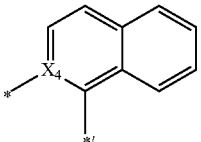
CY4(14)
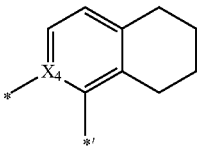
CY4(15)
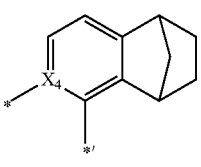

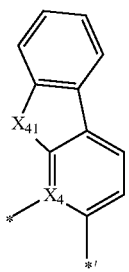 CY4(16)
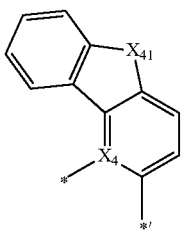 CY4(17)
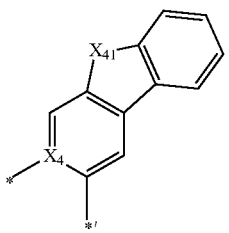 CY4(18)
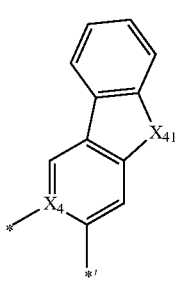 CY4(19)
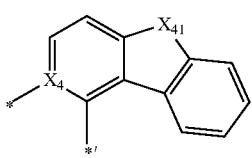 CY4(20)
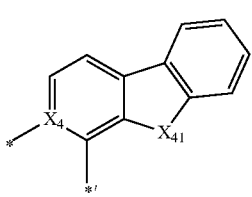 CY4(21)
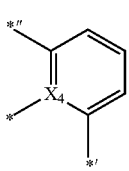 CY4(101)
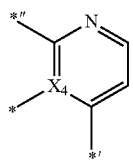 CY4(102)
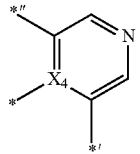 CY4(103)
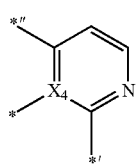 CY4(104)
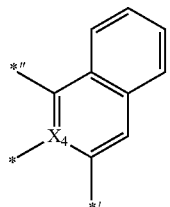 CY4(105)
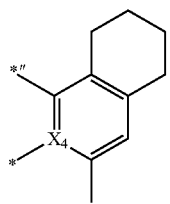 CY4(106)
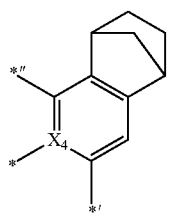 CY4(107)
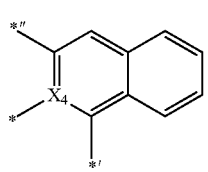 CY4(108)
CY4(109)

-continued

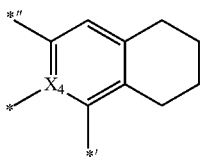
CY4(110)

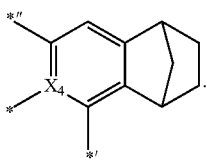
CY4(111)

In Formulae CY4(1) to CY4(21) and CY4(1) to CY4(111), $X_4$ may be C or N, $X_{41}$ may be O, S, N($R_{48}$), C($R_{48}$)($R_{49}$), or Si($R_{48}$)($R_{49}$), and $R_{48}$ and $R_{49}$ may each be understood by referring to the description of $R_4$ provided herein, \* may indicate a binding site to M in Formula 1, \*' may indicate a binding site to $T_2$ in Formula 1, and \*'' may indicate a binding site to $T_4$ in Formula 1.

According to another embodiment, in Formula 1, n2 may not be 0, n4 may be 0, and a group represented by

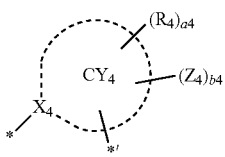

may be a group represented by one of Formulae CY4-1 to CY4-24 or CY4-1Z to CY4-6Z:

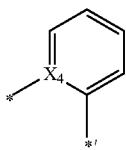
CY4-1

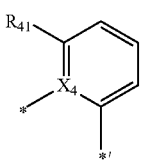
CY4-2

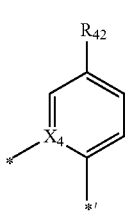
CY4-3

-continued

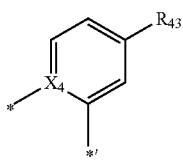
CY4-4

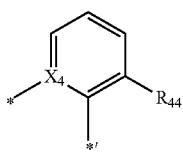
CY4-5

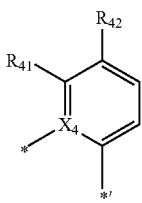
CY4-6

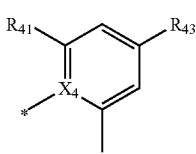
CY4-7

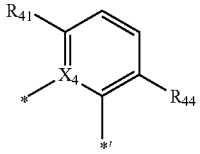
CY4-8

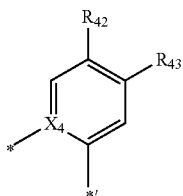
CY4-9

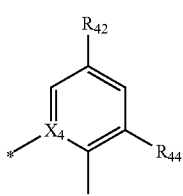
CY4-10

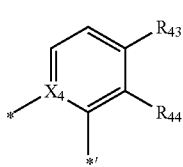
CY4-11

| | |
|---|---|
| CY4-12 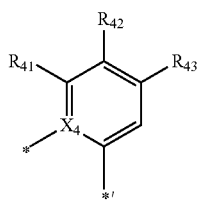 | CY4-19 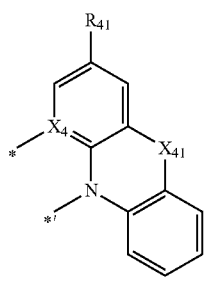 |
| CY4-13 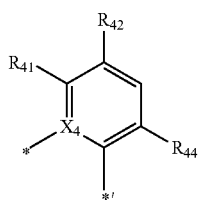 | CY4-20 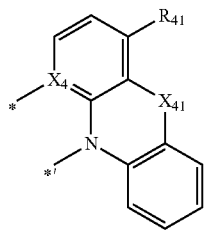 |
| CY4-14 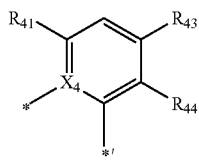 | CY4-21 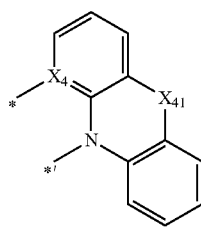 |
| CY4-15 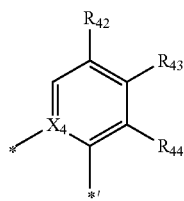 | CY4-22 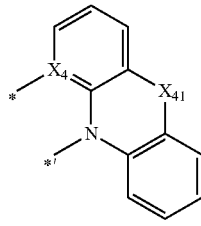 |
| CY4-16 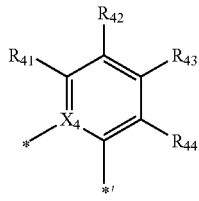 | CY4-23 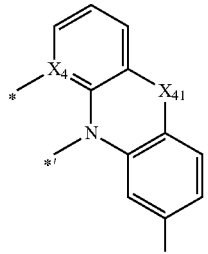 |
| CY4-17 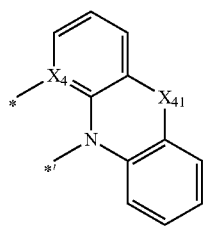 | CY4-24 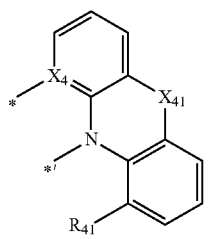 |
| CY4-18 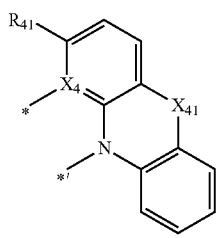 | |

CY4-1Z

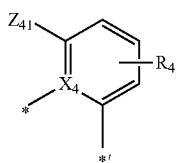

CY4-2Z

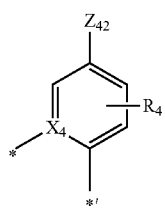

CY4-3Z

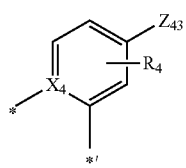

CY4-4Z

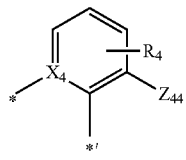

CY4-5Z

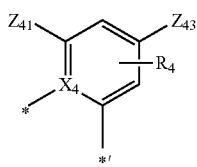

CY4-6Z

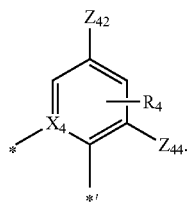

In Formulae CY4-1 to CY4-24 and CY4-1Z to CY4-6Z,
$X_4$ may be C or N,
$R_4$ and $R_{41}$ to $R_{44}$ may each be understood by referring to the description of $R_4$ provided herein, provided that each of $R_{41}$ to $R_{44}$ may not be hydrogen,
$Z_{41}$ to $Z_{44}$ may each be understood by referring to the descriptions of $Z_4$ provided herein,
* may indicate a binding site to M in Formula 1, and
*' may indicate a binding site to $T_2$ in Formula 1.

According to another embodiment, in Formula 2, a group represented by *—C($Q_{51}$)($Q_{52}$)($Q_{53}$) may be a group represented by one of Formulae 2-1 to 2-20:

2-1

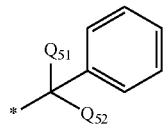

2-2

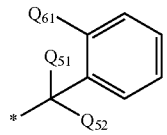

2-3

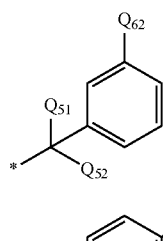

2-4

2-5

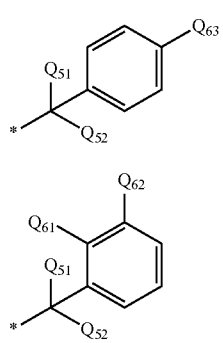

2-6

2-7

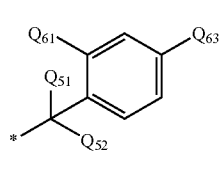

2-8

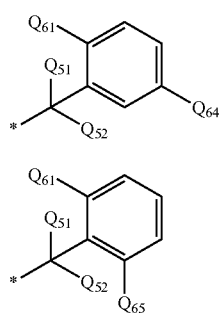

2-9

2-10

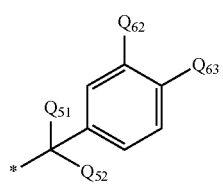

-continued 2-11
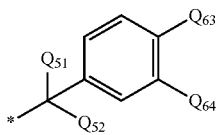

2-12
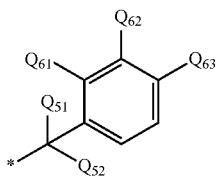

2-13
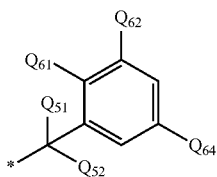

2-14
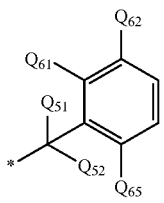

2-15
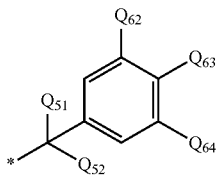

2-16
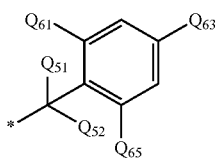

2-17
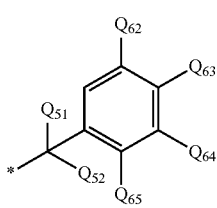

2-18
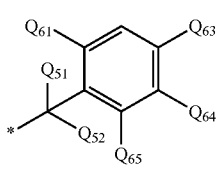

2-19
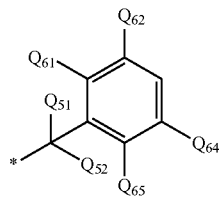

2-20
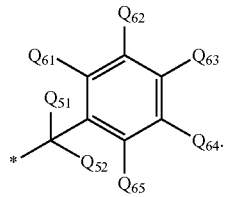

In Formulae 2-1 to 2-20 $Q_{51}$, $Q_{52}$ and $Q_{61}$ to $Q_{65}$ may each independently be a substituted or unsubstituted $C_1$-$C_{60}$ alkyl group or a substituted or unsubstituted phenyl group, $Q_{51}$, $Q_{52}$ and $Q_{61}$ to $Q_{65}$ may each be identical to or different from each other, and * may indicate a binding site to $L_1$ in Formula 2.

For example, in Formulae 2-1 to 2-20, $Q_{51}$, $Q_{52}$ and $Q_{61}$ to $Q_{65}$ may each independently be a $C_1$-$C_{20}$ alkyl group or a phenyl group, each unsubstituted or substituted with at least one of deuterium, a $C_1$-$C_{20}$ alkyl group, a phenyl group, a biphenyl group, or a combination thereof.

For example, a group represented by Formula 2 may be a group represented by one of Formulae 2-1 to 2-20 where $L_1$ is a single bond.

In another example, $Z_1$ to $Z_4$, $Z_{11}$ to $Z_{15}$, $Z_{21}$ to $Z_{23}$, $Z_{31}$ to $Z_{36}$, and $Z_{41}$ to $Z_{44}$ may each independently be a group represented by one of Formulae 2-1 to 2-20.

According to another embodiment, a group represented by Formula 2 may be a group represented by one of Formulae 2(1) to 2(19) wherein $L_1$ is a phenylene group and c1 is 1:

2(1)
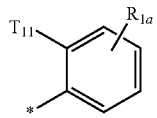

2(2)
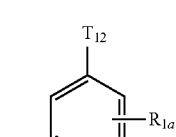

2(3)
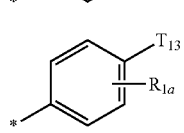

2(4)
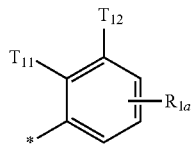

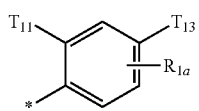 2(5)

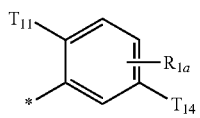 2(6)

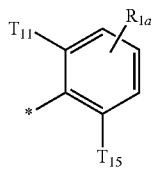 2(7)

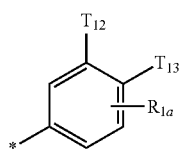 2(8)

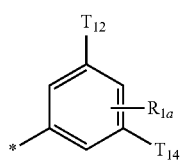 2(9)

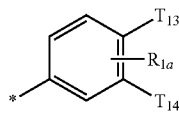 2(10)

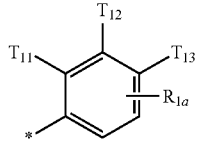 2(11)

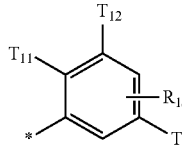 2(12)

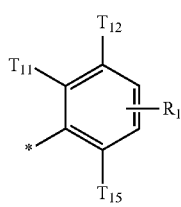 2(13)

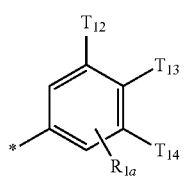 2(14)

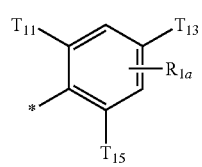 2(15)

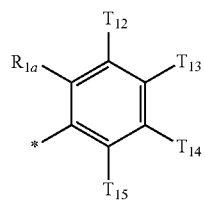 2(16)

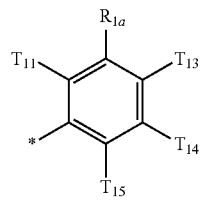 2(17)

2(18)

2(19)

In Formulae 2(1) to 2(19), $T_{11}$ to $T_{15}$ may be a group represented by *—$C(Q_{51})(Q_{52})(Q_{53})$ in Formula 2, and $T_{11}$ to $T_{15}$ may be identical to or different from each other, $R_{10a}$ may be understood by referring to the description of $R_1$ provided herein, and * may indicate a binding site to at least one of ring CY1 to ring CY4 in Formula 1.

For example, $Z_1$ to $Z_4$, $Z_{11}$ to $Z_{15}$, $Z_{21}$ to $Z_{23}$, $Z_{31}$ to $Z_{36}$, and $Z_{41}$ to $Z_{44}$ may each independently be a group represented by one of Formulae 2(1) to 2(19).

According to another embodiment, the organometallic compound represented by Formula 1 may satisfy at least one of Condition 1 to Condition 4:

Condition 1 wherein, in Formula 1,
n3 may not be 0,
n4 may be 0, and
a group represented by

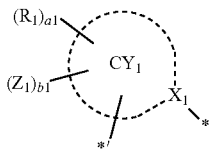

may be a group represented by one of Formulae CY1-1Z to CY1-21Z

Condition 2

Wherein, in Formula 1,
n1 may not be 0,
n3 may not be 0, and
a group represented by

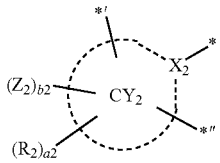

may be a group represented by one of Formulae CY2-1Z to CY2-5Z

Condition 3 wherein, in Formula 1,
n1 may not be 0,
n2 may not be 0, and
a group represented by

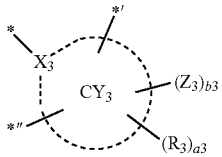

may be a group represented by one of Formulae CY3-1Z to CY3-7Z

Condition 4 wherein, in Formula 1,
n2 may not be 0,
n4 may be 0, and
a group represented by

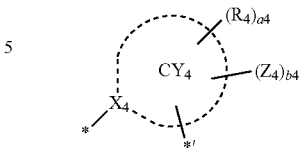

may be a group represented by one of Formulae CY4-1Z to CY4-6Z.

According to another embodiment, the organometallic compound represented by Formula 1 may emit a blue light.

According to one or more embodiments, the polycyclic compound of the second dopant may be represented by Formula 3:

Formula 3

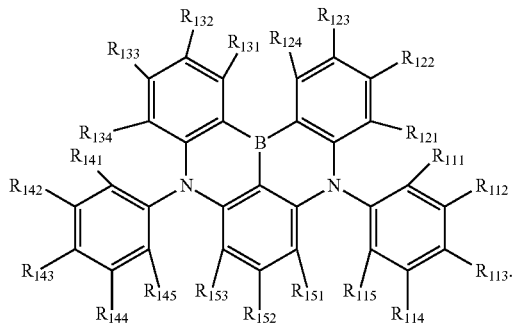

In Formula 3,
$R_{111}$ to $R_{115}$, $R_{121}$ to $R_{124}$, $R_{131}$ to $R_{134}$, $R_{141}$ to $R_{145}$, and $R_{151}$ to $R_{153}$ may each independently be one of Group R-1 to Group R-5, two or more adjacent groups among $R_{111}$ to $R_{115}$, $R_{121}$ to $R_{124}$, $R_{131}$ to $R_{134}$, $R_{141}$ to $R_{145}$ and $R_{151}$ to $R_{153}$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, Group R-1 may be hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —C($Q_1$)($Q_2$)($Q_3$), —B($Q_1$)($Q_2$), —N($Q_1$)($Q_2$), —P($Q_1$)($Q_2$), —C(=O)($Q_1$), —S(=O)($Q_1$), —S(=O)$_2$($Q_1$), —P(=O)($Q_1$)($Q_2$), and —P(=S)($Q_1$)($Q_2$), $Q_1$ to $Q_3$ may each independently be hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{06}$ alkylheteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, and two adjacent groups of $R_{131}$ to $R_{134}$ may be optionally linked to each other and condensed with a benzene ring in which $R_{131}$ to $R_{134}$ are bonded to form a moiety,

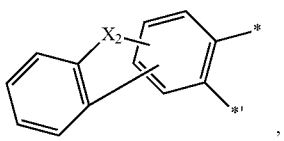

, wherein $X_2$ is N($Q_1$), O, or S, * indicates a binding site to B in Formula 3, and *' indicates a binding site to N in Formula 3.

Group R-2 may be a group represented by Formula 3-1 or a group represented by Formula 3-2:

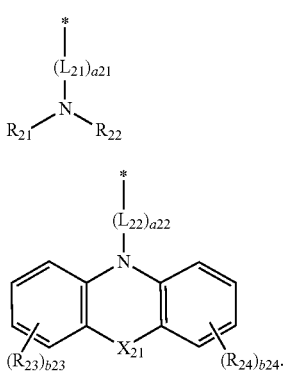

Formula 3-1

Formula 3-2 wherein, in Formulae 3-1 and 3-2, $X_{21}$ may be a single bond, O, S, N($R_{25}$), or C($R_{25}$)($R_{26}$), $L_{21}$ and $L_{22}$ may each independently be a substituted or unsubstituted $C_5$-$C_{30}$ carbocyclic group or a substituted or unsubstituted $C_1$-$C_{30}$ heterocyclic group, a21 and a22 may each independently be 0, 1, or 2, b23 and b24 may each independently be 0, 1, 2, 3, or 4, and $R_{21}$ to $R_{26}$ may each independently be a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted monovalent non-aromatic condensed polycyclic group, or a substituted or unsubstituted monovalent non-aromatic condensed heteropolycyclic group, Group R-3 may be a group represented by Formula 3-3:

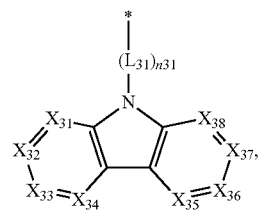

Formula 3-3 wherein, inn Formula 3-3, $L_{31}$ may be a substituted or unsubstituted $C_5$-$C_{60}$ carbocyclic group or a substituted or unsubstituted $C_1$-$C_{60}$ heterocyclic group, n31 may be 0, 1 or 2, $X_{31}$ may be C($R_{31}$) or N, $X_{32}$ is C($R_{32}$) or N, $X_{33}$ is C($R_{33}$) or N, $X_{34}$ is C($R_{34}$) or N, $X_{35}$ is C($R_{35}$) or N, $X_{36}$ is C($R_{36}$) or N, $X_{37}$ is C($R_{37}$) or N, and $X_{38}$ is C($R_{38}$) or N, and $R_{31}$ to $R_{38}$ may as defined for Group R-1, Group R-4 may be a group represented by Formula 3-4:

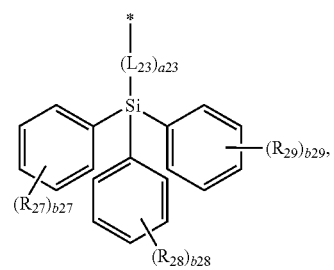

Formula 3-4 wherein, in Formula 3-4, $L_{23}$ may be a substituted or unsubstituted $C_5$-$C_{30}$ carbocyclic group or a substituted or unsubstituted $C_1$-$C_{30}$ heterocyclic group, a23 may each independently be 0, 1 or 2, and b27 to b29 may each independently be 0, 1, 2, 3, 4, or 5, Group R-5 may be a group represented by Formula 3-5:

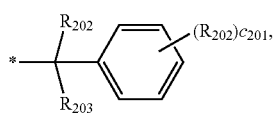

Formula 3-5 wherein, in Formula 3-5, $R_{201}$, $R_{202}$, and $R_{203}$ may each independently be a $C_1$-$C_{20}$ alkyl group unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a pyridinyl group, a pyrimidinyl group, a triazinyl group, a quinolinyl group, an isoquinolinyl group, a carbazolyl group, a dibenzofuranyl group, a dibenzothiophenyl group, —$N(Q_{31})(Q_{32})$, or a combination thereof, and c201 may be 1, 2, 3, 4, or 5.

$Q_{31}$ and $Q_{32}$ may be understood by referring to the description of $Q_1$ to $Q_3$ herein.

At least one blue light-emitting unit of the substrate 101 may further include a hole transport compound, an electron transport compound, or a combination thereof, in addition to the at least one organometallic compound represented by Formula 1 and the polycyclic compound represented by Formula 2 as described above.

According to one or more embodiments, at least one blue light-emitting unit of the blue emission layer of the substrate 101 may include the first dopant, the second dopant, and the host, wherein the first dopant may include at least one of the organometallic compounds represented by Formula 1, and the second dopant may include the polycyclic compound represented by Formula 3. According to one or more embodiments, the host may include a hole transport compound, an electron transport compound, or a combination thereof.

The hole transport compound may include at least one π electron-rich $C_3$-$C_{60}$ cyclic group, and may not include an electron transport moiety.

The electron transport compound may include at least one π electron-rich $C_3$-$C_{60}$ cyclic group and at least one electron transport moiety.

The electron transport moiety may include a cyano group, a π electron-deficient nitrogen-containing $C_1$-$C_{60}$ cyclic group, a group represented by one of the following formulae, or a combination thereof:

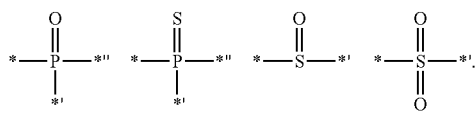

*, *', and *" in the formulae above may each indicate a binding site to a neighboring atom.

The term "π electron-deficient nitrogen-containing $C_1$-$C_{60}$ cyclic group" as used herein refers to a group having a cyclic group having 1 to 60 carbon atoms and at least one *—N=*' moiety. For example, the π electron-deficient nitrogen-containing $C_1$-$C_{60}$ cyclic group may include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a benzoisoquinoline group, a phthalazine group, a naphthyridine group, a quinoxaline group, a benzoquinoxaline group, a quinazoline group, a cinnoline group, a phenanthridine group, a phenanthroline group, a phenazine group, a benzimidazole group, an iso-benzothiazole group, a benzoxazole group, a benzoisoxazole group, a triazole group, a tetrazole group, an oxadiazole group, a triazine group, a thiadiazole group, an imidazopyridine group, an imidazopyrimidine group, an azaindene group, an azaindole group, an azabenzofuran group, an azabenzothiophene group, an azabenzosilole group, an azafluorene group, an azacarbazole group, an azadibenzofuran group, an azadibenzothiophene group, an azadibenzosilole group, or the like.

The term "π electron-rich $C_3$-$C_{60}$ cyclic group" as used herein refers to a cyclic group having 3 to 60 carbon atoms without *—N=*' moiety. For example, the π electron-rich $C_3$-$C_{60}$ cyclic group may include a benzene group, a heptalene group, an indene group, a naphthalene group, an azulene group, a heptalene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, perylene group, a pentacene group, a hexacene group, a pentaphene group, a rubicene group, a coronene group, an ovalene group, a pyrrole group, an iso-indole group, an indole group, a furan group, a thiophene group, a benzofuran group, a benzothiophene group, a benzosilole group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, a benzosilolocarbazole group, a triindolobenzene group, an acridine group, a dihydroacridine group, or the like.

The hole transport compound may be different from the electron transport compound.

According to one or more embodiments, the hole transport compound may include at least one carbazole group.

According to another embodiment, the electron transport compound may include at least one π electron-deficient nitrogen-containing $C_1$-$C_{60}$ cyclic group (e.g., a triazine group, or the like).

The blue light-emitting unit of the substrate 101, which includes at least one of the organometallic compounds represented by Formula 1 as the first dopant and the polycyclic compound represented by Formula 3 as the second dopant, may have a maximum emission wavelength between about 430 nm and about 500 nm, for example, between about 445 nm and about 475 nm, and may emit a blue light having a FWHM (PL spectrum) of less than or equal to about 50 nm, for example, less than or equal to about 40 nm. In addition, by adjusting the composition ratio of the first dopant and the second dopant, the blue light-emitting unit of the substrate 101 may adjust the emission wavelength such that the second emission peak which may affect the color purity, is not absorbed by the QD, while improving the lifespan. In this manner, a display apparatus with improved lifespan without efficiency reduction may be provided.

The term "$C_1$-$C_{60}$ alkyl group" as used herein refers to a linear or branched saturated aliphatic hydrocarbon monovalent group having 1 to 60 carbon atoms, and non-limiting examples thereof may include a methyl group, an ethyl group, a propyl group, an isobutyl group, a sec-butyl group, a tert-butyl group, a pentyl group, an isoamyl group, a hexyl group, or the like. The term "$C_1$-$C_{60}$ alkylene group" as used herein refers to a divalent group having the same structure as the $C_1$-$C_{60}$ alkyl group.

The term "$C_1$-$C_{60}$ alkoxy group" used herein refers to a monovalent group represented by —$OA_{101}$ (wherein $A_{101}$ is the $C_1$-$C_{60}$ alkyl group), and non-limiting examples thereof may include a methoxy group, an ethoxy group, an isopropyloxy group, or the like.

The term "$C_1$-$C_{60}$ alkylthio group" used herein refers to a monovalent group represented by —$SA_{101'}$ (wherein $A_{101'}$ is the $C_1$-$C_{60}$ alkyl group).

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and non-limiting examples thereof may include an ethenyl group, a propenyl group, a butenyl group, or the like. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and non-limiting examples thereof may include an ethynyl group, a propynyl group, or the like. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof may include a cyclopropyl group, a cyclobutyl group, a cyclopentyl group, a cyclohexyl group, a cycloheptyl group, or the like. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom selected from B, N, O, P, Si, Ge, Se, and S as a ring-forming atom and 1 to 10 carbon atoms as ring-forming atom(s), and non-limiting examples thereof may include a tetrahydrofuranyl group, a tetrahydrothiophenyl group, or the like. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof may include a cyclopentenyl group, a cyclohexenyl group, a cycloheptenyl group, or the like. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has at least one hetero atom selected from B, N, O, P, Si, Ge, Se, and S as a ring-forming atom, 2 to 10 carbon atoms as ring-forming atom(s), and at least one double bond in its ring. Non-limiting examples of the $C_1$-$C_{10}$ heterocycloalkenyl group may include a 2,3-dihydrofuranyl group, a 2,3-dihydrothiophenyl group, or the like. The term "$C_2$-$C_{10}$ heterocycloalkenylene group" as used herein refers to a divalent group having the same structure as the $C_2$-$C_1$ heterocycloalkenyl group.

The term "$C_6$-$C_{60}$ aryl group" as used, herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group may include a benzene group, a naphthyl group, an anthracenyl group, a phenanthrenyl group, a pyrenyl group, a chrysenyl group, or the like. When the $C_6$-$C_{60}$ aryl group and the $C_6$-$C_{60}$ arylene group each include two or more rings, the two or more rings may be fused to each other.

The term "$C_7$-$C_{60}$ alkyl aryl group" as used herein refers to a $C_6$-$C_{60}$ aryl group substituted with at least one $C_1$-$C_{60}$ alkyl group. The term "$C_7$-$C_{60}$ aryl alkyl group" as used herein refers to a $C_1$-$C_{60}$ alkyl group substituted with at least one $C_6$-$C_{60}$ aryl group.

The term "$C_1$-$C_{60}$ heteroaryl group" as used herein refers to a monovalent group having a cyclic aromatic system that has at least one heteroatom selected from B, N, O, P, Si, Ge, Se, and S as a ring-forming atom, and 1 to 60 carbon atoms as ring-forming atom(s). The term "$C_1$-$C_{60}$ heteroarylene group" as used herein refers to a divalent group having a carbocyclic aromatic system that has at least one heteroatom selected from B, N, O, P, Ge, Se, Si, and S as a ring-forming atom, and 1 to 60 carbon atoms as ring-forming atom(s). Non-limiting examples of the $C_1$-$C_{60}$ heteroaryl group may include a pyridinyl group, a pyrimidinyl group, a pyrazinyl group, a pyridazinyl group, a triazinyl group, a quinolinyl group, an isoquinolinyl group, or the like. When the $C_1$-$C_{60}$ heteroaryl group and the $C_1$-$C_6$ heteroarylene group each include two or more rings, the two or more rings may be fused to each other.

The term "$C_2$-$C_{06}$ alkyl heteroaryl group" as used herein refers to a $C_1$-$C_{60}$ heteroaryl group substituted with at least one $C_1$-$C_{60}$ alkyl group. The term "$C_2$-$C_{60}$ heteroaryl alkyl group" as used herein refers to a $C_1$-$C_{60}$ alkyl group substituted with at least one $C_1$-$C_{60}$ heteroaryl group.

The term "$C_6$-$C_6$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_1$-$C_{60}$ heteroaryloxy group" as used herein indicates —$OA_{104}$ (wherein $A_{104}$ is a $C_1$-$C_{60}$ heteroaryl group), and the term "$C_1$-$C_{60}$ heteroarylthio group" as used herein indicates —$SA_{105}$ (wherein $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Non-limiting examples of the monovalent non-aromatic condensed polycyclic group may include a fluorenyl group or the like. The term "divalent non-aromatic condensed polycyclic group" as used herein refers to a divalent group having the same structure as the monovalent non-aromatic condensed polycyclic group described above.

The term "monovalent non-aromatic condensed heteropolycyclic group" as used herein refers to a monovalent group (for example, having 2 to 60 carbon atoms) having two or more rings condensed with each other, a heteroatom selected from B, N, O, P, Si, Ge, Se, and S, other than carbon atoms, as a ring-forming atom, and no aromaticity in its entire molecular structure. Non-limiting examples of the monovalent non-aromatic condensed heteropolycyclic group may include a carbazolyl group or the like. The term "divalent non-aromatic condensed heteropolycyclic group" as used herein refers to a divalent group having the same structure as the monovalent non-aromatic condensed heteropolycyclic group described above.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from B, N, O, Si, P, Ge, Se, and S other than 1 to 30 carbon atoms as ring-forming atom(s). The $C_1$-$C_{30}$ heterocyclic group may be a monocyclic group or a polycyclic group.

At least one substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ hetero arylthio group, the substituted monovalent non-aromatic condensed polycyclic group, and the substituted monovalent non-aromatic condensed heteropolycyclic group may be:

deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_6$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{11})(Q_{12})(Q_{13})$, —$Ge(Q_{11})(Q_{12})(Q_{13})$, —$C(Q_{11})(Q_{12})(Q_{13})$, —$N(Q_{14})(Q_{15})$, —$B(Q_{16})(Q_{17})$, —$C(=O)(Q_{11})$, —$S(=O)(Q_{11})$, —$S(=O)_2(Q_{11})$, —$P(Q_{18})(Q_{19})$, —$P(=O)(Q_{18})(Q_{19})$, —$P(=S)(Q_{18})(Q_{19})$, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each substituted with at least one of deuterium, —F, —Cl, —Br, —I, —$SF_5$, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_6$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a, $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{00}$ heteroaryloxy group, a $C_1$-$C_{60}$ heteroarylthio group, a monovalent non-aromatic condensed polycyclic group, a monovalent non-aromatic condensed heteropolycyclic group, —$Si(Q_{21})(Q_{22})(Q_{23})$, —$Ge(Q_{21})(Q_{22})(Q_{23})$, —$C(Q_{21})(Q_{22})(Q_{23})$, —$N(Q_{24})(Q_{25})$, —$B(Q_{26})(Q_{27})$, —$C(=O)(Q_{21})$, —$S(=O)(Q_{21})$, —$S(=O)_2(Q_{21})$, —$P(Q_{28})(Q_{29})$, —$P(=O)(Q_{28})(Q_{29})$, —$P(=S)(Q_{28})(Q_{29})$, or a combination thereof; or —$Si(Q_{31})(Q_{32})(Q_{33})$, —$Ge(Q_{31})(Q_{32})(Q_{33})$, —$C(Q_{31})(Q_{32})(Q_{33})$, —$N(Q_{34})(Q_{35})$, —$B(Q_{36})(Q_{37})$, —$C(=O)(Q_{31})$, —$S(=O)(Q_{31})$, —$S(=O)_2(Q_{31})$, —$P(Q_{38})(Q_{39})$, —$P(=O)(Q_{38})(Q_{39})$, or —$P(=S)(Q_{38})(Q_{39})$, and $Q_{11}$ to $Q_{19}$, $Q_{21}$ to $Q_{29}$, and $Q_{31}$ to $Q_{39}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

Hereinafter, exemplary compounds and organic light-emitting devices according to embodiments are described in further detail with reference to Synthesis Examples and Examples. However, the compounds and the organic light-emitting devices are not limited thereto. The wording "'B' was used instead of 'A'" used in describing Synthesis Examples means that an amount of 'A' used was identical to an amount of 'B' used, in terms of a molar equivalent.

EXAMPLES

Example 1: Manufacturing of Blue Light-Emitting OLED

An ITO glass substrate was cut to a size of 50 millimeters (mm)×50 mm×0.5 mm and then, sonicated in acetone, isopropyl alcohol, and deionized (DI) water, each for 15 minutes, and then, washed by exposure to ultraviolet (UV) light ozone for 30 minutes each.

Then, HAT-CN was deposited on the ITO electrode (anode) on the glass substrate to form a hole injection layer having a thickness of 100 angstroms (Å), N,N'-di(1-naphthyl)-N,N'-diphenylbenzidine (NPB) was deposited on the hole injection layer to form a first hole transport layer having a thickness of 500 Å, 4,4',4"-tris(N-carbazolyl)triphenylamine (TCTA) was deposited on the first hole transport layer to form a second hole transport layer having a thickness of 50 Å, and 1,3-bis(N-carbazolyl)benzene (mCP) was deposited on the second hole transport layer to form an electron blocking layer having a thickness of 50 Å.

A compound host (host), D1 (first dopant), and D2 (second dopant) were co-deposited on the electron blocking layer at a weight ratio of 89.5:10:0.5 to form an emission layer having a thickness of 400 Å.

Host

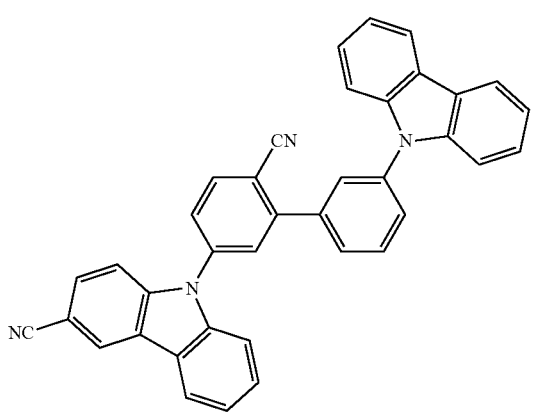

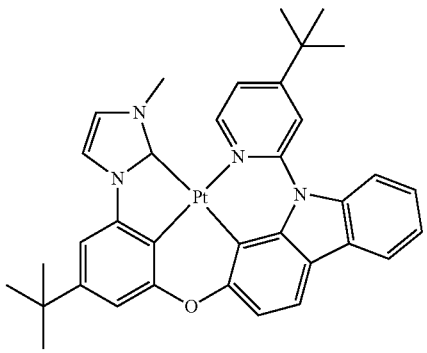

D1

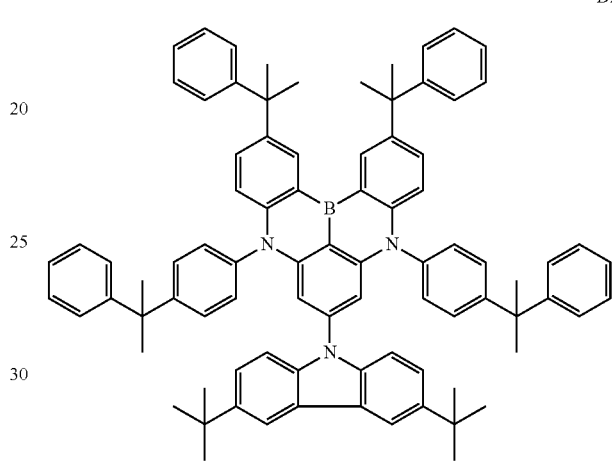

D2

An OLED was manufactured by depositing 2,8-bis(diphenylphosphino oxide) dibenzofuran (DBFPO) on the emission layer to form a hole blocking layer having a thickness of 100 Å, co-depositing DBFPO and lithium quinolate (LiQ) at a weight ratio of 5:5 to form an electron transport layer having a thickness of 300 Å, depositing LiQ on the electron transport layer to form an electron injection layer having a thickness of 10 Å, and then depositing Al having a thickness of 1000 Å on the electron injection layer to form a cathode.

Comparative Example 1: Manufacturing of Blue Light-Emitting OLED

A blue light-emitting OLED was manufactured in a similar manner as used in Example 1, except that the weight ratio among the host, the first dopant, and the second dopant was changed to 87:10:3.

Experimental Examples 1 to 4

Changes in the emission spectrum were measured by adjusting the weight ratios of the host, the first dopant, and the second dopant of the emission layer of the OLED. The OLED was fabricated by a similar method as in Example 1, except for the weight ratios of the host, the first dopant, and the second dopant of the emission layer of the OLED.

The components, composition ratios, and PL transient decay lifetime (milliseconds, ms), and efficiency (candela per Ampere, cd/A) of the emission layers of the OLEDs of Experimental Examples 1 to 4 are shown in Table 1 below. In Table 1, H represents the host component, and T/To represents a ratio of the PL transient decay lifetime (T) of the OLED of each Example to the PL transient decay lifetime ($T_0$), and efficiency of the OLED of Experimental Example 4 where only the first dopant is included as a light-emitting material.

TABLE 1

| | First dopant | Second dopant | H:D1:D2 (weight ratio) | Photoluminescence transient decay lifetime (ms) | T/$T_0$ | Efficiency (cd/A) |
|---|---|---|---|---|---|---|
| Experimental Example 1 (Comparative Example 1) | D1 | D2 | 87:10:3 | 7.3 | 2.1 | 15.9 |
| Experimental Example 2 | D1 | D2 | 88.5:10:1.5 | 7.2 | 2.1 | 16.2 |
| Experimental Example 3 (Example 1) | D1 | D2 | 89.5:10:0.5 | 5.1 | 1.5 | 15.7 |
| Experimental Example 4 | D1 | — | 90:10:0 | 3.4 | 1.0 | 13.1 |

Figure 12:
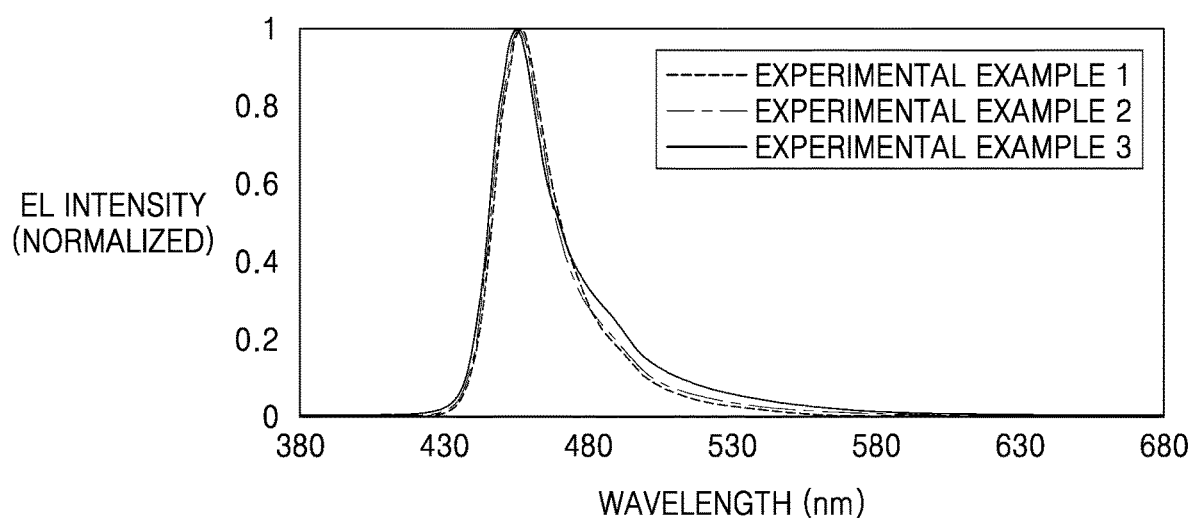
FIG. 12 is a graph of EL intensity (normalized, arbitrary units (a.u.)) versus wavelength (nm), showing emission spectra of OLEDs of Experimental Examples 1 to 4.

In addition, the emission spectra of the OLEDs of Experimental Examples 1 to 4 are shown in FIG. 12. With reference to FIG. 12, the emission spectra of the OLEDs of Experimental Examples 1, 2, and 3 appear to be similar to each other; however, it is understood that the intensity of the second emission peak increases little by little from Experimental Examples 1 to 3. With reference to Table 1, although the OLEDs of Experimental Examples 1 to 3 have a similar efficiency, the PL transient decay lifetime is short in Experimental Example 3 where the weight ratio of the first dopant to the second dopant is relatively high. When the PL transient decay lifetime is short, the time in which molecules exist as excitons in a high-energy state may be shortened, which leads to reduced possibility of deterioration due to high energy.

Experimental Example 5: Manufacturing of Green QD Film

A chloroform dispersion of InP/ZnSe/ZnS QD was mixed with a binder (quaternary copolymer of methacrylic acid, benzyl methacrylate, hydroxyethylmethacrylate, and styrene, acid value: 130 mg KOH/g, molecular weight: 8,000 grams per mole) solution (having a concentration of 30 wt % of propylene glycol monomethyl ether acetate (PGMEA)) to prepare a QD-binder dispersion. The QD-binder dispersion was mixed with a photopolymerizable monomer (hexaacrylate, glycol di-3-mercaptopropionate), an initiator (oxime ester compound), a light dispersing agent ($TiO_2$), and PGMEA to prepare a photosensitive composition. The photosensitive composition was spin-coated on a glass substrate to obtain a film of QD-polymer complex through baking.

Evaluation Example

The emission spectrum, color coordinates, current efficiency, and lifespan were measured by using a current-voltmeter (Keithley 2400) and a spectrometer (SR-3AR, Topcon). The device lifespan was obtained by measuring the amount of time that elapsed until luminance was reduced to 95% of the initial luminance of 100%, and the results were expressed as a relative value.

A time-resolved photoluminescence measuring equipment (FluoTime 300, Picoquant) was used to measure the PL transient decay lifetime.

A spectrophotometer (Cary5000, Agilent) was used to conduct an UV spectroscopic analysis and obtain an UV-VIS absorption spectrum.

Calculation of overlap between the emission spectrum and the absorption spectrum: the spectral overlap integral J between the OLED emission spectrum and the QD absorption spectrum was calculated by using Equation 1:

$$J = \int \varepsilon_A(\lambda) I(\lambda) \lambda_4 d\lambda \quad \text{Equation 1}$$

wherein,

I represents wavelength, $e_A$ represents extinction coefficient according to a wavelength of QD, and I represents emission intensity according to a wavelength of OLED.

Figure 13:
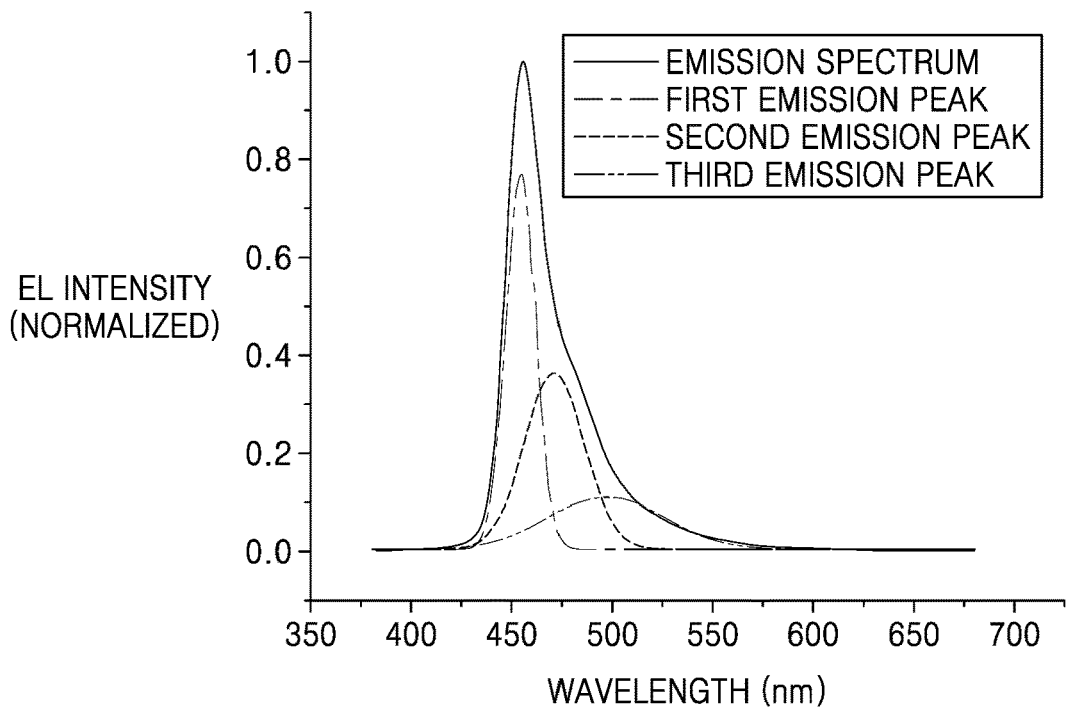
FIG. 13 is a graph of absorption intensity (a.u.) versus wavelength (nm), showing an emission spectrum of Example 1.
Figure 14:
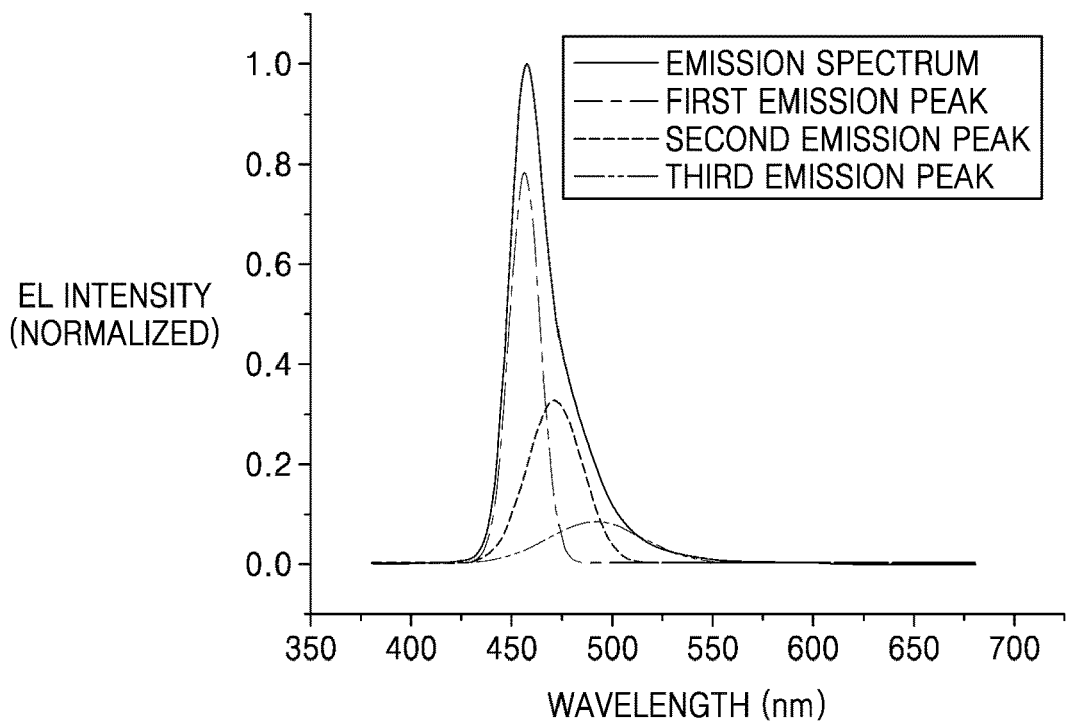
FIG. 14 is a deconvolution graph showing an emission spectrum of Comparative Example 1.

The emission spectrum of each of the blue light-emitting OLEDs of Example 1 and Comparative Example 1 was deconvoluted with a Gaussian peak to obtain the first emission peak and the second emission peak, each of which are shown in FIGS. 13 and 14, respectively.

Evaluation Example 1: Calculation of Spectrum Overlap

Figure 15:
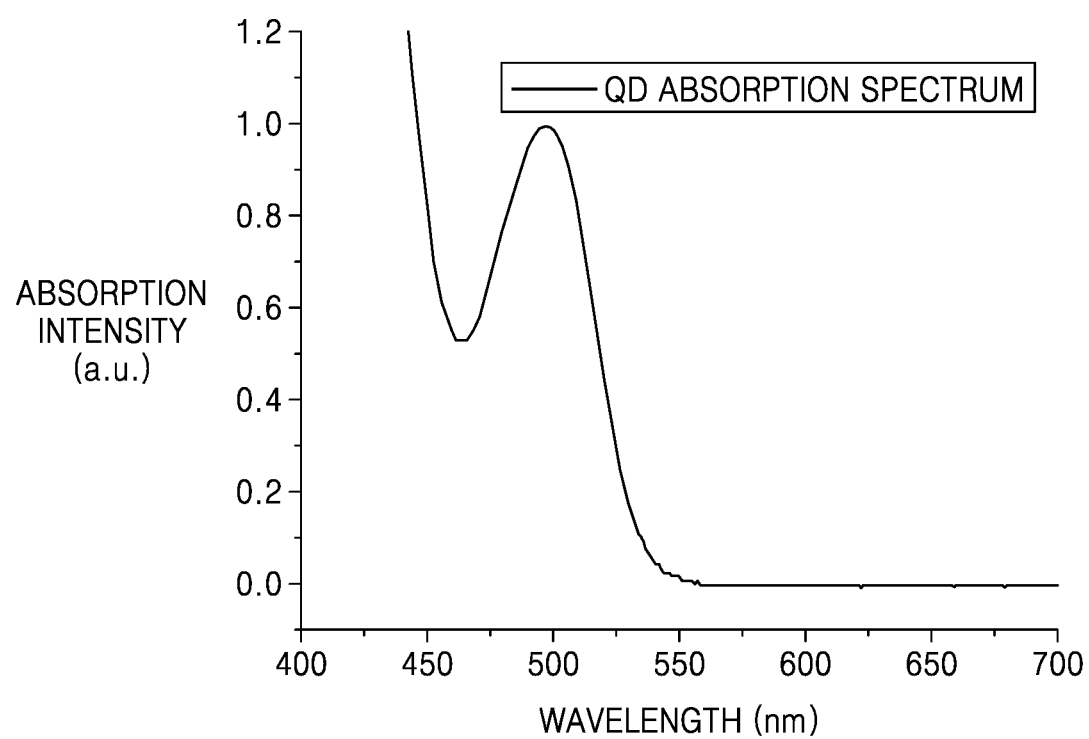
FIG. 15 is a graph showing an absorption spectrum of a green quantum dot (QD) filter of Experimental Example 15.

The absorption spectrum of the green QD film manufactured in Experimental Example 5 was measured and shown in FIG. 15. The compositions of the emission layers of the blue light-emitting OLEDs of Example 1 and Comparative Example 1, the first emission peak and the second emission peak obtained from the graphs of FIGS. 13 and 14, the ratio of the second emission peak to the first emission peak, the absorption peak and the absorption valley of the green QD film obtained from the graph of FIG. 15, and the overlap between the emission spectrum of the blue OLED and the absorption spectrum of the green QD film obtained by Equation 1 are shown in Table 2 below.

TABLE 2

| | Example 1 | Comparative Example 1 |
|---|---|---|
| First dopant | D1 | D1 |
| Second dopant | D2 | D2 |
| First emission peak (nm) | 455 | 456 |
| Second emission peak (nm) | 473 | 477 |
| Second emission peak/first emission peak (intensity ratio) | 0.47 | 0.41 |
| Photoluminescence transient decay lifetime (ms) | 5.1 | 7.3 |
| QD filter absorption peak (nm) | 497 | 497 |
| QD filter absorption valley (nm) | 464 | 464 |
| OLED efficiency (cd/A) | 15.9 | 16.2 |
| OLED lifespan (relative value) | 116 | 100 |
| Spectrum overlap (relative value) | 102% | 100% |

With reference to Table 2, the blue light-emitting OLED of Example 1 appears to have a greater ratio between the second emission peak and the first emission peak and a shorter PL transient decay lifetime, compared to the blue light-emitting OLED of Comparative Example 1. Moreover, the overlap ratio of the emission spectrum of the blue light-emitting OLED and the emission spectrum of the green QD film is similar to the overlap ratio of Comparative Example 1, and the efficiency of the blue OLED of Example 1 is similar to the efficiency of the blue light-emitting OLED of Comparative Example 1. However, the lifespan of the blue light-emitting OLED of Example 1 shows a noticeable improvement over that of Comparative Example 1. The display apparatus according to the embodiments described above may be applied to various electronic devices. For example, the display apparatus may be usefully applied to small-sized electronic devices such as portable devices and wearable devices, and medium- to large-sized electronic devices such as home appliances.

According to the one or more embodiments above, by applying a hyperfluorescence system to a light source OLED and adjusting a composition of an emission layer to improve light absorption by a color control portion to a QD color control element, a high-efficiency display apparatus may be implemented.

It should be understood that exemplary embodiments described herein should be considered in a descriptive sense only and not for purposes of limitation. Descriptions of features or aspects within each exemplary embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope as defined by the following claims.

What is claimed is:

1. A display apparatus, comprising:
a substrate comprising at least one blue light-emitting unit; and
a color control portion provided on the substrate and configured to control a color of a light generated at the substrate,
wherein the color control portion comprises a first color control element, wherein the first color control element comprises a first quantum dot for green light conversion,
the at least one blue light-emitting unit comprises an emission layer, wherein the emission layer comprises a host, a first dopant, and a second dopant,
the emission layer exhibits an emission spectrum comprising a first emission peak and a second emission peak,
the first color control element exhibits an absorption spectrum comprising a first absorption peak and a first absorption valley,
the first dopant has a lowest triplet excitation energy level and a lowest singlet excitation energy level,
the second dopant has a lowest triplet excitation energy level and a lowest singlet excitation energy level,
wherein the first emission peak, the second emission peak, the first absorption peak, and the first absorption valley satisfy Conditions 1-1 to 1-4, and
the first dopant and the second dopant satisfy Conditions 2-1 and 2-2:
Condition 1-1
about 430 nanometers≤$\lambda_{BEM1}$≤about 500 nanometers
Condition 1-2
about 430 nanometers≤$\lambda_{ABP1}$≤about 550 nanometers
Condition 1-3
100%<($T_{BEM}/T_{D1}$)<200%
Condition 1-4
$|\lambda_{BEM2}-\lambda_{ABVL1}|\leq(\lambda_{BEM1}-\lambda_{BEM2})$
Condition 2-1
$T_1(D1)\geq T_1(D2)$
Condition 2-2
$T_1(D1)\geq S_1(D2)$,
wherein,
$\lambda_{BEM1}$ is the first emission peak,
$\lambda_{BEM2}$ is the second emission peak,
$\lambda_{ABP1}$ is the first absorption peak,
$\lambda_{ABVL1}$ is the first absorption valley,
$T_1(D1)$ is the lowest triplet excitation energy level of the first dopant,
$S_1(D1)$ is the lowest singlet excitation energy level of the first dopant,
$T_1(D2)$ is the lowest triplet excitation energy level of the second dopant,
$S_1(D2)$ is the lowest singlet excitation energy level of the second dopant,
$T_{BEM}$ represents photoluminescence transient decay lifetime of the emission layer, and
$T_{D1}$ represents photoluminescence (PL) transient decay lifetime of the first dopant alone.

2. The display apparatus of claim 1, wherein the first quantum dot comprises at least one of a Group II-VI compound, a Group III-V compound, a Group II-III-V compound, a Group III-VI compound, a Group I-III-VI compound, a Group IV-VI compound, or a combination thereof.

3. The display apparatus of claim 2, wherein the Group II-VI compound is ZnS, ZnSe, ZnTe, ZnO, MgSe, MgS, ZnSeS, ZnSeTe, ZnSTe, MgZnSe, MgZnS, or a combination thereof, the Group III-V compound is GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof, the Group II-III-V compound is InZnP, InGaZnP, InAlZnP, or a combination thereof, the Group III-VI compound is GaS, GaSe, $Ga_2Se_3$, GaTe, InS, InSe, $In_2S_3$, $In_2Se_3$, InTe, $InGaS_3$, $InGaSe_3$, or a combination thereof, the Group I-III-VI compound is AgInS, $AgInS_2$, CuInS, $CuInS_2$, $CuGaO_2$, $AgGaO_2$, $AgAlO_2$, or a combination thereof, and the Group IV-VI compound is SnS, SnSe, SnTe, SnSeS, SnSeTe, SnSTe, or a combination thereof.

4. The display apparatus of claim 1, wherein energy is transmitted from the first dopant to the second dopant.

5. The display apparatus of claim 4, wherein the first dopant and the second dopant emit light simultaneously.

6. The display apparatus of claim 1, wherein the first dopant is a Pt complex having a tetradentate ligand comprising a benzimidazole moiety, an imidazole moiety, a pyrrole moiety, or a combination thereof.

7. The display apparatus of claim 6, wherein the first dopant is an organometallic compound represented by Formula 1:

Formula 1

$$\begin{array}{c}(R_1)_{a1} \quad (T_4)_{n4} \quad (R_4)_{a4}\\ (Z_1)_{b1} - CY_1 \quad CY_4 - (Z_4)_{b4}\\ X_1 \quad X_4\\ (T_3)_{n3} \quad M \quad (T_2)_{n2}\\ X_2 \quad X_3\\ (Z_2)_{b2} - CY_2 \quad CY_3 - (Z_3)_{b3}\\ (R_2)_{a2} \quad (T_1)_{n1} \quad (R_3)_{a3}\end{array}$$

wherein,

M is a transition metal, $X_1$ to $X_4$ are each independently C or N, two bonds of a bond between $X_1$ and M, a bond between $X_2$ and M, a bond between $X_3$ and M, and a bond between $X_4$ and M are coordinate bonds, and the other two bonds are covalent bonds, $Z_1$ to $Z_4$ are each independently a group represented by Formula 2:

Formula 2

$$*-(L_1)_{c1}-\left[\begin{array}{c}Q_{51}\\ C-Q_{52}\\ Q_{53}\end{array}\right]_{c2},$$

$L_1$ is a single bond, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, c1 is an integer from 1 to 10, c2 is an integer from 1 to 20, b1 to b4 are each independently an integer from 0 to 20, and a sum of b1 to b4 is 1 or greater, ring CY1 to ring CY4 are each independently a $C_5$-$C_{30}$ carbocyclic group or a $C_1$-$C_{30}$ heterocyclic group, $T_1$ is a single bond, a double bond, *—N($R_{5a}$)—*', *—B($R_{5a}$)—*', *—P($R_{5a}$)—*', *—C($R_{5a}$)($R_{5b}$)—*', *—Si($R_{5a}$)($R_{5b}$)—*', *—Ge($R_{5a}$)($R_{5b}$)*', *—S—*', *—Se—*', *—O*', *—C(=O)*', *—S(=O)—*', *—S(=O)$_2$—*', *—C($R_{5a}$)=*', *=C($R_{5a}$)*', *—C($R_{5a}$)=C($R_{5b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_2$ is a single bond, a double bond, *—N($R_{6a}$)—*', *—B($R_{6a}$)—*', *—P($R_{6a}$)—*', *—C($R_{6a}$)($R_{6b}$)—*', *—Si($R_{6a}$)($R_{6b}$)—*', *—Ge($R_{6a}$)($R_{6b}$)*', *—S—*', *—Se—*', *—O*', *—C(=O)*', *—S(=O)—*', *—S(=O)$_2$—*', *—C($R_{6a}$)=*', *=C($R_{6a}$)*', *—C($R_{6a}$)=C($R_{6b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_3$ is a single bond, a double bond, *—N($R_{7a}$)—*', *—B($R_{7a}$)—*', *—P($R_{7a}$)—*', *—C($R_{7a}$)($R_{7b}$)—*', *—Si($R_{7a}$)($R_{7b}$)—*', *—Ge($R_{7a}$)($R_{7b}$)*', *—S—*', *—Se—*', *—O*', *—C(=O)*', *—S(=O)—*', *—S(=O)$_2$—*', *—C($R_{7a}$)=*', *=C($R_{7a}$)*', *—C($R_{7a}$)=C($R_{7b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $T_4$ is a single bond, a double bond, *—N($R_{8a}$)*', *—B($R_{8a}$)—*', *—P($R_{8a}$)—*', *—C($R_{8a}$)($R_{8b}$)—*', *—Si($R_{8a}$)($R_{8b}$)—*', *—Ge($R_{8a}$)($R_{8b}$)*', *—S—*', *—Se—*', *—O*', *—C(=O)*', *—S(=O)—*', *—S(=O)$_2$—*', *—C($R_{8a}$)=*', *=C($R_{8a}$)*', *—C($R_{8a}$)=C($R_{8b}$)—*', *—C(=S)—*', *—C≡C—*', a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, n1 to n4 are each independently an integer from 0 to 5, and three or more of n1 to n4 are each independently an integer from 1 to 5, when n1 is 0, then $T_1$ is absent, when n2 is 0, then $T_2$ is absent, when n3 is 0, then $T_3$ is absent, and when n4 is 0, then $T_4$ absent, when n1 is 2 or greater, two or more of $T_1$ are identical to or different from each other, when n2 is 2 or greater, two or more of $T_2$ are identical to or different from each other, when n3 is 2 or greater, two or more of $T_3$ are identical to or different from each other, and when n4 is 2 or greater, two or more of $T_4$ are identical to or different from each other, $R_1$ to $R_4$, $R_{5a}$, $R_{5b}$, $R_{6a}$, $R_{6b}$, $R_{7a}$, $R_{7b}$, $R_{8a}$, $R_{8b}$, and $Q_{51}$ to $Q_{53}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_0$ aryloxy group, a substituted or unsubstituted $C_6$-$C_{60}$ arylthio group, a substituted or unsubstituted $C_1$-$C_6$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_6$ heteroaryloxy group, a substituted or unsubstituted $C_1$-$C_6$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)(05), —B($Q_6$)($Q_7$), —P(=O)($Q_8$)($Q_9$), or —P($Q_8$)($Q_9$), at least one of $Q_{51}$ to $Q_{53}$ is each independently a substituted or unsubstituted $C_6$-$C_6$ aryl group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, a1 to a4 are each independently an integer from 0 to 20, two or more of $R_1$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of $R_2$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of $R_3$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of $R_4$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, two or more of $R_1$ to $R_4$, $R_{8a}$, $R_{8b}$, $R_{6a}$, $R_{6b}$, $R_{7a}$, $R_{7b}$, $R_{8a}$, and $R_{8b}$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, $R_{10a}$ is as defined for $R_1$,

* and *' each indicate a binding site to a neighboring atom, at least one substituent of the substituted $C_1$-$C_6$ alkyl group, the substituted $C_2$-$C_6$ alkenyl group, the substituted $C_2$-$C_{60}$ alkynyl group, the substituted $C_1$-$C_6$ alkoxy group, the substituted $C_1$-$C_6$ alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_7$-$C_{60}$ aryl alkyl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted $C_2$-$C_{60}$ heteroaryl alkyl group, the substituted $C_1$-$C_{60}$ heteroaryloxy group, the substituted $C_1$-$C_{60}$ heteroarylthio group, the substituted monovalent non-aromatic condensed polycyclic group, and the substituted monovalent non-aromatic condensed heteropolycyclic group is:

deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_6$ alkyl group, a $C_2$-$C_{60}$ alkenyl group, a $C_2$-$C_{60}$ alkynyl group, a $C_1$-$C_6$ alkoxy group, or a $C_1$-$C_6$ alkylthio group;

a $C_1$-$C_6$ alkyl group, a $C_2$-$C_{60}$ alkenyl group, a $C_2$-$C_{60}$ alkynyl group, a $C_1$-$C_{60}$ alkoxy group, or a $C_1$-$C_{60}$ alkylthio group, each substituted with at least one of deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_6$ heteroaryloxy group, a $C_1$-$C_6$ heteroarylthio group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(015), —Ge(Q$_{13}$)(Q$_{14}$)(015), —B(Q$_{16}$)(Q$_{17}$), —P(=O)(Q$_{18}$)(Q$_{19}$), —P(Q$_{18}$)(Q$_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each unsubstituted or substituted with at least one of deuterium, —F, —Cl, —Br, —I, —SF$_5$, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_1$-$C_{60}$ alkylthio group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_7$-$C_{60}$ aryl alkyl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a $C_2$-$C_{60}$ heteroaryl alkyl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(025), —Ge(Q$_{23}$)(Q$_{24}$)(025), —B(Q$_{26}$)(Q$_{27}$), —P(=O)(Q$_{28}$)(Q$_{29}$), —P(Q$_{28}$)(Q$_{29}$), or a combination thereof;

—N(Q$_{31}$)(Q$_{32}$), —Si(Q$_{33}$)(Q$_{34}$)(035), —Ge(Q$_{33}$)(Q$_{34}$)(035), —B(Q$_{36}$)(Q$_{37}$), —P(=O)(Q$_{38}$)(Q$_{39}$), or —P(Q$_{38}$)(Q$_{39}$); or a combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, —SF$_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, or a substituted or unsubstituted monovalent non-aromatic condensed heteropolycyclic group.

8. The display apparatus of claim 1, wherein the display apparatus satisfies Condition 2-3:

Condition 2-3

$[S_1(D2)-T_1(D2)] \leq 0.3$ electron Volts.

9. The display apparatus of claim 8, wherein the second dopant is a compound represented by Formula 3:

Formula 3

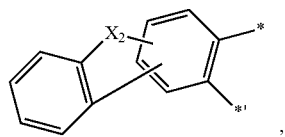

wherein, in Formula 3, $R_{111}$ to $R_{115}$, $R_{121}$ to $R_{124}$, $R_{131}$ to $R_{134}$, $R_{141}$ to $R_{145}$, and $R_{151}$ to $R_{153}$ are each independently one of Group R-1 to Group R-5, two or more adjacent groups among $R_{111}$ to $R_{115}$, $R_{121}$ to $R_{124}$, $R_{131}$ to $R_{134}$, $R_{141}$ to $R_{145}$, and $R_{151}$ to $R_{153}$ are optionally bonded to each other to form a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, Group R-1 is hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_{60}$ heteroaryloxy group, a substituted or unsubstituted $C_1$-$C_0$ heteroarylthio group, a substituted or unsubstituted monovalent non-aromatic condensed polycyclic group, a substituted or unsubstituted monovalent non-aromatic condensed heteropolycyclic group, —Si(Q$_1$)(Q$_2$)(Q$_3$), —C(Q$_1$)(Q$_2$)(Q$_3$), —B(Q$_1$)(Q$_2$), —N(Q$_1$)(Q$_2$), —P(Q$_1$)(Q$_2$), —C(=O)(Q$_1$), —S(=O)(Q$_1$), —S(=O)$_2$(Q$_1$), —P(=O)(Q$_1$)(Q$_2$), or —P(=S)(Q$_1$)(Q$_2$), $Q_1$ to $Q_3$ are each independently hydrogen, deuterium, —F, —Cl, —Br, —I, —SF$_5$, a hydroxyl group, a cyano group, a nitro group, an amino group, an amidino group, a hydrazino group, a hydrazono group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_1$-$C_{60}$ alkylthio group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted $C_1$-$C_6$ heteroaryloxy group, a substituted or unsubstituted $C_1$-$C_6$ heteroarylthio group, a substituted or unsubstituted monovalent non-aromatic condensed polycyclic group, or a substituted or unsubstituted monovalent non-aromatic condensed heteropolycyclic group, and two adjacent groups among $R_{131}$ to $R_{134}$ are optionally linked to each other and condensed with a benzene ring in which $R_{131}$ to $R_{134}$ are bonded to form a moiety:

wherein X$_2$ is N(Q$_1$), O, or S, * indicates a binding site to B in Formula 3, and *' indicates a binding site to N in Formula 3, Group R-2 is a group represented by Formula 3-1 or a group represented by Formula 3-2:

Formula 3-1

$$\underset{R_{21}}{\overset{*}{\underset{|}{\underset{|}{\overset{(L_{21})_{a21}}{\underset{|}{N}}}}}} R_{22}$$

-continued

Formula 3-2

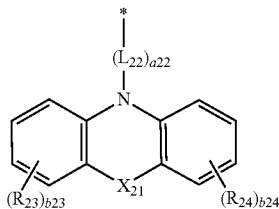

wherein, in Formulae 3-1 and 3-2,
$X_{21}$ is a single bond, O, S, $N(R_{25})$, or $C(R_{25})(R_{26})$,
$L_{21}$ and $L_{22}$ are each independently a substituted or unsubstituted $C_5$-$C_{30}$ carbocyclic group or a substituted or unsubstituted $C_1$-$C_{30}$ heterocyclic group,
a21 and a22 are each independently 0, 1, or 2,
b23 and b24 are each independently 0, 1, 2, 3, or 4,
$R_{21}$ to $R_{26}$ are each independently a substituted or unsubstituted $C_1$-$C_{60}$ alkyl group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_7$-$C_{60}$ alkyl aryl group, a substituted or unsubstituted $C_7$-$C_{60}$ aryl alkyl group, a substituted or unsubstituted $C_1$-$C_{60}$ heteroaryl group, a substituted or unsubstituted $C_2$-$C_{60}$ alkyl heteroaryl group, a substituted or unsubstituted $C_2$-$C_{60}$ heteroaryl alkyl group, a substituted or unsubstituted monovalent non-aromatic condensed polycyclic group, or a substituted or unsubstituted monovalent non-aromatic condensed heteropolycyclic group, Group R-3 is a group represented by Formula 3-3:

Formula 3-3

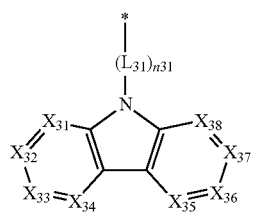

wherein, in Formula 3-3,
$L_{31}$ is a substituted or unsubstituted $C_5$-$C_{60}$ carbocyclic group or a substituted or unsubstituted $C_1$-$C_{60}$ heterocyclic group,
n31 is 0, 1 or 2,
$X_{31}$ is $C(R_{31})$ or N, $X_{32}$ is $C(R_{32})$ or N, $X_{33}$ is $C(R_{33})$ or N, $X_{34}$ is $C(R_{34})$ or N, $X_{35}$ is $C(R_{35})$ or N, $X_{36}$ is $C(R_{36})$ or N, $X_{37}$ is $C(R_{37})$ or N, and $X_{38}$ is $C(R_{38})$ or N, and
$R_{31}$ to $R_{38}$ are each as defined for Group R-1, Group R-4 is a group represented by Formula 3-4:

Formula 3-4

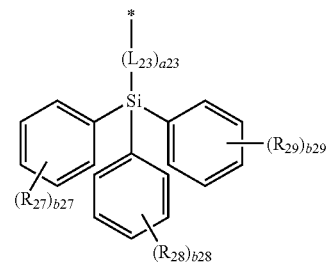

wherein, in Formula 3-4,
$L_{23}$ is a substituted or unsubstituted $C_5$-$C_{30}$ carbocyclic group or a substituted or unsubstituted $C_1$-$C_{30}$ heterocyclic group,
a23 is 0, 1, or 2, and
b27 to b29 are each independently 0, 1, 2, 3, 4, or 5,
Group R-5 is a group represented by Formula 3-5:

Formula 3-5

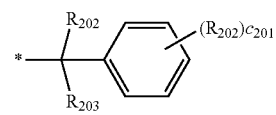

wherein, in Formula 3-5,
$R_{201}$, $R_{202}$, and $R_{203}$ are each independently a $C_1$-$C_{20}$ alkyl group unsubstituted or substituted with at least one of deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a phenyl group, a biphenyl group, a terphenyl group, a naphthyl group, a fluorenyl group, a pyridinyl group, a pyrimidinyl group, a triazinyl group, a quinolinyl group, an isoquinolinyl group, a carbazolyl group, a dibenzofuranyl group, a dibenzothiophenyl group, —$N(Q_{31})(Q_{32})$, or a combination thereof, and
c201 is 1, 2, 3, 4, or 5.

10. The display apparatus of claim 1, wherein the color control portion further comprises a second color control element, wherein the second color control element comprises a second quantum dot for red color conversion.

11. The display apparatus of claim 10, wherein the color control portion further comprise a first color filter provided on the first color control element and a second color filter provided on the second color control element.

12. The display apparatus of claim 10, wherein an average particle diameter of the core of the second quantum dot is greater than an average particle diameter of the core of the first quantum dot.

13. The display apparatus of claim 1, wherein
the first quantum dot has a core-shell structure,
the core is the Group III-V compound, the Group II-III-V compound, the Group III-VI compound, the Group I-III-VI compound, or a combination thereof, and
the shell is the Group II-VI compound, the Group IV-VI compound, or a combination thereof.

14. The display apparatus of claim 1, wherein the first quantum dot comprises:
   a core that is InP, InZnP, InGaP, or a combination thereof, and
   a shell that is ZnSe, ZnS, ZnSe, ZnSeS, or a combination thereof.

15. The display apparatus of claim 1, wherein
   a first absorption peak of the first quantum dot is about 450 nanometers to about 510 nanometers, and
   a first emission peak of the first quantum dot is about 500 nanometers to about 550 nanometers.

16. The display apparatus of claim 1, wherein
   the first dopant is present in the emission layer in an amount of about 5 weight percent to about 30 weight percent, and
   the second dopant is present in the emission layer in an amount of about 0.05 weight percent to about 0.5 weight percent,
   based on a total weight of the emission layer.

17. The display apparatus of claim 1, wherein the substrate has a tandem structure.

18. The display apparatus of claim 1, wherein the substrate has a tandem structure further comprising at least one green light-emitting unit.

19. The display apparatus of claim 1, wherein the color control portion further comprises a third color control element for expression of a blue color.

20. An electronic apparatus, comprising the display apparatus of claim 1.

* * * * *